US012631357B2

(12) United States Patent
Turney et al.

(10) Patent No.: US 12,631,357 B2
(45) Date of Patent: May 19, 2026

(54) BUILDING EQUIPMENT WITH PREDICTIVE CONTROL

(71) Applicant: Johnson Controls Tyco IP Holdings LLP, Milwaukee, WI (US)

(72) Inventors: Robert D. Turney, Watertown, WI (US); Nishith R. Patel, Madison, WI (US); Karl F. Reichenberger, Mequon, WI (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 572 days.

(21) Appl. No.: 17/740,814

(22) Filed: May 10, 2022

(65) Prior Publication Data

US 2022/0268471 A1     Aug. 25, 2022

Related U.S. Application Data

(63) Continuation-in-part of application No. 16/016,361, filed on Jun. 22, 2018, now Pat. No. 11,346,572.

(Continued)

(51) Int. Cl.
*F24F 11/47* (2018.01)
*G01R 21/00* (2006.01)
(Continued)

(52) U.S. Cl.
CPC ............ *F24F 11/47* (2018.01); *G01R 21/006* (2013.01); *G06Q 30/0283* (2013.01); *G06Q 50/06* (2013.01); *F24F 2140/60* (2018.01)

(58) Field of Classification Search
None
See application file for complete search history.

(56) References Cited

U.S. PATENT DOCUMENTS

| | | | |
|---|---|---|---|
| 5,209,398 A | 5/1993 | Drees | |
| 5,497,452 A | 3/1996 | Shimizu et al. | |

(Continued)

FOREIGN PATENT DOCUMENTS

| | | | |
|---|---|---|---|
| CA | 2455689 A1 | 7/2005 | |
| CA | 2957726 A1 | 3/2016 | |

(Continued)

OTHER PUBLICATIONS

CoolingLogic, "CoolingLogic: Up early, saving billions." URL: http://coolinglogic.com/documents/MarketingFlyer_FINAL_HiRes8. 5x11.pdf, retrieved from internet Oct. 27, 2022 (1 page).

(Continued)

*Primary Examiner* — Jason Lin
(74) *Attorney, Agent, or Firm* — Foley & Lardner LLP

(57) ABSTRACT

A heating ventilating or air conditioning (HVAC) system includes a unit configured for use in a heating or a cooling operation for an environment. The unit includes an interface configured to receive electric energy from an alternative energy source and a controller configured to perform an optimization of an objective function for the unit to determine a first amount of electric energy to receive from an energy grid and a second amount of the electric energy from the alternative energy source for use in the heating or cooling operation at each time step of an optimization period in response to a cost characteristic of the electric energy received from the energy grid. The unit is configured to use the first amount and the second amount for the heating or cooling operation.

20 Claims, 21 Drawing Sheets

FIG. 7

Related U.S. Application Data

(60) Provisional application No. 63/194,771, filed on May 28, 2021, provisional application No. 62/524,325, filed on Jun. 23, 2017.

(51) Int. Cl.
   *G06Q 30/0283*          (2023.01)
   *G06Q 50/06*            (2012.01)
   *F24F 140/60*           (2018.01)

(56)                    References Cited

U.S. PATENT DOCUMENTS

| | | | |
|---|---|---|---|
| 5,550,752 A | 8/1996 | Federspiel | |
| 6,033,302 A | 3/2000 | Ahmed et al. | |
| 6,095,426 A | 8/2000 | Ahmed et al. | |
| 6,988,671 B2 | 1/2006 | DeLuca | |
| 7,025,281 B2 | 4/2006 | DeLuca | |
| 7,099,895 B2 | 8/2006 | Dempsey | |
| 7,150,408 B2 | 12/2006 | DeLuca | |
| 7,222,494 B2 | 5/2007 | Peterson et al. | |
| 7,311,752 B2 | 12/2007 | Tepper et al. | |
| 7,394,370 B2 | 7/2008 | Chan | |
| 7,580,775 B2 | 8/2009 | Kulyk et al. | |
| 7,788,189 B2 | 8/2010 | Budike, Jr. | |
| 7,817,046 B2 | 10/2010 | Coveley et al. | |
| 7,894,946 B2 | 2/2011 | Kulyk et al. | |
| 7,941,096 B2 | 5/2011 | Perkins et al. | |
| 8,049,614 B2 | 11/2011 | Kahn et al. | |
| 8,405,503 B2 | 3/2013 | Wong | |
| 8,473,080 B2 | 6/2013 | Seem et al. | |
| 8,527,108 B2 | 9/2013 | Kulyk et al. | |
| 8,527,109 B2 | 9/2013 | Kulyk et al. | |
| 8,862,448 B2 | 10/2014 | Holmes et al. | |
| 8,867,993 B1 | 10/2014 | Perkins et al. | |
| 8,918,223 B2 | 12/2014 | Kulyk et al. | |
| 8,984,464 B1 | 3/2015 | Mihal et al. | |
| 9,002,532 B2 | 4/2015 | Asmus | |
| 9,075,909 B2 | 7/2015 | Almogy et al. | |
| 9,110,647 B2 | 8/2015 | Kulyk et al. | |
| 9,235,657 B1 | 1/2016 | Wenzel et al. | |
| 9,383,736 B2 | 7/2016 | Honda et al. | |
| 9,429,923 B2 | 8/2016 | Ward et al. | |
| 9,436,179 B1 | 9/2016 | Turney et al. | |
| 9,447,985 B2 | 9/2016 | Johnson | |
| 9,465,392 B2 | 10/2016 | Bradley et al. | |
| 9,547,353 B1 | 1/2017 | Marr et al. | |
| 9,612,601 B2 | 4/2017 | Beyhaghi et al. | |
| 9,618,224 B2 | 4/2017 | Emmons et al. | |
| 9,696,054 B2 | 7/2017 | Asmus | |
| 9,703,339 B2 | 7/2017 | Kulyk et al. | |
| 9,741,233 B2 | 8/2017 | Laufer et al. | |
| 9,778,639 B2 | 10/2017 | Boettcher et al. | |
| 9,810,441 B2 | 11/2017 | Dean-Hendricks et al. | |
| 9,832,034 B2 | 11/2017 | Shetty et al. | |
| 9,852,481 B1 | 12/2017 | Turney et al. | |
| 9,915,438 B2 | 3/2018 | Cheatham et al. | |
| 9,982,903 B1 | 5/2018 | Ridder et al. | |
| 10,007,259 B2 | 6/2018 | Turney et al. | |
| 10,068,116 B2 | 9/2018 | Good et al. | |
| 10,071,177 B1 | 9/2018 | Kellogg | |
| 10,088,814 B2 | 10/2018 | Wenzel et al. | |
| 10,101,730 B2 | 10/2018 | Wenzel et al. | |
| 10,101,731 B2 | 10/2018 | Asmus et al. | |
| 10,139,877 B2 | 11/2018 | Kulyk et al. | |
| 10,175,681 B2 | 1/2019 | Wenzel et al. | |
| 10,190,789 B2 | 1/2019 | Mueller et al. | |
| 10,198,779 B2 | 2/2019 | Pittman et al. | |
| 10,251,610 B2 | 4/2019 | Parthasarathy et al. | |
| 10,302,318 B1 | 5/2019 | Chambers | |
| 10,318,266 B2 * | 6/2019 | Ribbich | G06F 8/65 |
| 10,359,748 B2 * | 7/2019 | ElBsat | G05B 13/021 |
| 10,444,210 B2 | 10/2019 | Rawat et al. | |
| 10,528,020 B2 | 1/2020 | Drees | |
| 10,572,230 B2 | 2/2020 | Lucas et al. | |
| 10,628,135 B2 | 4/2020 | Sharma et al. | |
| 10,678,227 B2 | 6/2020 | Przybylski et al. | |
| 10,706,375 B2 | 7/2020 | Wenzel et al. | |
| 10,718,542 B2 | 7/2020 | Alanqar et al. | |
| 10,871,756 B2 | 12/2020 | Johnson et al. | |
| 10,884,398 B2 | 1/2021 | Elbsat et al. | |
| 10,908,578 B2 | 2/2021 | Johnson et al. | |
| 10,921,768 B2 | 2/2021 | Johnson et al. | |
| 10,928,089 B2 | 2/2021 | Gamroth et al. | |
| 10,928,784 B2 | 2/2021 | Craig et al. | |
| 10,977,010 B2 | 4/2021 | Sharma et al. | |
| 11,068,821 B2 | 7/2021 | Wenzel et al. | |
| 11,101,651 B2 | 8/2021 | Pavlak et al. | |
| 11,137,163 B2 | 10/2021 | Nasis | |
| 11,156,978 B2 | 10/2021 | Johnson et al. | |
| 11,164,126 B2 | 11/2021 | Elbsat et al. | |
| 11,181,289 B2 | 11/2021 | Federspiel et al. | |
| 11,182,714 B2 | 11/2021 | Wenzel et al. | |
| 11,193,691 B1 | 12/2021 | Guyer et al. | |
| 11,274,842 B2 | 3/2022 | Gamroth et al. | |
| 11,436,386 B2 | 9/2022 | Motahar | |
| 11,668,481 B2 | 6/2023 | Granger et al. | |
| 2002/0165671 A1 | 11/2002 | Middya | |
| 2003/0040812 A1 * | 2/2003 | Gonzales | G05B 15/02 700/20 |
| 2003/0055798 A1 | 3/2003 | Hittle et al. | |
| 2004/0011066 A1 | 1/2004 | Sugihara et al. | |
| 2006/0271210 A1 | 11/2006 | Subbu et al. | |
| 2007/0101688 A1 | 5/2007 | Wootton et al. | |
| 2007/0131782 A1 | 6/2007 | Ziehr et al. | |
| 2007/0150333 A1 | 6/2007 | Hurst et al. | |
| 2007/0202798 A1 | 8/2007 | Billiotte et al. | |
| 2007/0203860 A1 * | 8/2007 | Golden | G06Q 50/06 705/412 |
| 2007/0219645 A1 | 9/2007 | Thomas et al. | |
| 2008/0206767 A1 | 8/2008 | Kreiswirth et al. | |
| 2008/0243273 A1 | 10/2008 | Robert et al. | |
| 2008/0277486 A1 | 11/2008 | Seem et al. | |
| 2009/0005912 A1 | 1/2009 | Srivastava et al. | |
| 2009/0065596 A1 | 3/2009 | Seem et al. | |
| 2009/0078120 A1 | 3/2009 | Kummer et al. | |
| 2009/0096416 A1 | 4/2009 | Tonegawa et al. | |
| 2009/0117798 A1 | 5/2009 | Takashima et al. | |
| 2009/0126382 A1 | 5/2009 | Rubino et al. | |
| 2009/0173336 A1 * | 7/2009 | Leifer | F28D 20/021 165/104.11 |
| 2009/0265106 A1 | 10/2009 | Bearman et al. | |
| 2009/0292465 A1 | 11/2009 | Kaldewey et al. | |
| 2009/0319090 A1 | 12/2009 | Dillon et al. | |
| 2010/0017045 A1 | 1/2010 | Nesler et al. | |
| 2010/0019050 A1 | 1/2010 | Han et al. | |
| 2010/0047115 A1 | 2/2010 | Krichtafovitch et al. | |
| 2010/0063832 A1 | 3/2010 | Brown | |
| 2010/0070093 A1 | 3/2010 | Harrod et al. | |
| 2010/0175556 A1 | 7/2010 | Kummer et al. | |
| 2010/0187443 A1 | 7/2010 | Leben | |
| 2010/0198611 A1 | 8/2010 | Ruoff et al. | |
| 2010/0262313 A1 | 10/2010 | Chambers et al. | |
| 2010/0274612 A1 | 10/2010 | Walker et al. | |
| 2011/0011105 A1 * | 1/2011 | Valiya Naduvath | B04C 5/13 62/84 |
| 2011/0018502 A1 * | 1/2011 | Bianciotto | H02J 7/34 320/162 |
| 2011/0093249 A1 | 4/2011 | Holmes et al. | |
| 2011/0106501 A1 | 5/2011 | Christian et al. | |
| 2011/0172981 A1 | 7/2011 | Al-Hashimi et al. | |
| 2011/0190946 A1 * | 8/2011 | Wong | F24F 11/62 700/277 |
| 2011/0204720 A1 * | 8/2011 | Ruiz | B60L 53/305 307/66 |
| 2011/0231320 A1 | 9/2011 | Irving | |
| 2011/0276182 A1 | 11/2011 | Seem et al. | |
| 2012/0042356 A1 | 2/2012 | Kubota et al. | |
| 2012/0053740 A1 | 3/2012 | Venkatakrishnan et al. | |
| 2012/0112883 A1 | 5/2012 | Wallace et al. | |
| 2012/0130547 A1 | 5/2012 | Fadell et al. | |
| 2012/0130556 A1 * | 5/2012 | Marhoefer | G05B 15/02 700/291 |

(56) References Cited

U.S. PATENT DOCUMENTS

| | | | |
|---|---|---|---|
| 2012/0173293 A1 | 7/2012 | Motley et al. | |
| 2012/0199003 A1 | 8/2012 | Melikov et al. | |
| 2012/0203386 A1 | 8/2012 | Fakos et al. | |
| 2012/0240113 A1 | 9/2012 | Hur | |
| 2012/0259469 A1 | 10/2012 | Ward et al. | |
| 2013/0013123 A1 | 1/2013 | Ozaki | |
| 2013/0085614 A1 | 4/2013 | Wenzel et al. | |
| 2013/0110295 A1 | 5/2013 | Zheng et al. | |
| 2013/0116803 A1 | 5/2013 | Gmach et al. | |
| 2013/0162037 A1* | 6/2013 | Kim | H02J 3/381 |
| | | | 307/24 |
| 2013/0166268 A1 | 6/2013 | Leonard et al. | |
| 2013/0204443 A1* | 8/2013 | Steven | G05B 13/04 |
| | | | 700/286 |
| 2013/0218624 A1 | 8/2013 | Ikeda et al. | |
| 2013/0238144 A1 | 9/2013 | Shahapurkar et al. | |
| 2013/0245847 A1 | 9/2013 | Steven et al. | |
| 2013/0247059 A1 | 9/2013 | Amsterdam et al. | |
| 2013/0290511 A1 | 10/2013 | Tu et al. | |
| 2013/0297084 A1 | 11/2013 | Kubota et al. | |
| 2013/0345890 A1* | 12/2013 | Osogami | G05B 15/02 |
| | | | 700/291 |
| 2014/0006080 A1 | 1/2014 | Yusa | |
| 2014/0039689 A1 | 2/2014 | Honda et al. | |
| 2014/0039709 A1* | 2/2014 | Steven | H02J 13/00034 |
| | | | 700/291 |
| 2014/0114867 A1 | 4/2014 | Volkmann et al. | |
| 2014/0156093 A1 | 6/2014 | Brian et al. | |
| 2014/0167917 A2 | 6/2014 | Wallace et al. | |
| 2014/0236869 A1 | 8/2014 | Fujimaki et al. | |
| 2014/0260692 A1 | 9/2014 | Sharp | |
| 2014/0277603 A1 | 9/2014 | Ditlow et al. | |
| 2014/0277767 A1 | 9/2014 | Othman | |
| 2014/0283682 A1 | 9/2014 | Hamann et al. | |
| 2014/0324404 A1 | 10/2014 | De La Torre-Bueno | |
| 2014/0356229 A1 | 12/2014 | Farren | |
| 2015/0028114 A1 | 1/2015 | Rosen | |
| 2015/0053366 A1 | 2/2015 | Melsheimer | |
| 2015/0088315 A1 | 3/2015 | Behrangrad | |
| 2015/0097688 A1 | 4/2015 | Bruck et al. | |
| 2015/0109442 A1 | 4/2015 | Derenne et al. | |
| 2015/0149257 A1 | 5/2015 | Bielat et al. | |
| 2015/0190538 A1 | 7/2015 | Olvera et al. | |
| 2015/0227848 A1 | 8/2015 | Amid et al. | |
| 2015/0278968 A1 | 10/2015 | Steven et al. | |
| 2015/0316901 A1 | 11/2015 | Wenzel et al. | |
| 2015/0316902 A1* | 11/2015 | Wenzel | G06Q 50/06 |
| 2015/0316903 A1 | 11/2015 | Asmus et al. | |
| 2015/0316907 A1 | 11/2015 | Elbsat et al. | |
| 2015/0331972 A1 | 11/2015 | Mcclure et al. | |
| 2015/0354874 A1 | 12/2015 | Cur et al. | |
| 2016/0066068 A1 | 3/2016 | Schultz et al. | |
| 2016/0079826 A1 | 3/2016 | Paiz et al. | |
| 2016/0091904 A1* | 3/2016 | Horesh | F24F 11/58 |
| | | | 700/276 |
| 2016/0092986 A1 | 3/2016 | Lian et al. | |
| 2016/0109149 A1 | 4/2016 | Heller | |
| 2016/0116181 A1 | 4/2016 | Aultman et al. | |
| 2016/0147205 A1 | 5/2016 | Kaufman | |
| 2016/0195866 A1 | 7/2016 | Turney et al. | |
| 2016/0201933 A1 | 7/2016 | Hester et al. | |
| 2016/0210337 A1 | 7/2016 | Constandt | |
| 2016/0218543 A1* | 7/2016 | Ishida | G06Q 10/0631 |
| 2016/0306934 A1 | 10/2016 | Sperry et al. | |
| 2016/0313019 A1 | 10/2016 | Mengle et al. | |
| 2016/0313751 A1 | 10/2016 | Risbeck et al. | |
| 2016/0377306 A1 | 12/2016 | Drees et al. | |
| 2017/0003676 A1 | 1/2017 | Yoshida et al. | |
| 2017/0011150 A1 | 1/2017 | Sons et al. | |
| 2017/0016644 A1 | 1/2017 | Nagarathinam et al. | |
| 2017/0031962 A1 | 2/2017 | Turney et al. | |
| 2017/0039339 A1 | 2/2017 | Bitran et al. | |
| 2017/0082305 A1 | 3/2017 | Law | |
| 2017/0097163 A1 | 4/2017 | Law et al. | |

| | | | |
|---|---|---|---|
| 2017/0097616 A1 | 4/2017 | Cozad et al. | |
| 2017/0102162 A1 | 4/2017 | Drees et al. | |
| 2017/0102675 A1 | 4/2017 | Drees | |
| 2017/0103483 A1* | 4/2017 | Drees | G06Q 10/06315 |
| 2017/0104336 A1 | 4/2017 | Elbsat et al. | |
| 2017/0104337 A1 | 4/2017 | Drees | |
| 2017/0104342 A1 | 4/2017 | Elbsat et al. | |
| 2017/0104343 A1 | 4/2017 | ElBsat et al. | |
| 2017/0104345 A1 | 4/2017 | Wenzel et al. | |
| 2017/0104449 A1 | 4/2017 | Drees | |
| 2017/0123440 A1 | 5/2017 | Mangsuli et al. | |
| 2017/0147722 A1 | 5/2017 | Greenwood | |
| 2017/0176030 A1 | 6/2017 | Emmons et al. | |
| 2017/0179716 A1 | 6/2017 | Vitullo et al. | |
| 2017/0193792 A1 | 7/2017 | Bermudez Rodriguez et al. | |
| 2017/0206334 A1 | 7/2017 | Huang | |
| 2017/0211837 A1 | 7/2017 | Gupta et al. | |
| 2017/0212488 A1 | 7/2017 | Kummer et al. | |
| 2017/0234559 A1* | 8/2017 | Federspiel | F24F 11/32 |
| | | | 700/278 |
| 2017/0241658 A1 | 8/2017 | Salsbury et al. | |
| 2017/0246331 A1 | 8/2017 | Lloyd | |
| 2017/0292729 A1 | 10/2017 | Schuler et al. | |
| 2017/0300657 A1 | 10/2017 | Barrett et al. | |
| 2017/0312379 A1 | 11/2017 | Stibich et al. | |
| 2017/0350611 A1 | 12/2017 | Su et al. | |
| 2017/0351832 A1 | 12/2017 | Cahan et al. | |
| 2017/0352119 A1 | 12/2017 | Pittman et al. | |
| 2018/0004171 A1 | 1/2018 | Patel et al. | |
| 2018/0004172 A1 | 1/2018 | Patel et al. | |
| 2018/0004173 A1 | 1/2018 | Patel et al. | |
| 2018/0011459 A1 | 1/2018 | Boettcher et al. | |
| 2018/0031533 A1 | 2/2018 | Rawat et al. | |
| 2018/0052431 A1 | 2/2018 | Shaikh et al. | |
| 2018/0052970 A1 | 2/2018 | Boss et al. | |
| 2018/0075549 A1 | 3/2018 | Turney et al. | |
| 2018/0087791 A1 | 3/2018 | Monkkonen et al. | |
| 2018/0100663 A1 | 4/2018 | Crimins et al. | |
| 2018/0110416 A1 | 4/2018 | Masuda et al. | |
| 2018/0117209 A1 | 5/2018 | Clack et al. | |
| 2018/0150601 A1 | 5/2018 | Astigarraga | |
| 2018/0157535 A1 | 6/2018 | Dushok | |
| 2018/0185533 A1 | 7/2018 | Lalicki | |
| 2018/0196456 A1 | 7/2018 | Elbsat | |
| 2018/0197253 A1 | 7/2018 | Elbsat et al. | |
| 2018/0204162 A1 | 7/2018 | Endel et al. | |
| 2018/0209674 A1 | 7/2018 | Ridder et al. | |
| 2018/0209675 A1 | 7/2018 | Ridder | |
| 2018/0224814 A1* | 8/2018 | Elbsat | G06Q 30/0283 |
| 2018/0254632 A1 | 9/2018 | Elbsat et al. | |
| 2018/0259918 A1 | 9/2018 | Asmus et al. | |
| 2018/0285800 A1 | 10/2018 | Wenzel et al. | |
| 2018/0299151 A1 | 10/2018 | Ajax et al. | |
| 2018/0306459 A1 | 10/2018 | Turney | |
| 2018/0313563 A1 | 11/2018 | Turney et al. | |
| 2018/0314220 A1 | 11/2018 | Kumar et al. | |
| 2018/0318746 A1 | 11/2018 | Thomas | |
| 2018/0329374 A1 | 11/2018 | Kelly et al. | |
| 2018/0340704 A1 | 11/2018 | Turney et al. | |
| 2018/0341255 A1 | 11/2018 | Turney et al. | |
| 2018/0356770 A1 | 12/2018 | Elbsat et al. | |
| 2018/0356782 A1 | 12/2018 | Elbsat et al. | |
| 2018/0357577 A1 | 12/2018 | Elbsat et al. | |
| 2018/0372355 A1 | 12/2018 | Mosamkar et al. | |
| 2018/0372362 A1 | 12/2018 | Turney et al. | |
| 2018/0375444 A1 | 12/2018 | Gamroth | |
| 2019/0011145 A1 | 1/2019 | Willmott et al. | |
| 2019/0020203 A1 | 1/2019 | Lang et al. | |
| 2019/0023099 A1 | 1/2019 | Li et al. | |
| 2019/0025774 A1 | 1/2019 | Wenzel et al. | |
| 2019/0032942 A1 | 1/2019 | Willmott et al. | |
| 2019/0032943 A1 | 1/2019 | Willmott et al. | |
| 2019/0032944 A1 | 1/2019 | Wenzel et al. | |
| 2019/0032945 A1 | 1/2019 | Willmott et al. | |
| 2019/0032947 A1 | 1/2019 | Willmott et al. | |
| 2019/0032949 A1 | 1/2019 | Willmott et al. | |
| 2019/0052120 A1* | 2/2019 | Huang | H02J 9/062 |
| 2019/0056126 A1 | 2/2019 | Law et al. | |
| 2019/0066236 A1 | 2/2019 | Wenzel | |

(56) References Cited

U.S. PATENT DOCUMENTS

| | | |
|---|---|---|
| 2019/0079473 A1 | 3/2019 | Kumar et al. |
| 2019/0096233 A1 | 3/2019 | Bruck et al. |
| 2019/0107825 A1 | 4/2019 | Wenzel et al. |
| 2019/0108746 A1 | 4/2019 | Chang et al. |
| 2019/0141526 A1 | 5/2019 | Bahrami et al. |
| 2019/0148023 A1 | 5/2019 | Sadilek et al. |
| 2019/0163213 A1 | 5/2019 | Ostrye et al. |
| 2019/0163216 A1 | 5/2019 | Ostrye |
| 2019/0182069 A1 | 6/2019 | Gervais |
| 2019/0209806 A1 | 7/2019 | Allen et al. |
| 2019/0213695 A1 | 7/2019 | Elbsat et al. |
| 2019/0216957 A1 | 7/2019 | Hawkins et al. |
| 2019/0219293 A1 | 7/2019 | Wenzel et al. |
| 2019/0235453 A1 | 8/2019 | Turney et al. |
| 2019/0245368 A1 | 8/2019 | Baumgartner et al. |
| 2019/0249897 A1 | 8/2019 | Alcala Perez et al. |
| 2019/0257544 A1 | 8/2019 | Alanqar et al. |
| 2019/0271978 A1 | 9/2019 | Elbsat et al. |
| 2019/0295034 A1 | 9/2019 | Wenzel et al. |
| 2019/0311332 A1 | 10/2019 | Turney et al. |
| 2019/0321504 A1 | 10/2019 | Dayton |
| 2019/0325368 A1 | 10/2019 | Turney et al. |
| 2019/0328920 A1 | 10/2019 | Stibich et al. |
| 2019/0331358 A1 | 10/2019 | Ritmanich et al. |
| 2019/0338974 A1 | 11/2019 | Turney et al. |
| 2019/0339661 A1 | 11/2019 | Pancholi et al. |
| 2019/0340709 A1 | 11/2019 | Elbsat et al. |
| 2019/0347622 A1 | 11/2019 | Elbsat et al. |
| 2020/0009280 A1 | 1/2020 | Kupa |
| 2020/0026249 A1 | 1/2020 | Przybylski et al. |
| 2020/0041158 A1 | 2/2020 | Turney et al. |
| 2020/0090089 A1 | 3/2020 | Aston et al. |
| 2020/0090289 A1 | 3/2020 | Elbsat et al. |
| 2020/0096958 A1 | 3/2020 | Kelly et al. |
| 2020/0096985 A1 | 3/2020 | Wenzel et al. |
| 2020/0103127 A1 | 4/2020 | Chen et al. |
| 2020/0110531 A1 | 4/2020 | Sarang et al. |
| 2020/0124307 A1 | 4/2020 | Ota et al. |
| 2020/0125045 A1 | 4/2020 | Risbeck et al. |
| 2020/0132328 A1 | 4/2020 | Boettcher et al. |
| 2020/0141734 A1 | 5/2020 | Casarez et al. |
| 2020/0149768 A1 | 5/2020 | Turney et al. |
| 2020/0176124 A1 | 6/2020 | Chatterjea et al. |
| 2020/0176125 A1 | 6/2020 | Chatterjea et al. |
| 2020/0193345 A1 | 6/2020 | Elbsat et al. |
| 2020/0193346 A1 | 6/2020 | Elbsat et al. |
| 2020/0200416 A1 | 6/2020 | Granger et al. |
| 2020/0218208 A1 | 7/2020 | Alanqar et al. |
| 2020/0218991 A1 | 7/2020 | Alanqar et al. |
| 2020/0227159 A1 | 7/2020 | Boisvert et al. |
| 2020/0301408 A1 | 9/2020 | Elbsat et al. |
| 2020/0319610 A1 | 10/2020 | Ray et al. |
| 2020/0327371 A1 | 10/2020 | Sharma et al. |
| 2020/0334967 A1 | 10/2020 | Sharma et al. |
| 2020/0348038 A1 | 11/2020 | Risbeck et al. |
| 2020/0355391 A1 | 11/2020 | Wenzel et al. |
| 2020/0356087 A1 | 11/2020 | Elbsat et al. |
| 2020/0371482 A1 | 11/2020 | Alanqar et al. |
| 2020/0372588 A1 | 11/2020 | Shi |
| 2020/0406778 A1 | 12/2020 | Langton et al. |
| 2021/0010693 A1 | 1/2021 | Gamroth et al. |
| 2021/0010701 A1 | 1/2021 | Nesler et al. |
| 2021/0011443 A1 | 1/2021 | Mcnamara et al. |
| 2021/0011444 A1 | 1/2021 | Risbeck et al. |
| 2021/0018211 A1 | 1/2021 | Ellis et al. |
| 2021/0025613 A1 | 1/2021 | Knatchbull-Hugessen et al. |
| 2021/0043330 A1 | 2/2021 | Ikeshima |
| 2021/0072742 A1 | 3/2021 | Wu et al. |
| 2021/0108821 A1 | 4/2021 | Turney et al. |
| 2021/0125114 A1 | 4/2021 | Lin et al. |
| 2021/0148592 A1 | 5/2021 | Turney et al. |
| 2021/0173366 A1 | 6/2021 | Turney et al. |
| 2021/0193309 A1 | 6/2021 | Boisvert et al. |
| 2021/0200169 A1 | 7/2021 | Ploegert et al. |
| 2021/0209532 A1 | 7/2021 | Wenzel et al. |
| 2021/0270490 A1 | 9/2021 | Turney et al. |
| 2021/0284040 A1 | 9/2021 | Grunkemeyer et al. |
| 2021/0302052 A1 | 9/2021 | Trinh |
| 2021/0313075 A1 | 10/2021 | Mc Namara et al. |
| 2021/0322613 A1 | 10/2021 | Lacaze et al. |
| 2021/0356916 A1 | 11/2021 | Wenzel et al. |
| 2021/0364181 A1 | 11/2021 | Risbeck et al. |
| 2021/0373973 A1 | 12/2021 | Ekins et al. |
| 2021/0390807 A1 | 12/2021 | Chaurasia et al. |
| 2021/0390812 A1 | 12/2021 | Chaurasia et al. |
| 2021/0391089 A1 | 12/2021 | Eswara et al. |
| 2021/0393834 A1 | 12/2021 | Wellig |
| 2021/0398659 A1 | 12/2021 | Sharma et al. |
| 2021/0398690 A1 | 12/2021 | Gibson et al. |
| 2021/0398691 A1 | 12/2021 | Dhamija et al. |
| 2022/0011731 A1 | 1/2022 | Risbeck et al. |
| 2022/0035326 A1 | 2/2022 | Peters et al. |
| 2022/0042704 A1 | 2/2022 | Drees et al. |
| 2022/0054687 A1 | 2/2022 | Forzani et al. |
| 2022/0060856 A1 | 2/2022 | Wellig et al. |
| 2022/0062463 A1 | 3/2022 | Ramer et al. |
| 2022/0065479 A1 | 3/2022 | Douglas et al. |
| 2022/0092500 A1 | 3/2022 | Drees et al. |
| 2022/0118875 A1 | 4/2022 | Astorg et al. |
| 2022/0172830 A1 | 6/2022 | Brooks et al. |
| 2022/0381471 A1 | 12/2022 | Wenzel et al. |
| 2022/0390137 A1 | 12/2022 | Wenzel et al. |
| 2022/0404049 A1 | 12/2022 | Chang et al. |
| 2022/0404051 A1 | 12/2022 | Chang et al. |
| 2023/0020417 A1 | 1/2023 | Elbsat et al. |
| 2023/0248869 A1 | 8/2023 | Bell |
| 2023/0250988 A1 | 8/2023 | Risbeck et al. |
| 2023/0324864 A1 | 10/2023 | Bursch et al. |
| 2024/0165286 A1 | 5/2024 | Bonutti et al. |

FOREIGN PATENT DOCUMENTS

| | | |
|---|---|---|
| CA | 3043996 A1 | 2/2018 |
| CN | 2644960 Y | 9/2004 |
| CN | 1916514 A | 2/2007 |
| CN | 101194129 A | 6/2008 |
| CN | 201173923 Y | 12/2008 |
| CN | 101387428 A | 3/2009 |
| CN | 101692025 A | 4/2010 |
| CN | 201517972 U | 6/2010 |
| CN | 201558243 U | 8/2010 |
| CN | 101861552 A | 10/2010 |
| CN | 202568950 U | 12/2012 |
| CN | 203727247 U | 7/2014 |
| CN | 105805888 A | 7/2016 |
| CN | 106415139 A | 2/2017 |
| CN | 106975279 A | 7/2017 |
| CN | 107250928 A | 10/2017 |
| CN | 107252594 A | 10/2017 |
| CN | 107477782 A | 12/2017 |
| CN | 107613895 A | 1/2018 |
| CN | 207035361 U | 2/2018 |
| CN | 107787469 A | 3/2018 |
| CN | 107917484 A | 4/2018 |
| CN | 108507057 A | 9/2018 |
| CN | 108779925 A | 11/2018 |
| CN | 108980988 A | 12/2018 |
| CN | 109196286 A | 1/2019 |
| CN | 109405151 A | 3/2019 |
| CN | 110529988 A | 12/2019 |
| CN | 110671798 A | 1/2020 |
| CN | 110822616 A | 2/2020 |
| CN | 110991764 A | 4/2020 |
| EP | 1 156 286 A2 | 11/2001 |
| EP | 3 186 687 A4 | 7/2017 |
| EP | 3 497 377 A1 | 6/2019 |
| FR | 3031800 A1 | 7/2016 |
| JP | 2005-004403 A | 1/2005 |
| JP | 2010-128976 A | 6/2010 |
| JP | 2011-187031 A | 9/2011 |
| JP | 2012-533720 A | 12/2012 |
| JP | 2014-033613 A | 2/2014 |
| JP | 2015-152175 A | 8/2015 |
| JP | 2016-138705 A | 8/2016 |

(56)              References Cited

FOREIGN PATENT DOCUMENTS

| | | | |
|---|---|---|---|
| JP | 06-455326 | B2 | 1/2019 |
| KR | 20160137767 | A | 12/2016 |
| KR | 20170096092 | A | 8/2017 |
| KR | 20170115913 | A | 10/2017 |
| KR | 101865143 | B1 | 6/2018 |
| KR | 20200047457 | A | 5/2020 |
| WO | WO-2005/071815 | A1 | 8/2005 |
| WO | WO-2009/157847 | A1 | 12/2009 |
| WO | WO-2012/161804 | A1 | 11/2012 |
| WO | WO-2013/130956 | A1 | 9/2013 |
| WO | WO-2013/186282 | A2 | 12/2013 |
| WO | WO-2016/047103 | A1 | 3/2016 |
| WO | WO-2016/105347 | A1 | 6/2016 |
| WO | WO-2017/109206 | A1 | 6/2017 |
| WO | WO-2017/203031 | A1 | 11/2017 |
| WO | WO-2018/160412 | A1 | 9/2018 |
| WO | WO-2018/226564 | A1 | 12/2018 |
| WO | WO-2019/050154 | A1 | 3/2019 |
| WO | WO-2019/051893 | A1 | 3/2019 |
| WO | WO-2019/157514 | A2 | 8/2019 |
| WO | WO-2020/170338 | A1 | 8/2020 |
| WO | WO-2021/258116 | A1 | 12/2021 |
| WO | WO-2022/098887 | A1 | 5/2022 |
| WO | WO-2022/251700 | A1 | 12/2022 |

OTHER PUBLICATIONS

Incomplete File of Communication with Various Companies, etc. in 2016-2021, URL: http://coolinglogic.com/documents/22072101_Letters_and_Signature_Receipts.pdf, published, as one document, on: Jul. 21, 2022 (211 pages).

International Search Report and Written Opinion on PCT Appl. No. PCT/US2022/031438 dated Nov. 8, 2022 (18 pages).

International Search Report and Written Opinion on PCT Appl. No. PCT/US2022/040332 dated Nov. 22, 2022 (18 pages).

Johnson Heating and Cooling L.L.C., "Divine Grace Building Automation (Images)," URL: http://cooljohnson.com/Building-Automation-Systems-Michigan/Oakland-County-Michigan/Building-Automation-Images.html, retrieved from internet Oct. 27, 2022 (8 pages).

Johnson Heating and Cooling L.L.C., "Divine Grace Building Automation," URL: http://cooljohnson.com/Building-Automation-Systems-Michigan/Oakland-County-Michigan/Building-Automation-Divine-Grace.html, retrieved from internet Oct. 27, 2022 (3 pages).

Johnson Heating and Cooling L.L.C., "Excel Rehabilitation Building Automation," URL: http://cooljohnson.com/Building-Automation-Systems-Michigan/Waterford-Michigan/Building-Automation-System--Excel.html, retrieved from internet Oct. 27, 2022 (2 pages).

Johnson Heating and Cooling L.L.C., "Intertek Testing Services Building Automation," URL: http://cooljohnson.com/Building-Automation-Systems-Michigan/Plymouth-Michigan/Building-Automation-System-Plymouth-Michigan.html, retrieved from internet Oct. 27, 2022 (8 pages).

Johnson Heating and Cooling L.L.C., "Jla Medical Building Building Automation," URL: http://cooljohnson.com/Building-Automation-Systems-Michigan/Waterford-Michigan/Building-Automation-System--JLA.html, retrieved from internet Oct. 27, 2022 (3 pages).

Johnson Heating and Cooling L.L.C., "Mosaic Christian Building Automation (Images)," URL: http://cooljohnson.com/Building-Automation-Systems-Michigan/Detroit/Building-Automation-Images.html, retrieved from internet Oct. 27, 2022 (12 pages).

Johnson Heating and Cooling L.L.C., "Mosaic Christian Building Automation," URL: http://cooljohnson.com/Building-Automation-Systems-Michigan/Detroit/Mosaic-Christian.html, retrieved from internet Oct. 27, 2022 (5 pages).

Johnson Heating and Cooling L.L.C., "Shepherd's Gate Lutheran Church Building Automation," URL: http://cooljohnson.com/Building-Automation-Systems-Michigan/Shelby-Township-Michigan/Building-Automation-Systems-SG.html, retrieved from internet Oct. 27, 2022 (3 pages).

Johnson Heating and Cooling L.L.C., "St. Clair County Residence Building Automation," URL: http://cooljohnson.com/Building-Automation-Systems-Michigan/St-Clair-Michigan/Building-Automation-System-St-Clair-Michigan.html, retrieved from internet Oct. 27, 2022 (4 pages).

Johnson Heating and Cooling L.L.C., "St. Joseph Mercy Oakland U. C. Building Automation," URL: http://cooljohnson.com/Building-Automation-Systems-Michigan/Waterford-Michigan/Building-Automation-Systems-SJMO.html, retrieved from internet Oct. 27, 2022 (2 pages).

Johnson Heating and Cooling L.L.C., "Waterford Internal Medicine Building Automation," URL: http://cooljohnson.com/Building-Automation-Systems-Michigan/Waterford-Michigan/Building-Automation-Systems-WIM.html, retrieved from internet Oct. 27, 2022 (3 pages).

Johnson Heating and Cooling, LLC, "Building Automation Clawson Michigan 2.0," URL: http://cooljohnson.com/Building-Automation-Systems-Michigan/Clawson-Michigan/Building-Automation-Clawson-Manor-2.html, retrieved from the internet Oct. 27, 2022 (6 pages).

Johnson Heating and Cooling, LLC, "Building Automation Images Clawson Michigan 2.0," URL: http://cooljohnson.com/Building-Automation-Systems-Michigan/Clawson-Michigan/Building-Automation-Clawson-Manor-2-Images.html, retrieved from the internet Oct. 27, 2022 (14 pages).

Johnson Heating and Cooling, LLC, "Building Automation System Clawson Michigan Clawson Manor," URL: http://cooljohnson.com/Building-Automation-Systems-Michigan/Clawson-Michigan/Building-Automation-System-Clawson-Manor.html; retrieved from the internet Oct. 27, 2022 (3 pages).

Johnson Heating and Cooling, LLC, "Building Automation System in Michigan Images," URL: http://cooljohnson.com/Building-Automation-Systems-Michigan/Macomb-County-Michigan/Building-Automation-Images.html; retrieved from the internet Oct. 27, 2022 (13 pages).

Johnson Heating and Cooling, LLC, "Building Automation System in Michigan," URL: http://cooljohnson.com/Building-Automation-Systems-Michigan/Macomb-County-Michigan/Building-Automation-Confidential-Customer.html; retrieved from the internet, Oct. 27, 2022 (4 pages).

Johnson Solid State LLC, "Building Automation Equipment," URL: http://cooljohnson.com/Video/Building_Automation/Confidential_Customer_BLD_2/Building_Automation_Equipment.mp4, retrieved from internet Oct. 27, 2022 (35 pages).

Johnson Solid State LLC, "Building Automation Gui," URL: http://cooljohnson.com/Video/Building_Automation/Confidential_Customer_BLD_2/Building_Automation_GUI.mp4, retrieved from internet Oct. 27, 2022 (24 pages).

Johnson Solid State LLC, "Cooling Logic Overview," URL: http://coolinglogic.com/documents/CoolingLogic_Overview_High_Quality.mp4, retrieved from internet Oct. 27, 2022 (16 pages).

Johnson Solid State LLC, "So what is CoolingLogic™?" URL: http://coolinglogic.com/Coolinglogic-How-it-Works.html, retrieved from the internet Oct. 27, 2022 (3 pages).

Johnson, David, "A Method to Increase HVAC System Efficiency and Decrease Energy Consumption," White Paper: Johnson Solid State, LLC, URL: http://coolinglogic.com/documents/16102106_White_Paper_High_Resolution_Protected.pdf, Sep. 24, 2016 (51 pages).

Johnson, David, "CoolingLogic™: Changing the Way You Cool," Report: Johnson Solid State, LLC, URL: http://coolinglogic.com/documents/18111303_Changing_the_way_you_Cool.pdf, Nov. 7, 2018 (12 pages).

Johnson, David, "CoolingLogic™: Mosaic Christian Church A Case Study," Report: Johnson Solid State, LLC, URL: http://coolinglogic.com/documents/19020301_Mosaic_Christian_Coolinglogic_Case_Study.pdf, Feb. 2, 2019 (140 pages).

Johnson, David, "Excel Rehabilitation Building Automation: Building Automation System User Manual," URL: http://cooljohnson.com/Building-Automation-Systems-Michigan/Waterford-Michigan/Building-Automation-System-Excel-Manual.html, 2012 (10 pages).

Johnson, David, "Temperature Control System and Methods for Operating Same," Pre-Publication printout of U.S. Appl. No. 15/231,943,

(56)                    References Cited

OTHER PUBLICATIONS filed Aug. 9, 2016, URL: http://coolinglogic.com/documents/16080901_CIP_As_Filed.pdf (99 pages).

Noakes et al., "Appraising healthcare ventilation design from combined infection control and energy perspective," HVAC & R Research, Aug. 2012, (20 pages).

Cai et al., "Nationwide assessment of energy costs and policies to limit airborne infection risks in U.S. schools," Journal of Building Engineering, Jul. 2021, vol. 45 (pp. 1-12).

European Office Action on EP Appl. No. 20751421.7 dated Jul. 16, 2024 (5 pages).

Faulkner et al., "Tradeoffs among indoor air quality, financial costs, and CO2 emissions for HVAC operation strategies to mitigate indoor virus in U.S. office buildings," Building and Environment, Mar. 2022, vol. 221 (pp. 1-15).

Lee et al., "Life-Cycle Cost Simulation of In-Duct Ultraviolet Germicidal Irradiation Systems," Eleventh International IBPSA Conference, Glasgow, Scotland, Jul. 27-30, 2009 (pp. 1159-1166).

Invitation to Pay Additional Fees and, Where Applicable, Protest Fee on PCT Appl. No. PCT/US2022/031438 dated Sep. 2, 2022 (14 pages).

Chinese Office Action on CN Appl. No. 202080057416.0 dated Aug. 30, 2023 (37 pages).

U.S. Appl. No. 17/686,320, filed Mar. 3, 2022, Johnson Controls Tyco IP Holdings LLP.

U.S. Appl. No. 17/733,786, filed Apr. 29, 2022, Johnson Controls Tyco IP Holdings LLP.

Chinese Office Action on CN Appl. No. 202080061895.3 dated Sep. 25, 2023 (12 pages).

International Search Report and Written Opinion on PCT Appl. No. PCT/US2023/020060 dated Sep. 15, 2023 (20 pages).

U.S. Appl. No. 17/668,791, filed Feb. 10, 2022, Johnson Controls Tyco IP Holdings LLP.

U.S. Appl. No. 63/194,771, filed May 28, 2021, Johnson Controls Tyco IP Holdings LLP.

U.S. Appl. No. 63/220,878, filed Jul. 12, 2021, Johnson Controls Tyco IP Holdings LLP.

Chinese Office Action on CN Appl. No. 202080057416.0 dated Dec. 30, 2022 (12 pages).

Chinese Office Action on CN Appl. No. 202080061895.3 dated Jan. 20, 2023 (6 pages).

PCT Invitation to Pay Additional Fees and Where Applicable, Protest Fee for Appl. Ser. No. PCT/US2023/020060 dated Jul. 18, 2023 (14 pages).

Yang et al., "Multi-Objective Particle Swarm Optimization for decision-making in building automation," Power and Energy Society General Meeting, Jul. 24, 2011, IEEE (pp. 1-5).

Azimi et al., "HVAC filtration for controlling infectious airborne disease transmission in indoor environments: Predicting risk reductions and operational costs," Building and Environment, May 2013, vol. 70 (pp. 150-160).

Beggs et al., "Potential for airborne transmission of infection in the waiting areas of healthcare premises: stochastic analysis using a Monte Carlo model," BMC Infectious Diseases, Aug. 2010, vol. 10 (11 pages).

Ben-David et al., "Interplay of ventilation and filtration: Differential analysis of cost function combining energy use and indoor exposure to PM2.5 and ozone," Building and Environment, Aug. 2017, vol. 128 (pp. 320-335).

Gao et al., "Potential impact of a ventilation intervention for influenza in the context of a dense indoor contact network in Hong Kong," Science of the Total Environment, Apr. 2016, vols. 569-570 (pp. 373-381).

U.S. Appl. No. 16/703,514, filed Dec. 4, 2019, Johnson Controls Tyco IP Holdings LLP.

U.S. Appl. No. 17/576,615, filed Jan. 14, 2022, Johnson Controls Tyco IP Holdings LLP.

U.S. Appl. No. 17/582,988, filed Jan. 24, 2022, Johnson Controls Tyco IP Holdings LLP.

Aghniaey et al., "The Assumption of Equidistance in the Seven-Point Thermal Sensation Scale and a Comparison between Categorical and Continuous Metrics," University of Georgia College of Engineering, Jan. 18, 2019, 4 pages.

Aliabadi et al., "Preventing Airborne Disease Transmission: Review of Methods for Ventilation Design in Health Care Facilities," SAGE—Hindawi Access to Research Advances in Preventive Medicine, Feb. 2011, vol. 2011, 21 pages.

Azimi et al, "HVAC filtration for controlling infectious airborne disease transmission in indoor environments: Predicting risk reductions and operational costs," Building and Environment, May 13, 2013, 70, pp. 150-160.

Batterman et al., "Review and Extension of CO2-Based Methods to Determine Ventilation Rates with Application to School Classrooms," International Journal of Environmental Research and Public Health, Feb. 4, 22 pages.

Buaonanno et al., "Estimation of Airborne Viral Emission: Quanta Emission Rate of SARS-CoV-2 for Infection Risk Assessment," Environment International, 2020, 141, 105794, 9 pages.

CDC—Centers for Disease Control and Prevention, "How Flu Spreads," URL: https://www.cdc.gov/flu/about/disease/spread.htm, Aug. 27, 2018, 1 page.

CDC—Centers for Disease Control and Prevention, "Interim Clinical Guidance for Management of Patients with Confirmed Coronavirus Disease (COVID_19)," URL: https://www.cdc.gov/coronavirus/2019-ncov/hcp/clinical-guidance-management-patients.html, Feb. 2021, 14 pages.

Chen et al., "Occupant Feedback Based Model Predictive Control for Thermal Comfort and Energy Optimization: A Chamber Experimental Evaluation," Applied Energy, 2016, 164, pp. 341-351.

Ching, "An empirical drag coefficient model for simulating the dispersion and deposition of bioaerosol particles in ventilated environments," The Hong Kong Polytechnic University Department of Building Services Engineering, Jun. 2016, 345 pages.

CIRES—Cooperative Institute for Research in Environmental Sciences, "COVID-19 Airborne Transmission Tool Available: New model estimates COVID-19 transmission in classrooms, buses, protests, more," URL: https://cires.colorado.edu/news/covid-19-airborne-transmission-tool-available, Jun. 25, 2020, 7 pages.

Copeland, "The Impact of Patient Room Design on Airborne Hospital-Acquired Infections (HAI)," Thesis, Kent State University, Degree of Masters of Science in Architecture and Environmental Design, May 2016, 61 pages.

EPA—U.S. Environmental Protection Agency, "Exposure Factors Handbook," URL: https://www.epa.gov/expobox/about-exposure-factors-handbook, 2011, 6 pages.

EPA—U.S. Environmental Protection Agency, "Greenhouse Gases Equivalences Calculator-Calculations and References", URL: https://www.epa.gov/energy/greenhouse-gases-equivalencies-calculator-calculations-and-references, retrieved from the internet Sep. 30, 3031, 32 pages.

Fears et al., "Comparative Dynamic Aerosol Efficiencies of Three Emergent Coronaviruses and the Unusual Persistence of Sars-Cov-2 in Aerosol Suspensions," URL: https://www.ncbi.nlm.nih.gov/pmc/articles/PMC7217084/, Apr. 18, 2020, 8 pages.

Hubert et al., Modeling for Residential Electricity Optimization in Dynamic Pricing Environments, IEEE Transactions on Smart Grid, IEEE, USA, Dec. 1, 2012, vol. 3, No. 4 (pp. 2224-2231).

International Preliminary Report on Patentability on PCT Appl. Ser. No. PCT/US2020/041770 dated Jan. 27, 2022 (8 pages).

International Preliminary Report on Patentability on PCT Appl. Ser. No. PCT/US2020/041792 dated Jan. 27, 2022 (9 pages).

International Preliminary Report on Patentability on PCT Appl. Ser. No. PCT/US2020/041845 dated Jan. 27, 2022 (12 pages).

International Preliminary Report Patentability on PCT Appl. Ser. No. PCT/US2018/039119 dated Jan. 2, 2020 (7 pages).

International Search Report and Written Opinion on International Appl. Ser. No. PCT/US2018/039119 dated Oct. 5, 2018 (14 pages).

International Search Report and Written Opinion on PCT Appl. Ser. No. PCT/US2020/041770, dated Nov. 3, 2020, 13 pages.

International Search Report and Written Opinion on PCT Appl. Ser. No. PCT/US2020/041792, dated Sep. 30, 15 pages.

(56)                    References Cited

OTHER PUBLICATIONS

International Search Report and Written Opinion on PCT Appl. Ser. No. PCT/US2020/041845, dated Jan. 13, 2021, 20 pages.
Joe et al., "Methodology for Modeling the Microbial Contamination of Air Filters," PLoS One 9(2) e88514, URL: https://doi.org/10.1371/journal.pone.0088514, Feb. 11, 2014, 9 pages.
Johnson et al., "Modality of human expired aerosol size distributions," Journal of Aerosol Science, 2011, 42(12), pp. 839-851.
Kanaan et al., "New airborne pathogen transport model for upper-room UVGI spaces conditioned by chilled ceiling and mixed displacement ventilation: Enhancing air quality and energy performance," Energy Conversion and Management, Apr. 12, 2014, 85, pp. 50-61.
Kang et al., "Novel Modeling and Control Strategies for a HVAC System Including Carbon Dioxide Control," Energies, Jun. 2, 2014, 7, pp. 3599-3617.
Kowalski, W., "Ultraviolet germicidal irradiation handbook: UVGI for air and surface disinfection," Springer Science & Business Media, 2010, 504 pages.
Kumar, "A Simulation Framework to Characterize the Effect of Ventilation Control on Airborne Infectious Disease Transmission in Schools," Thesis, Graduate School of The University of Texas at Austin, May 2019, 53 pages.
Lampinen, "Thermodynamics of Humid Air," Sep. 2015, 39 Pages.
Liao et al., "A Probabilistic Transmission Dynamic Model to Assess Indoor Airborne Infection Risks," Risk Analysis, 2005, vol. 25, No. 5, pp. 1097-1107.
Ljung, System Identification: Theory for the User, 1999, 2nd ed., Prentice Hall PTR, Upper Saddle River, 63 pages.
Luo, "Maximizing Thermal Comfort and International Design: Predicting Thermal Comfort in Mixed-mode Office Building in the UK," Loughborough University, Jan. 18, 2019, 4 pages.
Marr et al., "SARS-CoV-2 in Indoor Air: Principles and Scenarios," US EPA Indoor Air Quality Science Webinar, YouTube URL: https://www.youtube.com/watch?v=fSQ0ah_OArU, Jul. 21, 2020, 113 pages.
National Geographic, "Measure the risk of airborne COVID-19 in your office, classroom, or bus ride," URL: https://www.nationalgeographic.com/science/article/how-to-measure-risk-airborne-coronavirus-your-office-classroom-bus-ride-cvd, Aug. 11, 2020, 12 pages.
Noakes et al., "Applying the Wells-Riley equation to the risk of airborne infection in hospital environments: The importance of stochastic and proximity effects," Indoor Air 2008, The 11th Intl Conference on Indoor Air Quality and CI, Aug. 17-22, 2008, Copenhagen, Denmark, 9 pages.
Noakes et al., "Mathematical models for assessing the role of airflow on the risk of airborne infection in hospital wards," Journal of the Royal Society Interface, 2009, 6, S791-S800, 10 pages.
Noakes et al., "Modelling the transmission of airborne infections in enclosed spaces," Epidemiol. Infect, 2006, vol. 134, pp. 1082-1091.
Stephens, "HVAC filtration and the Wells-Riley approach to assessing risks of infectious airborne diseases," The National Air Filtration Association (NAFA) Foundation, Mar. 1, 2012, 47 pages.
Sudhakaran et al., "Temperature, Relative Humidity, and Carbon-Dioxide Modulation in a Near-Zero Energy Efficient Retrofit House," Purdue University, 2016, 11 pages.
Sze et al., "Review and Comparison Between the Wells-Riley and Dose-Response Approaches to Risk Assessment of Infectious Respiratory Diseases," Indoor Air, 2010, 20, pp. 2-16.
Van Doremalen et al., "Aerosol and Surface Stability of SARS-CoV-2 as Compared with SARS-CoV-1," URL: https://www.nejm.org/doi/full/10.1056/nejmc2004973, Mar. 17, 2020, 5 pages.
Weekly et al., "Modeling and Estimation of the Humans' Effect on the CO2 Dynamics Inside a Conference Room," IEEE Transactions on Control Systems Technology, Sep. 2015, 23.5, 12 pages.
Calma, "Tesla promises cars that connect to the grid, even if Elon Musk doesn't really want them to," The Verge, Sep. 23, 2020,
https://www.theverge.com/2020/9/23/21451642/tesla-ev-electric-vehicle-energy-grid-battery-day-elon-musk; retrieved from the internet May 1, 2023 (7 pages).
Delbert, "Tesla's Virtual Power Plant is Already a Success, and it's only getting bigger," Popular Mechanics, Apr. 10, 2020, https://www.popularmechanics.com/science/a31977069/tesla-virtual-power-plant/; retrieved from the internet May 1, 2023 (7 pages).
EPO Provisional Opinion Accompanying the Partial Search Result for PCT Appl. Ser. No. PCT/US2023/012719 dated Mar. 28, 2023 (15 pages).
European Office Action on EP Appl. No. 20750965.4 dated Mar. 31, 2023 (5 pages).
Lambert, "Honda is working on bi-directional charging technology for its electric vehicles, installs station at HQ," Elektrek, Dec. 7, 2017, https://electrek.co/2017/12/07/honda-bi-directional-charging-technology-electric-vehicles/;retrieved from the internet May 1, 2023 (6 pages).
Lambert, "Nissan launches 'Nissan Energy' to commercialize vehicle-to-home/building with the Leaf," Elektrek, Nov. 28, 2018, https://electrek.co/2018/11/28/nissan-energy-leaf-vehicle-to-home-building/, retrieved from the internet May 1, 2023 (8 pages).
Lambert, "Tesla announces unlimited overnight charging for $30 per month," Elektrek, Mar. 1, 2023, https://electrek.co/2023/03/01/tesla-unlimited-overnight-charging-30-month/; retrieved from the internet May 1, 2023 (6 pages).
Lambert, "Tesla launches new feature to help solar homeowners charge with excess solar power," Elektrek, Mar. 16, 2023, https://electrek.co/2023/03/16/tesla-launches-feature-help-solar-homeowners-charge-excess-solar-power/; retrieved form the internet May 1, 2023 (6 pages).
Lopatto, "I went to Australia to test out Tesla's vision of the future," The Verge, Jun. 25, 2019, https://www.theverge.com/2019/6/25/18715585/tesla-australia-renewable-energy-houses-electrical-grid-battery-installation; retrieved from the internet May 1, 2023 (22 pages).
Lyons, "Here are Tesla's biggest announcements from Battery Day," The Verge, Sep. 22, 2020, https://www.theverge.com/2020/9/22/21450840/tesla-battery-day-production-elon-musk-tabless-range-cathode-cobalt-plaid; retrieved for the internet on May 1, 2023 (6 pages).
Shahan, "Tesla CTO JB Straubel on Why EVs Selling Electricity to the Grid is Not as Swell as it Sounds," Clean Technica, Aug. 22, 2016, https://cleantechnica.com/2016/08/22/vehicle-to-grid-used-ev-batteries-grid-storage/; retrieved from the internet May 1, 2023 (13 pages).
Tesla—"How Powerwall Works" tesla.com, Publication Date: Unknown; first date this website was archived on the Wayback Machine was May 13, 2020, https://www.tesla.com/support/energy/powerwall/learn/how-powerwall-works; retrieved from the internet on May 1, 2023 (4 pages).
Walton, "Tesla software update allows Powerwall 2 owners to optimize for time-varying rates," Utility Dive, May 15, 2018, https://www.utilitydive.com/news/tesla-software-update-allows-powerwall-2-owners-to-optimize-for-time-varyin/523588/; retrieved from the internet May 1, 2023 (4 pages).
Afram et al., "Theory and Application of HVAC Control Systems—A review of Model Predictive Control (MPC)," Building and Environment, Feb. 2014, vol. 72 (pp. 343-355).
Ahn et al., "Optimal Control Development for Chilled Water Plants Using a Quadratic Representation," Energy and Buildings, Apr. 2001, vol. 33, No. 4 (pp. 371-378).
Burer et al., "Non-convex Mixed-Integer Nonlinear Programming: A Survey," Surveys in Operations Research and Management Science, Jul. 2012, vol. 17, No. 2 (pp. 97-106).
Cantoni, A., "Optimal Curve Fitting with Piecewise Linear Functions," IEEE Transactions on Computers, Jan. 1971, vol. 20, No. (pp. 59-67).
Corbin et al., "A Model Predictive Control Optimization Environment for Real-Time Commercial Building Application," Journal of Building Performance Simulation, 2013, (Published online: Jan. 11, 2012) vol. 6, No. 3 (pp. 159-174).

(56)         References Cited

OTHER PUBLICATIONS

Drgona et al., "All you Need to Know about Model Predictive Control for Buildings," Annual Reviews in Control, 2020, vol. 50 (pp. 190-232).
EPO Notice of Opposition to a European Patent issued in Appl. Ser. No. EP 16165681.4 dated May 2, 2023 (48 pages).
EPO Notice of Opposition to a European Patent issued in Appl. Ser. No. EP 16165681.4 dated May 2, 2023 (51 pages).
EPO Notice of Opposition to a European Patent with Consolidated List issued in EP Appl. Ser. No. 16165681.4 dated May 2, 2023 (4 pages).
EPO Office Action on EP Appl. Ser. No. 16165681.4 dated Apr. 6, 2021 (7 pages).
EPO Search Opinion EP Appl. Ser. No. EP 22177772.5 dated Sep. 26, 2022 (6 pages).
Extended European Search Report on EP Appl. Ser. No. 16165681.4 dated Oct. 20, 2016 (5 pages).
Extended European Search Report on EP Appl. Ser. No. 22177772.5 dated Sep. 26, 2022 (11 pages).
Hackner, J.R., "HVAC system dynamics and energy use in existing buildings," Doctoral Dissertation, University of Madison, Wisconsin, 1984 (174 pages).
Haves et al., "Model Predictive Control of HVAC Systems: Implementation and Testing at the University of California, Merced," Technical Report, U.S. Department of Energy Office of Scientific and Technical Information, Jun. 29, 2010 (140 pages).
Huang et al., "A New Model Predictive Control Scheme for Energy and Cost Savings in Commercial Buildings: An Airport Terminal Building Case Study," Building and Environment, Jul. 2015, vol. 89 (pp. 203-216).
International Search Report and Written Opinion on PCT Appl. Ser. No. PCT/US2023/012719 dated May 22, 2023 (20 pages).
Kelman et al., "Analysis of Local Optima in Predictive Control for Energy Efficient Buildings," Journal of Building Performance Simulation, Apr. 16, 2012, vol. 6, No. 3 (pp. 236-255).
Koehler et al., "Building Temperature Distributed Control via Explicit MPC and 'Trim and Respond' Methods," European Control Conference (ECC), Jul. 17-19, 2013, Zurich, Switzerland (pp. 4334-4339).
Kwadzogah et al., "Model Predictive Control for HVAC Systems—A Review, 2013 IEEE International Conference on Automation Science and Engineering, Model Predictive Control for HVAC Systems—A Review," 2013 IEEE International Conference on Automation Science and Engineering (CASE), Madison, WI, United States, Aug. 17-20, 2013 (pp. 442-447).
McKenna et al., "A TRNSYS model of a building HVAC system with GSHP and PCM thermal energy storage—component modelling and validation," Proceedings of BS2013: 13th Conference of International Building Performance Simulation Association, Chambéry, France, Aug. 26-28, 2013 (pp. 3336-3343).
Mossolly et al., "Optimal Control Strategy for a Multizone Air Conditioning System Using a Genetic Algorithm," Energy, Jan. 2009, vol. 34, No. 1 (pp. 58-66).
Nassif et al., "Optimization of HVAC Control System Strategy Using Two-Objective genetic Algorithm," International Journal of HVA C&R Research, vol. 11, No. 3 (pp. 459-486).
Sourbon et al., "Dynamic Thermal Behaviour of Buildings with Concrete Core Activation," Dissertation, Arenberg Doctoral School of Science, Engineering & Technology, Katholieke Universiteit Leuven—Faculty of Engineering Celestijnenlaan: 300A box 2421, B-3001 Heverlee (Belgium) Sep. 2012 (416 pages).

Stluka et al., "Energy Management for Buildings and Microgrids," 2011 50th IEEE Conference on Decision and Control and European Control Conference (CDCECC) Orlando, FL, USA, Dec. 12-15, 2011 (pp. 5150-5157).
Strurznegger, D., "Model Predictive Building Climate Control, Steps Towards Practice," Doctoral Thesis, Automatic Control Laboratory, Zurich, Switzerland, 2014 (176 pages).
Sun et al., Optimal Control of Building HVAC&R Systems Using Complete Simulation-Based Sequential Quadratic Programming (CSB-SQP), Building and Environment, May 2005, vol. 40, No. 5 (pp. 657-669).
Third Party Observation Report on EP Appl. Ser. No. 16165681.4 dated Jan. 15, 2020 (8 pages).
Third Party Observation Report on EP Appl. Ser. No. 16165681.4 dated Oct. 5, 2018 (6 pages).
Verhelst et al., "Study of the Optimal Control Problem Formulation for Modulating Air-to-Water Heat Pumps Connected to a Residential Floor Heating System," Energy and Buildings, Feb. 2012, vol. 45 (pp. 43-53).
Verhelst, C., "Model Predictive Control of Ground Coupled Heat Pump Systems in Office Buildinqs," Dissertation, Arenberg Doctoral School of Science, Engineering & Technology, Katholieke Universiteit Leuven—Faculty of Engineering Celestijnenlaan : 300A box 2421, B-3001 Heverlee (Belgium) Apr. 20, 2012 (316 pages).
Wang et al., "Model-Based Optimal Control of VAV Air-Conditioning System Using Genetic Algorithm," Building and Environment, Aug. 2000, vol. 35, No. 6 (pp. 471-487).
Wang et al., "Supervisory and Optimal Control of Building HVAC Systems: A Review," HVAC&R Research, Jan. 2008, vol. 14, No. 1 (pp. 3-32).
Xi et al., "Support Vector Regression Model Predictive Control on a HVAC Plant," Control Engineering Practice, Aug. 2007, vol. 15, No. 8 (pp. 897-908).
Yao et al., "Global Optimization of a Central Air-Conditioning System Using Decomposition-Coordination Method," Energy and Buildings, May 2010, vol. 42, No. 5 (pp. 570-583).
Chang et al., "A cost-effectiveness assessment of the operational parameters of central HVAC systems during pandemics," Building Simulation, Nov. 2022, vol. 16 (pp. 667-682).
Noakes et al., "Modeling infection risk and energy use of upper-room Ultraviolet Germicidal Irradiation systems in multi-room environments," Jan. 2015, Science and Technology for the Built Environment, vol. 21, No. 1 (pp. 99-111).
Villafruela et al., "Comparison of air change efficiency, contaminant removal effectiveness and infection risk as IAQ indices in isolation rooms," Energy and Buildings, Mar. 2012, vol. 57 (pp. 210-219).
Xu et al., "Simulation-based trade-off modeling for indoor infection risk of airborne diseases, energy consumption, and thermal comfort," Journal of Building Engineering, Jan. 2023, vol. 76, No. 107137 (pp. 1-16).
Yan et al., "Evaluating SARS-CoV-2 airborne quanta transmission and exposure risk in a mechanically ventilated multi zone office building," Building and Environment, Feb. 2022, vol. 219, No. 109184 (pp. 1-15).
European Office Action on EP Appl. Ser. No. 20751421.7 dated Sep. 3, 2025 (8 pages).
European Office Action on EP Appl. Ser. No. 20750965.4 dated Sep. 9, 2025 (5 pages).
JP Notice of Reason for Refusal for JP Appl. Ser. No. 2023-573259 dated Jan. 27, 2026 (86 pages).

* cited by examiner

BUILDING EQUIPMENT WITH PREDICTIVE CONTROL

CROSS-REFERENCE TO RELATED PATENT APPLICATIONS

This application is a continuation-in-part of U.S. patent application Ser. No. 16/016,361 filed Jun. 22, 2018, which claims the benefit of and priority to U.S. Provisional Patent Application No. 62/524,325 filed Jun. 23, 2017. This application also claims the benefit of and priority to U.S. Provisional Patent Application No. 63/194,771 filed May 28, 2021. The entire disclosures each of these patent applications are incorporated by reference herein.

BACKGROUND

The present disclosure relates generally to building equipment with predictive control and more particularly to HVAC equipment such as chillers, boilers, cooling towers, valves, pumps, and other types of equipment for use in a central energy facility or building HVAC system.

A central energy facility (CEF) includes various types of HVAC equipment configured to provide heating or cooling for a building. For example, a CEF may include chillers, boilers, heat recovery chillers, cooling towers, valves, pumps, actuators, and other type of equipment configured to heat or cool a working fluid circulated to a building. The heated or cooled fluid can be provided to an air handling unit or rooftop unit in order to exchange heat with an airflow provided to one or more zones of the building.

The equipment of a CEF may include several components that consume power during operation. For example, a chiller may include a compressor configured to circulate a refrigerant through a refrigeration circuit. A cooling tower may include one or more fans configured to facilitate airflow through the cooling tower. Valve, actuators, and pumps may also consume power during operation. It would be desirable to minimize the power consumption of these and other power-consuming components in order to reduce the cost of energy consumed by the CEF.

SUMMARY

One implementation of the present disclosure is a central energy facility (CEF). The CEF includes a plurality of powered CEF components, a battery unit, and a predictive CEF controller. The powered CEF components include a chiller unit and a cooling tower. The battery unit is configured to store electric energy from an energy grid and discharge the stored electric energy for use in powering the powered CEF components. The predictive CEF controller is configured to optimize a predictive cost function to determine an optimal amount of electric energy to purchase from the energy grid and an optimal amount of electric energy to store in the battery unit or discharge from the battery unit for use in powering the powered CEF components at each time step of an optimization period.

In some embodiments, the CEF includes one or more photovoltaic panels configured to collect photovoltaic energy. The predictive CEF controller may be configured to determine an optimal amount of the photovoltaic energy to store in the battery unit and an optimal amount of the photovoltaic energy to be consumed by the powered CEF components at each time step of the optimization period.

In some embodiments, the predictive cost function accounts for a cost of the electric energy purchased from the energy grid at each time step of the optimization period and a cost savings resulting from discharging stored electric energy from the battery unit at each time step of the optimization period.

In some embodiments, the predictive CEF controller is configured to receive energy pricing data defining a cost per unit of electric energy purchased from the energy grid at each time step of the optimization period and use the energy pricing data as inputs to the predictive cost function.

In some embodiments, the predictive cost function accounts for a demand charge based on a maximum power consumption of the CEF during a demand charge period that overlaps at least partially with the optimization period. The predictive CEF controller may be configured to receive energy pricing data defining the demand charge and to use the energy pricing data as inputs to the predictive cost function.

In some embodiments, the predictive CEF controller includes an economic controller configured to determine optimal power setpoints for the powered CEF components and for the battery unit at each time step of the optimization period, a tracking controller configured to use the optimal power setpoints to determine optimal temperature setpoints at each time step of the optimization period, and an equipment controller configured to use the optimal temperature setpoints to generate control signals for the powered CEF components and for the battery unit at each time step of the optimization period.

Another implementation of the present disclosure is an air-cooled chiller unit. The air-cooled chiller unit includes a refrigeration circuit, a plurality of powered chiller components, a battery unit, and a predictive chiller controller. The refrigeration circuit includes an evaporator and a condenser. The powered chiller components include a compressor configured to circulate a refrigerant through the refrigeration circuit and a fan configured to provide cooling for the condenser. The battery unit is configured to store electric energy from an energy grid and discharge the stored electric energy for use in powering the powered chiller components. The predictive chiller controller is configured to optimize a predictive cost function to determine an optimal amount of electric energy to purchase from the energy grid and an optimal amount of electric energy to store in the battery unit or discharge from the battery unit for use in powering the powered chiller components at each time step of an optimization period In some embodiments, the air-cooled chiller unit includes one or more photovoltaic panels configured to collect photovoltaic energy. The predictive chiller controller may be configured to determine an optimal amount of the photovoltaic energy to store in the battery unit and an optimal amount of the photovoltaic energy to be consumed by the powered chiller components at each time step of the optimization period.

In some embodiments, the predictive cost function accounts for a cost of the electric energy purchased from the energy grid at each time step of the optimization period and a cost savings resulting from discharging stored electric energy from the battery unit at each time step of the optimization period.

In some embodiments, the predictive chiller controller is configured to receive energy pricing data defining a cost per unit of electric energy purchased from the energy grid at each time step of the optimization period and use the energy pricing data as inputs to the predictive cost function.

In some embodiments, the predictive cost function accounts for a demand charge based on a maximum power consumption of the air-cooled chiller unit during a demand charge period that overlaps at least partially with the optimization period. The predictive chiller controller may be configured to receive energy pricing data defining the demand charge and to use the energy pricing data as inputs to the predictive cost function.

In some embodiments, the predictive chiller controller includes an economic controller configured to determine optimal power setpoints for the powered chiller components and for the battery unit at each time step of the optimization period, a tracking controller configured to use the optimal power setpoints to determine optimal temperature setpoints at each time step of the optimization period, and an equipment controller configured to use the optimal temperature setpoints to generate control signals for the powered chiller components and for the battery unit at each time step of the optimization period.

Another implementation of the present disclosure is a pump unit. The pump unit includes a pump, a battery unit, and a predictive pump controller. The pump is configured to circulate a fluid through a fluid circuit. The battery unit is configured to store electric energy from an energy grid and discharge the stored electric energy for use in powering the pump. The predictive pump controller is configured to optimize a predictive cost function to determine an optimal amount of electric energy to purchase from the energy grid and an optimal amount of electric energy to store in the battery unit or discharge from the battery unit for use in powering the pump at each time step of an optimization period.

In some embodiments, the predictive cost function accounts for a cost of the electric energy purchased from the energy grid at each time step of the optimization period and a cost savings resulting from discharging stored electric energy from the battery unit at each time step of the optimization period.

In some embodiments, the predictive pump controller is configured to receive energy pricing data defining a cost per unit of electric energy purchased from the energy grid at each time step of the optimization period and use the energy pricing data as inputs to the predictive cost function.

In some embodiments, the predictive cost function accounts for a demand charge based on a maximum power consumption of the pump unit during a demand charge period that overlaps at least partially with the optimization period. The predictive pump controller may be configured to receive energy pricing data defining the demand charge and to use the energy pricing data as inputs to the predictive cost function.

In some embodiments, the predictive pump controller includes an economic controller configured to determine optimal power setpoints for the pump and for the battery unit at each time step of the optimization period, a tracking controller configured to use the optimal power setpoints to determine optimal flow setpoints or pressure setpoints at each time step of the optimization period, and an equipment controller configured to use the optimal flow setpoints or pressure setpoints to generate control signals for the pump and for the battery unit at each time step of the optimization period.

Another implementation of the present disclosure is a cooling tower unit. The cooling tower unit includes one or more powered cooling tower components, a battery unit, and a predictive cooling tower controller. The cooling tower components include at least one of a fan and a pump. The battery unit is configured to store electric energy from an energy grid and discharge the stored electric energy for use in powering the powered cooling tower components. The predictive cooling tower controller is configured to optimize a predictive cost function to determine an optimal amount of electric energy to purchase from the energy grid and an optimal amount of electric energy to store in the battery unit or discharge from the battery unit for use in powering the powered cooling tower components at each time step of an optimization period.

In some embodiments, the cooling tower unit includes one or more photovoltaic panels configured to collect photovoltaic energy. The predictive cooling tower controller may be configured to determine an optimal amount of the photovoltaic energy to store in the battery unit and an optimal amount of the photovoltaic energy to be consumed by the powered cooling tower components at each time step of the optimization period.

In some embodiments, the predictive cost function accounts for a cost of the electric energy purchased from the energy grid at each time step of the optimization period and a cost savings resulting from discharging stored electric energy from the battery unit at each time step of the optimization period.

In some embodiments, the predictive cooling tower controller is configured to receive energy pricing data defining a cost per unit of electric energy purchased from the energy grid at each time step of the optimization period and use the energy pricing data as inputs to the predictive cost function.

In some embodiments, the predictive cost function accounts for a demand charge based on a maximum power consumption of the cooling tower unit during a demand charge period that overlaps at least partially with the optimization period. The predictive cooling tower controller may be configured to receive energy pricing data defining the demand charge and to use the energy pricing data as inputs to the predictive cost function.

In some embodiments, the predictive cooling tower controller includes an economic controller configured to determine optimal power setpoints for the powered cooling tower components and for the battery unit at each time step of the optimization period, a tracking controller configured to use the optimal power setpoints to determine optimal temperature setpoints at each time step of the optimization period, and an equipment controller configured to use the optimal temperature setpoints to generate control signals for the powered cooling tower components and for the battery unit at each time step of the optimization period.

Another implementation of the present disclosure is a valve unit. The valve unit includes a valve, one or more powered valve components, a battery unit, and a predictive valve controller. The valve is configured to control a flow-rate of a fluid through a fluid conduit. The powered valve components include a valve actuator coupled to the valve and configured to modulate a position of the valve. The battery unit is configured to store electric energy from an energy grid and discharge the stored electric energy for use in powering the powered valve components. The predictive valve controller is configured to optimize a predictive cost function to determine an optimal amount of electric energy to purchase from the energy grid and an optimal amount of electric energy to store in the battery unit or discharge from the battery unit for use in powering the powered valve components at each time step of an optimization period.

In some embodiments, the predictive cost function accounts for a cost of the electric energy purchased from the energy grid at each time step of the optimization period and a cost savings resulting from discharging stored electric energy from the battery unit at each time step of the optimization period.

In some embodiments, the predictive valve controller is configured to receive energy pricing data defining a cost per unit of electric energy purchased from the energy grid at each time step of the optimization period and use the energy pricing data as inputs to the predictive cost function.

In some embodiments, the predictive cost function accounts for a demand charge based on a maximum power consumption of the valve unit during a demand charge period that overlaps at least partially with the optimization period. The predictive valve controller may be configured to receive energy pricing data defining the demand charge and to use the energy pricing data as inputs to the predictive cost function.

In some embodiments, the predictive valve controller includes an economic controller configured to determine optimal power setpoints for the powered valve components and for the battery unit at each time step of the optimization period, a tracking controller configured to use the optimal power setpoints to determine optimal position setpoints at each time step of the optimization period, and an equipment controller configured to use the optimal temperature setpoints to generate control signals for the powered valve components and for the battery unit at each time step of the optimization period.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

DETAILED DESCRIPTION

Building and HVAC System

Figure 1:
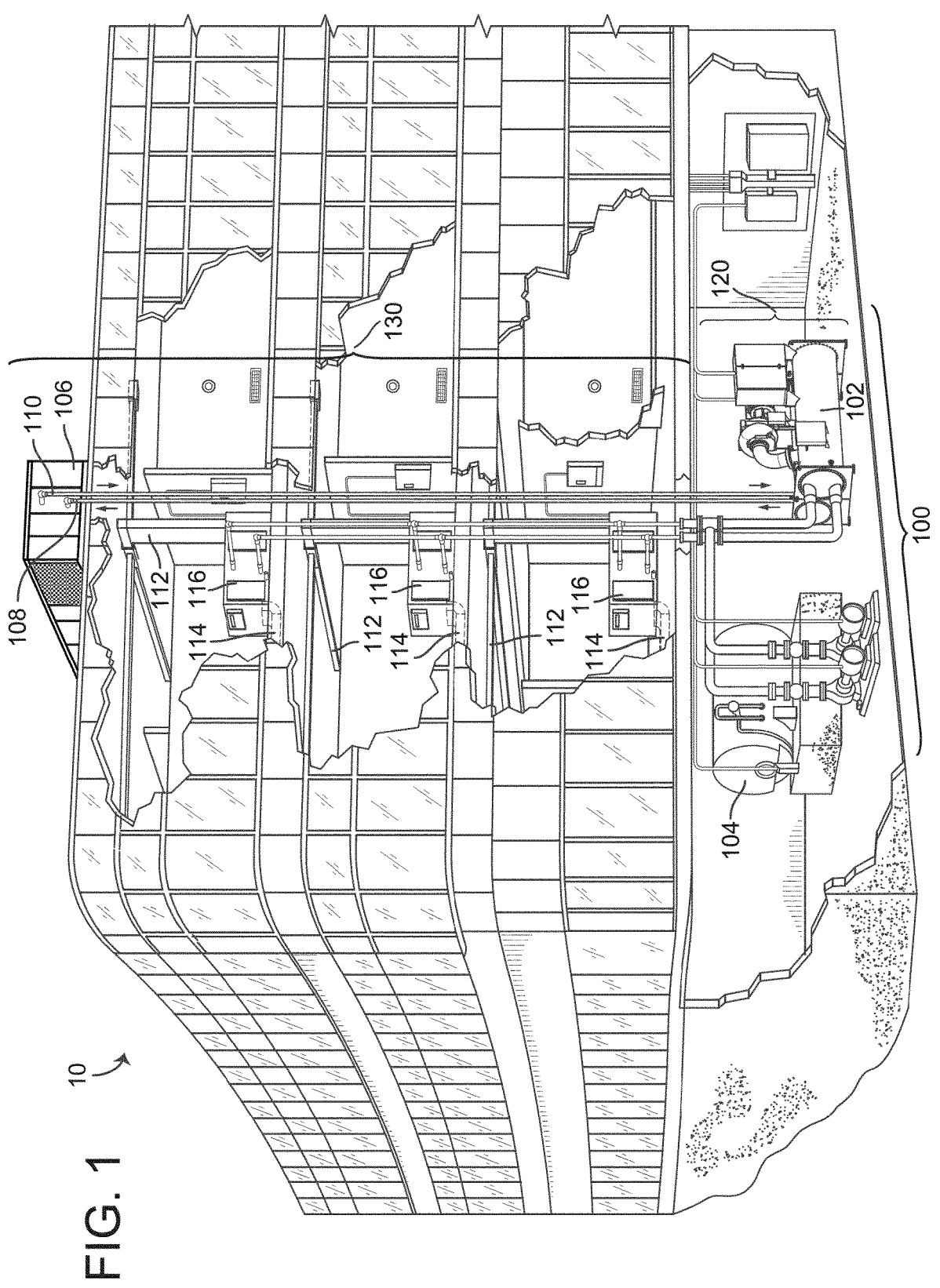
FIG. 1 is a drawing of a building equipped with a HVAC system, according to some embodiments.

Referring now to FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes a HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10.

HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 may place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 may transfer heat between the airflow and the working fluid to provide heating or cooling for the airflow. For example, AHU 106 can include one or more fans or blowers configured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Central Energy Facility

Figure 2:
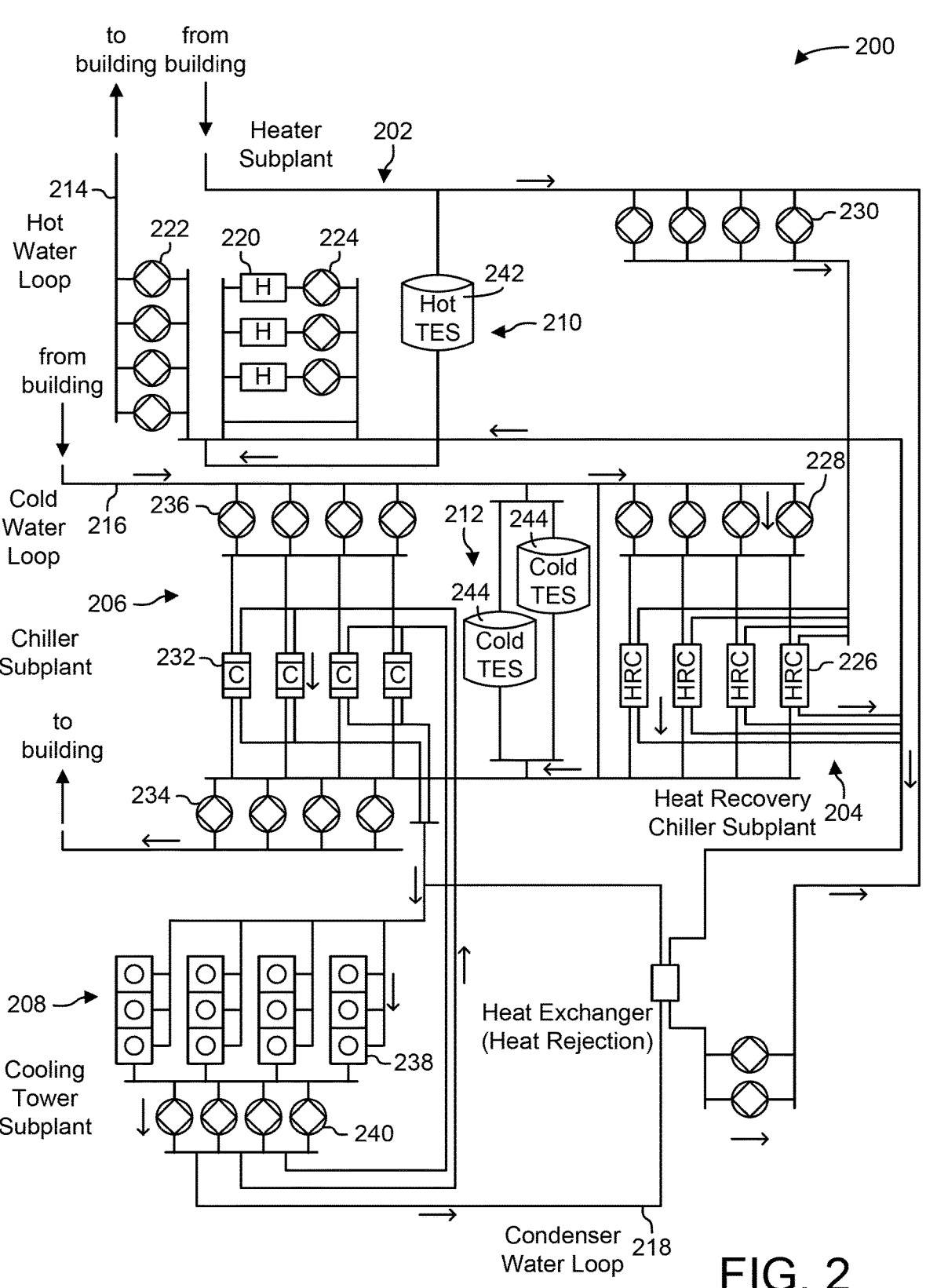
FIG. 2 is a drawing of a central energy facility (CEF) which can be used to provide heating or cooling to the building of FIG. 1, according to some embodiments.

Referring now to FIG. 2, a block diagram of a central energy facility (CEF) 200 is shown, according to some embodiments. In various embodiments, CEF 200 may supplement or replace waterside system 120 in HVAC system 100 or can be implemented separate from HVAC system 100. When implemented in HVAC system 100, CEF 200 can include a subset of the HVAC devices in HVAC system 100 (e.g., boiler 104, chiller 102, pumps, valves, etc.) and may operate to supply a heated or chilled fluid to AHU 106. The HVAC devices of CEF 200 can be located within building 10 (e.g., as components of waterside system 120) or at an offsite location.

CEF 200 is shown to include a plurality of subplants 202-212 including a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve thermal energy loads (e.g., hot water, cold water, heating, cooling, etc.) of a building or campus. For example, heater subplant 202 can be configured to heat water in a hot water loop 214 that circulates the hot water between heater subplant 202 and building 10. Chiller subplant 206 can be configured to chill water in a cold water loop 216 that circulates the cold water between chiller subplant 206 building 10. Heat recovery chiller subplant 204 can be configured to transfer heat from cold water loop 216 to hot water loop 214 to provide additional heating for the hot water and additional cooling for the cold water. Condenser water loop 218 may absorb heat from the cold water in chiller subplant 206 and reject the absorbed heat in cooling tower subplant 208 or transfer the absorbed heat to hot water loop 214. Hot TES subplant 210 and cold TES subplant 212 may store hot and cold thermal energy, respectively, for subsequent use.

Hot water loop 214 and cold water loop 216 may deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, $CO_2$, etc.) can be used in place of or in addition to water to serve thermal energy loads. In other embodiments, subplants 202-212 may provide heating and/or cooling directly to the building or campus without requiring an intermediate heat transfer fluid. These and other variations to CEF 200 are within the teachings of the present disclosure.

Each of subplants 202-212 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 may also include one or more pumps or valves configured to control the flow rate of the hot water into or out of hot TES tank 242. Cold TES subplant 212 is shown to include cold TES tanks 244 configured to store the cold water for later use. Cold TES subplant 212 may also include one or more pumps or valves configured to control the flow rate of the cold water into or out of cold TES tanks 244.

In some embodiments, one or more of the pumps in CEF 200 (e.g., pumps 222, 224, 228, 230, 234, 236, and/or 240) or pipelines in CEF 200 include an isolation valve associated therewith. Isolation valves can be integrated with the pumps or positioned upstream or downstream of the pumps to control the fluid flows in CEF 200. In various embodiments, CEF 200 can include more, fewer, or different types of devices and/or subplants based on the particular configuration of CEF 200 and the types of loads served by CEF 200.

Central Energy Facility with Battery Unit and Predictive Control

Figure 3:
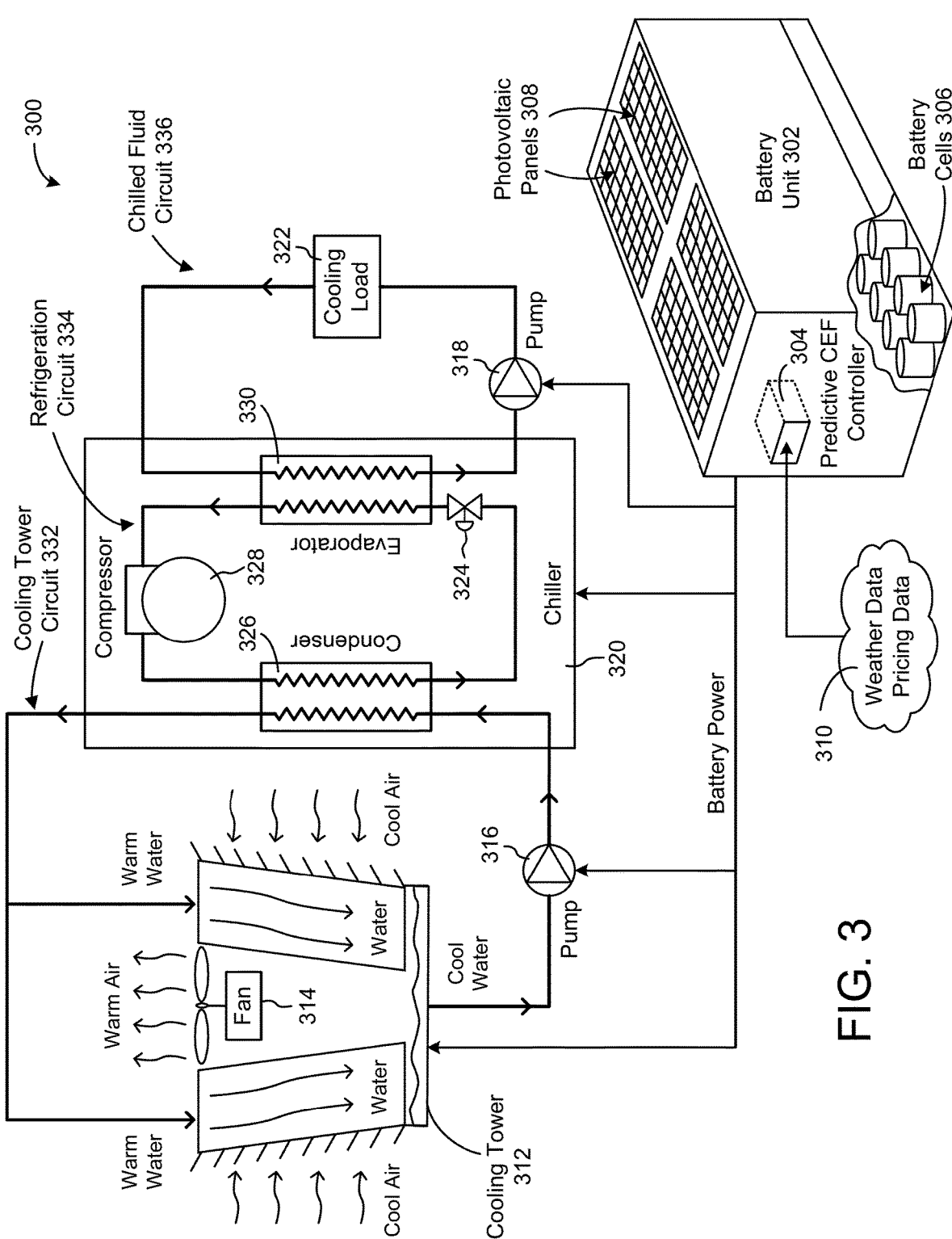
FIG. 3 is a drawing of a CEF with a battery unit and a predictive CEF controller, according to some embodiments.

Referring now to FIG. 3, a central energy facility (CEF) 300 with a battery unit 302 and predictive CEF controller 304 is shown, according to some embodiments. CEF 300 can be configured to provide cooling to a cooling load 322. Cooling load 322 can include, for example, a building zone, a supply airstream flowing through an air duct, an airflow in an air handling unit or rooftop unit, fluid flowing through a heat exchanger, a refrigerator or freezer, a condenser or evaporator, a cooling coil, or any other type of system, device, or space which requires cooling. In some embodiments, a pump 318 circulates a chilled fluid to cooling load 322 via a chilled fluid circuit 336. The chilled fluid can absorb heat from cooling load 322, thereby providing cooling to cooling load 322 and warming the chilled fluid.

CEF 300 is shown to include a cooling tower 312 and a chiller 320. Cooling tower 312 can be configured to cool the water in cooling tower circuit 332 by transferring heat from the water to outside air. In some embodiments, a pump 316 circulates water through cooling tower 312 via cooling tower circuit 332. Cooling tower 312 may include a fan 314 which causes cool air to flow through cooling tower 312. Cooling tower 312 places the cool air in a heat exchange relationship with the warmer water, thereby transferring heat from warmer water to the cooler air. Cooling tower 312 can provide cooling for a condenser 326 of chiller 320. Condenser 326 can transfer heat from the refrigerant in refrigeration circuit 334 to the water in cooling tower circuit 332. Although cooling tower circuit 332 is shown and described as circulating water, it should be understood that any type of coolant or working fluid (e.g., water, glycol, $CO_2$, etc.) can be used in cooling tower circuit 332.

Chiller 320 is shown to include a condenser 326, a compressor 328, an evaporator 330, and an expansion device 324. Compressor 328 can be configured to circulate a refrigerant between condenser 326 and evaporator 330 via refrigeration circuit 334. Compressor 328 operates to compress the refrigerant to a high pressure, high temperature state. The compressed refrigerant flows through condenser 326, which transfers heat from the refrigerant in refrigeration circuit 334 to the water in cooling tower circuit 332. The cooled refrigerant then flows through expansion device 324, which expands the refrigerant to a low temperature, low pressure state. The expanded refrigerant flows through evaporator 330, which transfers heat from the chilled fluid in chilled fluid circuit 336 to the refrigerant in refrigeration circuit 334.

In some embodiments, CEF 300 includes multiple chillers 320. Each of chillers 320 can be arranged in parallel and configured to provide cooling for the fluid in chilled fluid circuit 336. The set of chillers 320 may have a cooling capacity of approximately 1-3 MW or 1000-6000 tons in some embodiments. Similarly, CEF 300 can include multiple cooling towers 312. Each of the cooling towers 312 can be arranged in parallel and configured to provide cooling for the water in cooling tower circuit 332. Although only cooling components are shown in FIG. 3, it is contemplated that CEF 300 can include heating components in some embodiments. For example, CEF 300 may include one or more boilers, heat recovery chillers, steam generators, or other devices configured to provide heating. In some embodiments, CEF 300 includes some or all of the components of CEF 200, as described with reference to FIG. 2.

Still referring to FIG. 3, CEF 300 is shown to include a battery unit 302. In some embodiments, battery unit 302 includes one or more photovoltaic (PV) panels 308. PV panels 308 may include a collection of photovoltaic cells. The photovoltaic cells are configured to convert solar energy (i.e., sunlight) into electricity using a photovoltaic material such as monocrystalline silicon, polycrystalline silicon, amorphous silicon, cadmium telluride, copper indium gallium selenide/sulfide, or other materials that exhibit the photovoltaic effect. In some embodiments, the photovoltaic cells are contained within packaged assemblies that form PV panels 308. Each PV panel 308 may include a plurality of linked photovoltaic cells. PV panels 308 may combine to form a photovoltaic array.

In some embodiments, PV panels 308 are configured to maximize solar energy collection. For example, battery unit 302 may include a solar tracker (e.g., a GPS tracker, a sunlight sensor, etc.) that adjusts the angle of PV panels 308 so that PV panels 308 are aimed directly at the sun throughout the day. The solar tracker may allow PV panels 308 to receive direct sunlight for a greater portion of the day and may increase the total amount of power produced by PV panels 308. In some embodiments, battery unit 302 includes a collection of mirrors, lenses, or solar concentrators configured to direct and/or concentrate sunlight on PV panels 308. The energy generated by PV panels 308 may be stored in battery cells 306 and/or used to power various components of CEF 300.

In some embodiments, battery unit 302 includes one or more battery cells 306. Battery cells 306 are configured to store and discharge electric energy (i.e., electricity). In some embodiments, battery unit 302 is charged using electricity from an external energy grid (e.g., provided by an electric utility). The electricity stored in battery unit 302 can be discharged to power one or more powered components of CEF 300 (e.g., cooling tower 312, fan 314, chiller 320, pumps 316-318, etc.). Advantageously, battery unit 302 allows CEF 300 to draw electricity from the energy grid and charge battery unit 302 when energy prices are low and discharge the stored electricity when energy prices are high to time-shift the electric load of CEF 300. In some embodiments, battery unit 302 has sufficient energy capacity (e.g., 6-12 MW-hours) to power CEF 300 for approximately 4-6 hours when operating at maximum capacity such that battery unit 302 can be utilized during high energy cost periods and charged during low energy cost periods.

In some embodiments, predictive CEF controller 304 performs an optimization process to determine whether to charge or discharge battery unit 302 during each of a plurality of time steps that occur during an optimization period. Predictive CEF controller 304 may use weather and pricing data 310 to predict the amount of heating/cooling required and the cost of electricity during each of the plurality of time steps. Predictive CEF controller 304 can optimize an objective function that accounts for the cost of electricity purchased from the energy grid over the duration of the optimization period. In some embodiments, the objective function also accounts for the cost of operating various components of CEF 300 (e.g., cost of natural gas used to fuel boilers). Predictive CEF controller 304 can determine an amount of electricity to purchase from the energy grid and an amount of electricity to store or discharge from battery unit 302 during each time step. The objective function and the optimization performed by predictive CEF controller 304 are described in greater detail with reference to FIGS. 4-5.

Predictive CEF Control System

Figure 4:
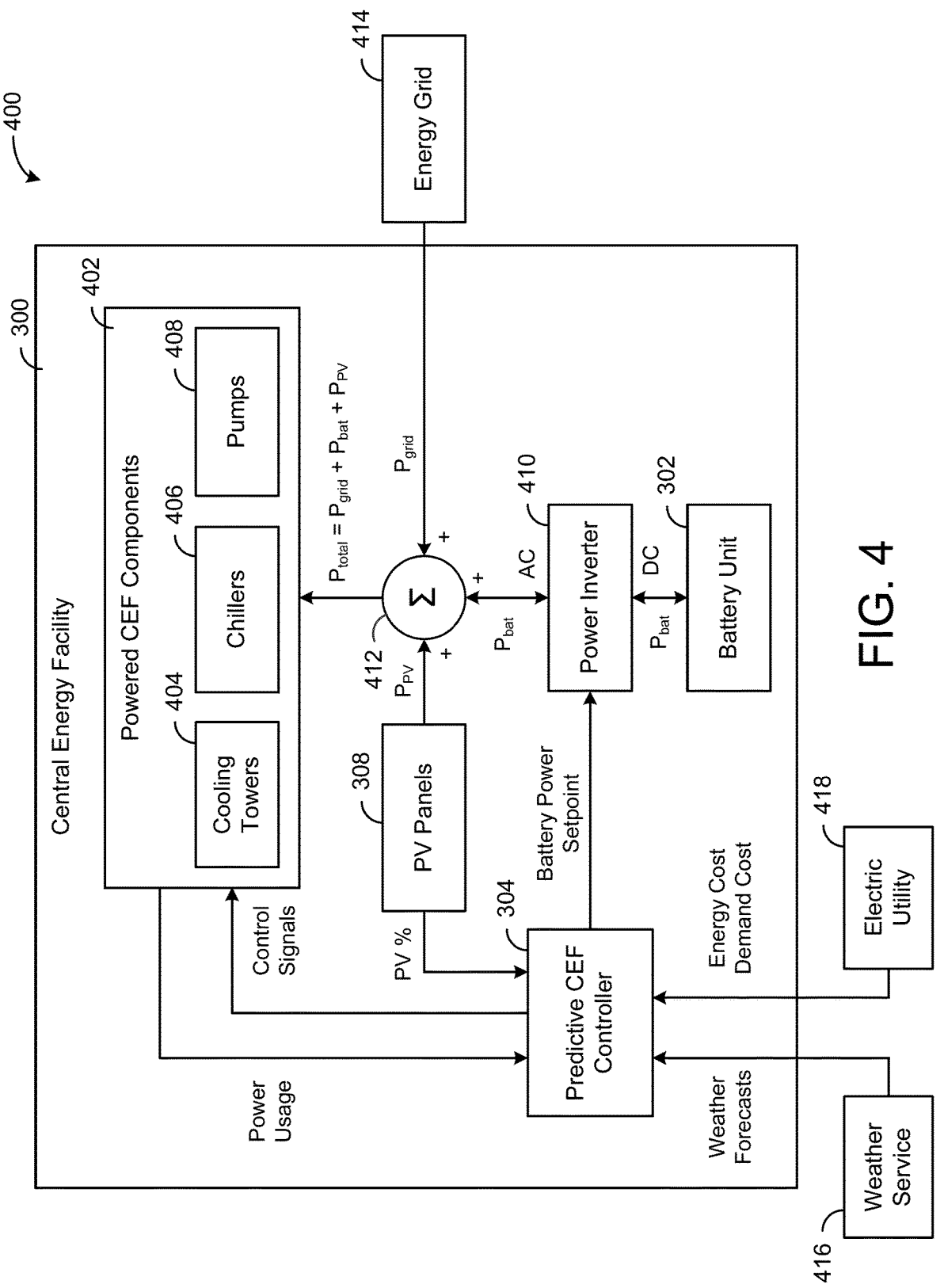
FIG. 4 is a block diagram of a predictive CEF control system including the battery unit and predictive CEF controller of FIG. 3, according to some embodiments.

Referring now to FIG. 4, a block diagram of a predictive CEF control system 400 is shown, according to some embodiments. Several of the components shown in control system 400 may be part of CEF 300. For example, CEF 300 may include powered CEF components 402, battery unit 302, predictive CEF controller 304, power inverter 410, and a power junction 412. Powered CEF components 402 may include any component of CEF 300 that consumes power (e.g., electricity) during operation. For example, powered CEF components 402 are shown to include cooling towers 404, chillers 406, and pumps 408. These components may be similar to cooling tower 312, chiller 320, and pumps 316-318, as described with reference to FIG. 3.

Power inverter 410 may be configured to convert electric power between direct current (DC) and alternating current (AC). For example, battery unit 302 may be configured to store and output DC power, whereas energy grid 414 and powered CEF components 402 may be configured to consume and provide AC power. Power inverter 410 may be used to convert DC power from battery unit 302 into a sinusoidal AC output synchronized to the grid frequency of energy grid 414 and/or powered CEF components 402. Power inverter 410 may also be used to convert AC power from energy grid 414 into DC power that can be stored in battery unit 302. The power output of battery unit 302 is shown as $P_{bat}$. $P_{bat}$ may be positive if battery unit 302 is providing power to power inverter 410 (i.e., battery unit 302 is discharging) or negative if battery unit 302 is receiving power from power inverter 410 (i.e., battery unit 302 is charging).

In some instances, power inverter 410 receives a DC power output from battery unit 302 and converts the DC power output to an AC power output that can be provided to powered CEF components 402. Power inverter 410 may synchronize the frequency of the AC power output with that of energy grid 414 (e.g., 50 Hz or 60 Hz) using a local oscillator and may limit the voltage of the AC power output to no higher than the grid voltage. In some embodiments, power inverter 410 is a resonant inverter that includes or uses LC circuits to remove the harmonics from a simple square wave in order to achieve a sine wave matching the frequency of energy grid 414. In various embodiments, power inverter 410 may operate using high-frequency transformers, low-frequency transformers, or without transformers. Low-frequency transformers may convert the DC output from battery unit 302 directly to the AC output provided to powered CEF components 402. High-frequency transformers may employ a multi-step process that involves converting the DC output to high-frequency AC, then back to DC, and then finally to the AC output provided to powered CEF components 402.

The power output of PV panels 308 is shown as $P_{PV}$. The power output $P_{PV}$ of PV panels 308 can be stored in battery unit 302 and/or used to power powered CEF components 402. In some embodiments, PV panels 308 measure the amount of power $P_{PV}$ generated by PV panels 308 and provides an indication of the PV power to predictive CEF controller 304. For example, PV panels 308 are shown providing an indication of the PV power percentage (i.e., PV %) to predictive CEF controller 304. The PV power percentage may represent a percentage of the maximum PV power at which PV panels 308 are currently operating.

Power junction 412 is the point at which powered CEF components 402, energy grid 414, PV panels 308, and power inverter 410 are electrically connected. The power supplied to power junction 412 from power inverter 410 is shown as $P_{bat}$. $P_{bat}$ may be positive if power inverter 410 is providing power to power junction 412 (i.e., battery unit 302 is discharging) or negative if power inverter 410 is receiving power from power junction 412 (i.e., battery unit 302 is charging). The power supplied to power junction 412 from energy grid 414 is shown as $P_{grid}$ and the power supplied to power junction 412 from PV panels 308 is shown as $P_{PV}$. $P_{bat}$, $P_{PV}$, and $P_{grid}$ combine at power junction 412 to form $P_{total}$ (i.e., $P_{total}=P_{grid}+P_{bat}+P_{PV}$). $P_{total}$ may be defined as the power provided to powered CEF components 402 from power junction 412. In some instances, $P_{total}$ is greater than $P_{grid}$. For example, when battery unit 302 is discharging, $P_{bat}$ may be positive which adds to the grid power $P_{grid}$ and the PV power $P_{PV}$ when $P_{bat}$ and $P_{PV}$ combine with $P_{grid}$ to form $P_{total}$ In other instances, $P_{total}$ may be less than $P_{grid}$. For example, when battery unit 302 is charging, $P_{bat}$ may be negative which subtracts from the grid power $P_{grid}$ and the PV power $P_{PV}$ when $P_{bat}$, $P_{PV}$, and combine to form $P_{total}$.

Predictive CEF controller 304 can be configured to control powered CEF components 402 and power inverter 410. In some embodiments, predictive CEF controller 304 generates and provides a battery power setpoint $P_{sp,bat}$ to power inverter 410. The battery power setpoint $P_{sp,bat}$ may include a positive or negative power value (e.g., kW) which causes power inverter 410 to charge battery unit 302 (when $P_{sp,bat}$ is negative) using power available at power junction 412 or discharge battery unit 302 (when $P_{sp,bat}$ is positive) to provide power to power junction 412 in order to achieve the battery power setpoint $P_{sp,bat}$.

In some embodiments, predictive CEF controller 304 generates and provides control signals to powered CEF components 402. Predictive CEF controller 304 may use a multi-stage optimization technique to generate the control signals. For example, predictive CEF controller 304 may include an economic controller configured to determine the optimal amount of power to be consumed by powered CEF components 402 at each time step during the optimization period. The optimal amount of power to be consumed may minimize a cost function that accounts for the cost of energy consumed by CEF 300. The cost of energy may be based on time-varying energy prices from electric utility 418. In some embodiments, predictive CEF controller 304 determines an optimal amount of power to purchase from energy grid 414 (i.e., a grid power setpoint $P_{sp,grid}$) and an optimal amount of power to store or discharge from battery unit 302 (i.e., a battery power setpoint $P_{sp,bat}$) at each of the plurality of time steps. Predictive CEF controller 304 may monitor the actual power usage of powered CEF components 402 and may utilize the actual power usage as a feedback signal when generating the optimal power setpoints.

Predictive CEF controller 304 may include a tracking controller configured to generate temperature setpoints (e.g., a zone temperature setpoint $T_{sp,zone}$, a chilled water temperature setpoint $T_{sp,chw}$, etc.) that achieve the optimal amount of power consumption at each time step. In some embodiments, predictive CEF controller 304 uses equipment models for powered CEF components 402 to determine an amount of heating or cooling that can be generated by CEF components 402 based on the optimal amount of power consumption. Predictive CEF controller 304 can use a zone temperature model in combination with weather forecasts from a weather service 416 to predict how the temperature of the building zone $T_{zone}$ will change based on the power setpoints and/or the temperature setpoints.

In some embodiments, predictive CEF controller 304 uses the temperature setpoints to generate the control signals for powered CEF components 402. The control signals may include on/off commands, speed setpoints for fans of cooling towers 404, power setpoints for compressors of chillers 406, chilled water temperature setpoints for chillers 406, pressure setpoints or flow rate setpoints for pumps 408, or other types of setpoints for individual devices of powered CEF components 402. In other embodiments, the control signals may include the temperature setpoints (e.g., a zone temperature setpoint $T_{sp,zone}$, a chilled water temperature setpoint $T_{sp,chw}$, etc.) generated by predictive CEF controller 304. The temperature setpoints can be provided to powered CEF components 402 or local controllers for powered CEF components 402 which operate to achieve the temperature setpoints. For example, a local controller for chillers 406 may receive a measurement of the chilled water temperature $T_{chw}$ from chilled water temperature sensor and/or a measurement the zone temperature $T_{zone}$ from a zone temperature sensor. The local controller can use a feedback control process (e.g., PID, ESC, MPC, etc.) to increase or decrease the amount of cooling provided by chillers 406 to drive the measured temperature(s) to the temperature setpoint(s). Similar feedback control processes can be used to control cooling towers 404 and/or pumps 408. The multi-stage optimization performed by predictive CEF controller 304 is described in greater detail with reference to FIG. 5.

Predictive CEF Controller

Figure 5:
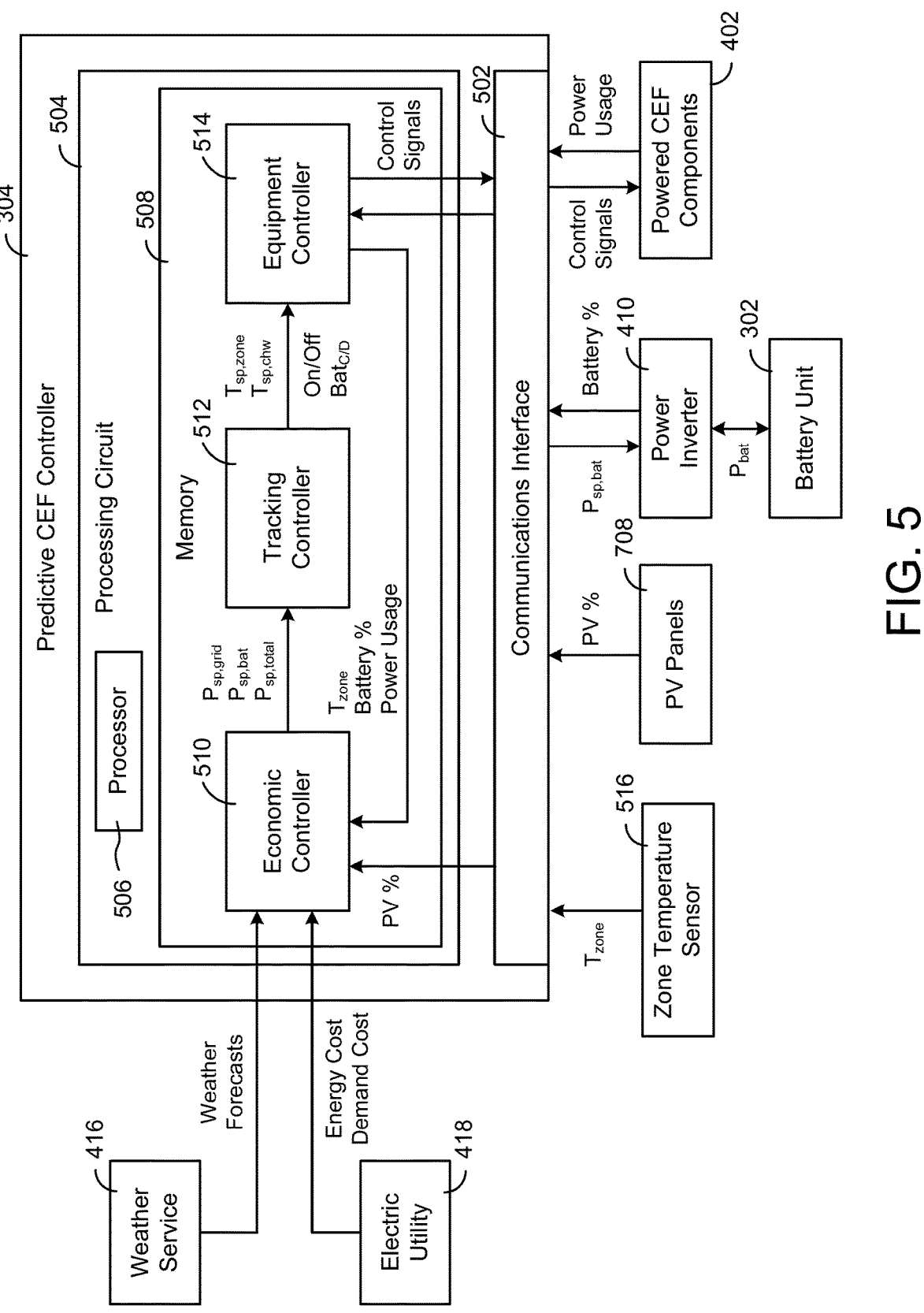
FIG. 5 is a block diagram illustrating the predictive CEF controller of FIG. 3 in greater detail, according to some embodiments.

Referring now to FIG. 5, a block diagram illustrating predictive CEF controller 304 in greater detail is shown, according to an exemplary embodiment. Predictive CEF controller 304 is shown to include a communications interface 502 and a processing circuit 504. Communications interface 502 may facilitate communications between controller 304 and external systems or devices. For example, communications interface 502 may receive measurements of the zone temperature $T_{zone}$ from zone temperature sensor 516 and measurements of the power usage of powered CEF components 402. In some embodiments, communications interface 502 receives measurements of the state-of-charge (SOC) of battery unit 302, which can be provided as a percentage of the maximum battery capacity (i.e., battery %). Communications interface 502 can receive weather forecasts from a weather service 416 and predicted energy costs and demand costs from an electric utility 418. In some embodiments, predictive CEF controller 304 uses communications interface 502 to provide control signals powered CEF components 402 and power inverter 410.

Communications interface 502 may include wired or wireless communications interfaces (e.g., jacks, antennas, transmitters, receivers, transceivers, wire terminals, etc.) for conducting data communications external systems or devices. In various embodiments, the communications may be direct (e.g., local wired or wireless communications) or via a communications network (e.g., a WAN, the Internet, a cellular network, etc.). For example, communications interface 502 can include an Ethernet card and port for sending and receiving data via an Ethernet-based communications link or network. In another example, communications interface 502 can include a Wi-Fi transceiver for communicating via a wireless communications network or cellular or mobile phone communications transceivers.

Processing circuit 504 is shown to include a processor 506 and memory 508. Processor 506 may be a general purpose or specific purpose processor, an application specific integrated circuit (ASIC), one or more field programmable gate arrays (FPGAs), a group of processing components, or other suitable processing components. Processor 506 is configured to execute computer code or instructions stored in memory 508 or received from other computer readable media (e.g., CDROM, network storage, a remote server, etc.).

Memory 508 may include one or more devices (e.g., memory units, memory devices, storage devices, etc.) for storing data and/or computer code for completing and/or facilitating the various processes described in the present disclosure. Memory 508 may include random access memory (RAM), read-only memory (ROM), hard drive storage, temporary storage, non-volatile memory, flash memory, optical memory, or any other suitable memory for storing software objects and/or computer instructions. Memory 508 may include database components, object code components, script components, or any other type of information structure for supporting the various activities and information structures described in the present disclosure. Memory 508 may be communicably connected to processor 506 via processing circuit 504 and may include computer code for executing (e.g., by processor 506) one or more processes described herein. When processor 506 executes instructions stored in memory 508 for completing the various activities described herein, processor 506 generally configures controller 304 (and more particularly processing circuit 504) to complete such activities.

Still referring to FIG. 5, predictive CEF controller 304 is shown to include an economic controller 510, a tracking controller 512, and an equipment controller 514. Controllers 510-514 can be configured to perform a multi-state optimization process to generate control signals for power inverter 410 and powered CEF components 402. In brief overview, economic controller 510 can optimize a predictive cost function to determine an optimal amount of power to purchase from energy grid 414 (i.e., a grid power setpoint $P_{sp,grid}$), an optimal amount of power to store or discharge from battery unit 302 (i.e., a battery power setpoint $P_{sp,bat}$), and/or an optimal amount of power to be consumed by powered CEF components 402 (i.e., a CEF power setpoint $P_{sp,total}$) at each time step of an optimization period. Tracking controller 512 can use the optimal power setpoints $P_{sp,grid}$, $P_{sp,bat}$, and/or $P_{sp,total}$ to determine optimal temperature setpoints (e.g., a zone temperature setpoint $T_{sp,zone}$, a chilled water temperature setpoint $T_{sp,chw}$, etc.) and an optimal battery charge or discharge rate (i.e., $Bat_{C/D}$). Equipment controller 514 can use the optimal temperature setpoints $T_{sp,zone}$ or $T_{sp,chw}$ to generate control signals for powered CEF components 402 that drive the actual (e.g., measured) temperatures $T_{zone}$ and/or $T_{chw}$ to the setpoints (e.g., using a feedback control technique). Each of controllers 510-514 is described in detail below.

Economic Controller

Economic controller 510 can be configured to optimize a predictive cost function to determine an optimal amount of power to purchase from energy grid 414 (i.e., a grid power setpoint $P_{sp,grid}$), an optimal amount of power to store or discharge from battery unit 302 (i.e., a battery power setpoint $P_{sp,bat}$), and/or an optimal amount of power to be consumed by powered CEF components 402 (i.e., a CEF power setpoint $P_{sp,total}$) at each time step of an optimization period. An example of a predictive cost function which can be optimized by economic controller 510 is shown in the following equation:

$$\min(J) = \sum_{k=1}^{h} C_{ec}(k)P_{chiller}(k)\Delta t + \sum_{k=1}^{h} C_{ec}(k)P_{HRC}(k)\Delta t +$$

$$\sum_{k=1}^{h} C_{gas}(k)F_{gas}(k)\Delta t + C_{DC}\max_{k}(P_{grid}(k)) - \sum_{k=1}^{h} C_{ec}(k)P_{bat}(k)\Delta t$$

where $C_{ec}(k)$ is the cost per unit of electricity (e.g., \$/kWh) purchased from electric utility 418 during time step k, $P_{chiller}(k)$ is the power consumption (e.g., kW) of one or more chillers of CEF 300 during time step k, $P_{HRC}(k)$ is the power consumption of one or more heat recovery chillers (HRCs) of CEF 300 at time step k, $F_{gas}(k)$ is the natural gas consumption of one or more boilers of CEF 300 at time step k, $C_{gas}(k)$ is the cost per unit of natural gas consumed by CEF 300 at time step k, $C_{DC}$ is the demand charge rate (e.g., \$/kW), where the max( ) term selects the maximum electricity purchase of CEF 300 (i.e., the maximum value of $P_{grid}(k)$) during any time step k of the optimization period, $P_{bat}(k)$ is the amount of power discharged from battery unit 302 during time step k, and $\Delta t$ is the duration of each time step k. Economic controller 510 can optimize the predictive cost function J over the duration of the optimization period (e.g., from time step k=1 to time step k=h) to predict the total cost of operating CEF 300 over the duration of the optimization period.

The first and second terms of the predictive cost function J represent the cost of electricity consumed by powered CEF components 402 over the duration of the optimization period. The values of the parameter $C_{ec}(k)$ at each time step k can be defined by the energy cost information provided by electric utility 418. In some embodiments, the cost of electricity varies as a function of time, which results in different values of $C_{ec}(k)$ at different time steps k. The variables $P_{chiller}(k)$ and $P_{HRC}(k)$ are decision variables which can be optimized by economic controller 510. In some embodiments, the total power consumption $P_{total}(k)$ of powered CEF components 402 at time step k is equal to the sum of $P_{chiller}(k)$ and $P_{HRC}(k)$ (i.e., $P_{total}(k)=P_{chiller}(k)+P_{HRC}(k)$). Accordingly, the first two terms of the predictive cost function can be replaced with the summation $$\sum_{k=1}^{h} C_{ec}(k)P_{total}(k)\Delta t$$

some embodiments.

The third term of the predictive cost function J represents the cost of the fuel (e.g., natural gas) consumed by CEF 300 over the duration of the optimization period. The values of $C_{gas}(k)$ at each time step k can be defined by the energy cost information provided by a natural gas utility. In some embodiments, the cost of gas varies as a function of time, which results in different values of $C_{gas}(k)$ at different time steps k. The variable $F_{gas}(k)$ is a decision variable which can be optimized by economic controller 510.

The fourth term of the predictive cost function J represents the demand charge. Demand charge is an additional charge imposed by some utility providers based on the maximum power consumption during an applicable demand charge period. For example, the demand charge rate $C_{DC}$ may be specified in terms of dollars per unit of power (e.g., \$/kW) and may be multiplied by the peak power usage (e.g., kW) during a demand charge period to calculate the demand charge. In the predictive cost function J, the demand charge rate $C_{DC}$ may be defined by the demand cost information received from electric utility 418. The variable $P_{grid}(k)$ is a decision variable which can be optimized by economic controller 510 in order to reduce the peak power usage $\max(P_{grid}(k))$ that occurs during the demand charge period. Load shifting may allow economic controller 510 to smooth momentary spikes in the electric demand of CEF 300 by storing energy in battery unit 302 when the power consumption of powered CEF components 402 is low. The stored energy can be discharged from battery unit 302 when the power consumption of powered CEF components 402 is high in order to reduce the peak power draw $P_{grid}$ from energy grid 414, thereby decreasing the demand charge incurred.

The final term of the predictive cost function J represents the cost savings resulting from the use of battery unit 302. Unlike the previous terms in the cost function J, the final term subtracts from the total cost. The values of the parameter $C_{ec}(k)$ at each time step k can be defined by the energy cost information provided by electric utility 418. In some embodiments, the cost of electricity varies as a function of time, which results in different values of $C_{ec}(k)$ at different time steps k. The variable $P_{bat}(k)$ is a decision variable which can be optimized by economic controller 510. A positive value of $P_{bat}(k)$ indicates that battery unit 302 is discharging, whereas a negative value of $P_{bat}(k)$ indicates that battery unit 302 is charging. The power discharged from battery unit 302 $P_{bat}(k)$ can be used to satisfy some or all of the total power consumption $P_{total}(k)$ of powered CEF components 402, which reduces the amount of power $P_{grid}(k)$ purchased from energy grid 414 (i.e., $P_{grid}(k)=P_{total}(k)-P_{bat}(k)-P_{PV}(k)$). However, charging battery unit 302 results in a negative value of $P_{bat}(k)$ which adds to the total amount of power $P_{grid}(k)$ purchased from energy grid 414.

In some embodiments, the power $P_{PV}$ provided by PV panels 308 is not included in the predictive cost function J because generating PV power does not incur a cost. However, the power $P_{PV}$ generated by PV panels 308 can be used to satisfy some or all of the total power consumption $P_{total}(k)$ of powered CEF components 402, which reduces the amount of power $P_{grid}(k)$ purchased from energy grid 414 (i.e., $P_{grid}(k)=P_{total}(k)-P_{bat}(k)-P_{PV}(k)$). The amount of PV power $P_{PV}$ generated during any time step k can be predicted by economic controller 510. Several techniques for predicting the amount of PV power generated by PV panels are described in U.S. patent application Ser. No. 15/247,869, U.S. patent application Ser. No. 15/247,844, and U.S. patent application Ser. No. 15/247,788. Each of these patent applications has a filing date of Aug. 25, 2016, and the entire disclosure of each of these patent applications is incorporated by reference herein.

Economic controller 510 can optimize the predictive cost function J over the duration of the optimization period to determine optimal values of the decision variables at each time step during the optimization period. In some embodiments, the optimization period has a duration of approximately one day and each time step is approximately fifteen minutes. However, the durations of the optimization period and the time steps can vary in other embodiments and can be adjusted by a user. Advantageously, economic controller 510 can use battery unit 302 to perform load shifting by drawing electricity from energy grid 414 when energy prices are low and/or when the power consumed by powered CEF components 402 is low. The electricity can be stored in battery unit 302 and discharged later when energy prices are high and/or the power consumption of powered CEF components 402 is high. This enables economic controller 510 to reduce the cost of electricity consumed by CEF 300 and can smooth momentary spikes in the electric demand of CEF 300, thereby reducing the demand charge incurred.

Economic controller 510 can be configured to impose constraints on the optimization of the predictive cost function J. In some embodiments, the constraints include constraints on the temperature $T_{zone}$ of a building zone served by CEF 300. Economic controller 510 can be configured to maintain the actual or predicted temperature $T_{zone}$, between an minimum temperature bound $T_{zone}$ and a maximum temperature bound $T_{max}$ (i.e., $T_{min} \leq T_{zone}$, $\leq T_{max}$) at all times. The parameters $T_{min}$ and $T_{max}$ may be time-varying to define different temperature ranges at different times (e.g., an occupied temperature range, an unoccupied temperature range, a daytime temperature range, a nighttime temperature range, etc.).

In order to ensure that the zone temperature constraint is satisfied, economic controller 510 can model the temperature $T_{zone}$ of the building zone as a function of the decision variables optimized by economic controller 510. In some embodiments, economic controller 510 models the temperature of the building zone using a heat transfer model. For example, the dynamics of heating or cooling the building zone can be described by the energy balance:

$$C\frac{dT_{zone}}{dt} = -H(T_{zone} - T_a) + \dot{Q}_{HVAC} + \dot{Q}_{other}$$

where C is the thermal capacitance of the building zone, H is the ambient heat transfer coefficient for the building zone, $T_{zone}$ is the temperature of the building zone, $T_a$ is the ambient temperature outside the building zone (e.g., the outside air temperature), $\dot{Q}_{HVAC}$ is the amount of heating applied to the building zone by CEF 300, and $\dot{Q}_{other}$ is the external load, radiation, or other disturbance experienced by the building zone. In the previous equation, $\dot{Q}_{HVAC}$ represents heat transfer into the building zone by CEF 300 (i.e., the heating load) and therefore has a positive sign. However, if cooling is applied to the building zone rather than heating, the sign on $\dot{Q}_{HVAC}$ can be switched to a negative sign such that $\dot{Q}_{HVAC}$ represents the amount of cooling applied to the building zone by CEF 300 (i.e., the cooling load). Several techniques for developing zone temperature models and relating the zone temperature $T_{zone}$ to the decision variables in the predictive cost function J are described in greater detail in U.S. Pat. No. 9,436,179 granted Sep. 6, 2016, U.S. patent application Ser. No. 14/694,633 filed Apr. 23, 2015, and U.S. patent application Ser. No. 15/199,910 filed Jun. 30, 2016. The entire disclosure of each of these patents and patent applications is incorporated by reference herein.

The previous energy balance combines all mass and air properties of the building zone into a single zone temperature. Other heat transfer models which can be used by economic controller 510 include the following air and mass zone models:

$$C_z\frac{dT_{zone}}{dt} = H_{az}(T_a - T_{zone}) + H_{mz}(T_m - T_{zone}) + \dot{Q}_{HVAC} + \dot{Q}_{other}$$

$$C_m\frac{dT_m}{dt} = H_{mz}(T_{zone} - T_m)$$

where $C_z$ and $T_{zone}$ are the thermal capacitance and temperature of the air in the building zone, $T_a$ is the ambient air temperature, $H_{az}$ is the heat transfer coefficient between the air of the building zone and ambient air outside the building zone (e.g., through external walls of the building zone), $C_m$ and $T_m$ are the thermal capacitance and temperature of the non-air mass within the building zone, and $H_{mz}$ is the heat transfer coefficient between the air of the building zone and the non-air mass.

The previous equation combines all mass properties of the building zone into a single zone mass. Other heat transfer models which can be used by economic controller 510 include the following air, shallow mass, and deep mass zone models:

$$C_z\frac{dT_{zone}}{dt} = H_{az}(T_a - T_{zone}) + H_{sz}(T_s - T_{zone}) + \dot{Q}_{HVAC} + \dot{Q}_{other}$$

$$C_s\frac{dT_s}{dt} = H_{sz}(T_{zone} - T_s) + H_{ds}(T_d - T_s)$$

$$C_d\frac{dT_d}{dt} = H_{ds}(T_s - T_d)$$

where $C_z$ and $T_{zone}$ are the thermal capacitance and temperature of the air in the building zone, $T_a$ is the ambient air temperature, $H_{az}$ is the heat transfer coefficient between the air of the building zone and ambient air outside the building zone (e.g., through external walls of the building zone), $C_s$ and $T_s$ are the thermal capacitance and temperature of the shallow mass within the building zone, $H_{sz}$ is the heat transfer coefficient between the air of the building zone and the shallow mass, $C_d$ and $T_d$ are the thermal capacitance and temperature of the deep mass within the building zone, and $H_{ds}$ is the heat transfer coefficient between the shallow mass and the deep mass.

In some embodiments, economic controller 510 uses the weather forecasts from weather service 416 to determine appropriate values for the ambient air temperature $T_a$ and/or the external disturbance $\dot{Q}_{other}$ at each time step of the optimization period. Values of C and H can be specified as parameters of the building zone, received from tracking controller 512, received from a user, retrieved from memory 508, or otherwise provided as an input to economic controller 510. Accordingly, the temperature of the building zone $T_{zone}$ can be defined as a function of the amount of heating or cooling $\dot{Q}_{HVAC}$ applied to the building zone by CEF 300 using any of these heat transfer models. The manipulated variable $\dot{Q}_{HVAC}$ can be adjusted by economic controller 510 by adjusting the variables $P_{chiller}$, $P_{HRC}$, $P_{gas}$ and/or $P_{total}$ in the predictive cost function J.

In some embodiments, economic controller 510 uses a model that defines the amount of heating or cooling $\dot{Q}_{HVAC}$ applied to the building zone by CEF 300 as a function of the power setpoints $P_{sp,bat}$ and $P_{sp,grid}$ provided by economic controller 510. For example, economic controller 510 can add the power setpoints $P_{sp,bat}$ and $P_{sp,grid}$ to determine the total amount of power $P_{total}$ that will be consumed by powered CEF components 402. Economic controller 510 can use $P_{total}$ to determine the total amount of heating or cooling ($\dot{Q}_{HVAC}$ applied to the building zone by CEF 300.

In some embodiments, economic controller 510 uses one or more models that define the amount of heating or cooling applied to the building zone by CEF 300 (i.e., $\dot{Q}_{HVAC}$) as a function of the zone temperature $T_{zone}$ and the zone temperature setpoint $T_{sp,zone}$ as shown in the following equation:

$$\dot{Q}_{HVAC} = f(T_{zone}, T_{sp,zone})$$

The models used by economic controller 510 can be imposed as optimization constraints to ensure that the amount of heating or cooling $\dot{Q}_{HVAC}$ provided by CEF 300 is not reduced to a value that would cause the zone temperature $T_{zone}$ to deviate from an acceptable or comfortable temperature range.

In some embodiments, economic controller 510 relates the amount of heating or cooling $\dot{Q}_{HVAC}$ provided by CEF 300 to the zone temperature $T_{zone}$ and the zone temperature setpoint $T_{sp,zone}$ using multiple models. For example, economic controller 510 can use a model of equipment controller 514 to determine the control action performed by equipment controller 514 as a function of the zone temperature $T_{zone}$ and the zone temperature setpoint $T_{sp,zone}$. An example of such a zone regulatory controller model is shown in the following equation:

$$v_{air} = f_1(T_{zone}, T_{sp,zone})$$

where $v_{air}$ is the rate of airflow to the building zone (i.e., the control action). The function $f_1$ can be identified from data. For example, economic controller 510 can collect measurements of $v_{air}$ and $T_{zone}$ and identify the corresponding value of $T_{sp,zone}$. Economic controller 510 can perform a system identification process using the collected values of $v_{air}$, $T_{zone}$, and $T_{sp,zone}$ as training data to determine the function $f_1$ that defines the relationship between such variables.

Economic controller 510 can use an energy balance model relating the control action $v_{air}$ to the amount of heating or cooling $\dot{Q}_{HVAC}$ provided by CEF 300 as shown in the following equation:

$$\dot{Q}_{HVAC} = f_2(v_{air})$$

where the function $f_2$ can be identified from training data. Economic controller 510 can perform a system identification process using collected values of $v_{air}$ and $\dot{Q}_{HVAC}$ to determine the function $f_2$ that defines the relationship between such variables.

In some embodiments, a linear relationship exists between $\dot{Q}_{HVAC}$ and $v_{air}$. Assuming an ideal proportional-integral (PI) controller and a linear relationship between $\dot{Q}_{HVAC}$ and $V_{air}$, a simplified linear controller model can be used to define the amount of heating or cooling $\dot{Q}_{HVAC}$ provided by CEF 300 as a function of the zone temperature $T_{zone}$ and the zone temperature setpoint $T_{sp,zone}$. An example of such a model is shown in the following equations:

$$\dot{Q}_{HVAC} = \dot{Q}_{ss} + K_c \left[ \varepsilon + \frac{1}{\tau_I} \int_0^t \varepsilon(t') dt' \right]$$

$$\varepsilon = T_{sp,zone} - T_{zone}$$

where $\dot{Q}_{ss}$ is the steady-state rate of heating or cooling rate, $K_c$ is the scaled zone PI controller proportional gain, $\tau_I$ is the zone PI controller integral time, and $\varepsilon$ is the setpoint error (i.e., the difference between the zone temperature setpoint $T_{sp,zone}$ and the zone temperature $T_{zone}$). Saturation can be represented by constraints on $\dot{Q}_{HVAC}$. If a linear model is not sufficiently accurate to model equipment controller 514 and heat transfer in CEF 300, a nonlinear heating/cooling duty model can be used instead.

In addition to constraints on the zone temperature $T_{zone}$, economic controller 510 can impose constraints on the state-of-charge (SOC) and charge/discharge rates of battery unit 302. In some embodiments, economic controller 510 generates and imposes the following power constraints on the predictive cost function J:

$$P_{bat} \leq P_{rated}$$

$$-P_{bat} \leq P_{rated}$$

where $P_{bat}$ is the amount of power discharged from battery unit 302 and $P_{rated}$ is the rated battery power of battery unit 302 (e.g., the maximum rate at which battery unit 302 can be charged or discharged). These power constraints ensure that battery unit 302 is not charged or discharged at a rate that exceeds the maximum possible battery charge/discharge rate $P_{rated}$.

In some embodiments, economic controller 510 generates and imposes one or more capacity constraints on the predictive cost function J The capacity constraints may be used to relate the battery power $P_{bat}$ charged or discharged during each time step to the capacity and SOC of battery unit 302. The capacity constraints may ensure that the capacity of battery unit 302 is maintained within acceptable lower and upper bounds at each time step of the optimization period. In some embodiments, economic controller 510 generates the following capacity constraints:

$$C_a(k) - P_{bat}(k)\Delta t \leq C_{rated}$$

$$C_a(k) - P_{bat}(k)\Delta t \geq 0$$

where $C_a(k)$ is the available battery capacity (e.g., kWh) at the beginning of time step k, $P_{bat}(k)$ is the rate at which battery unit 302 is discharged during time step k (e.g., kW), $\Delta t$ is the duration of each time step, and $C_{rated}$ is the maximum rated capacity of battery unit 302 (e.g., kWh). The term $P_{bat}(k)\Delta t$ represents the change in battery capacity during time step k. These capacity constraints ensure that the capacity of battery unit 302 is maintained between zero and the maximum rated capacity $C_{rated}$.

In some embodiments, economic controller 510 generates and imposes one or more capacity constraints on the operation of powered CEF components 402. For example, powered CEF components 402 may have a maximum operating point (e.g., a maximum pump speed, a maximum cooling capacity, etc.) which corresponds to a maximum power consumption $P_{total,max}$. Economic controller 510 can be configured to generate a constraint which limits the power $P_{total}$ provided to powered CEF components 402 between zero and the maximum power consumption $P_{total,max}$ as shown in the following equation:

$$0 \leq P_{total} \leq P_{total,max}$$

$$P_{total} = P_{sp,grid} + P_{sp,bat}$$

where the total power $P_{total}$ provided to powered CEF components 402 is the sum of the grid power setpoint $P_{sp,grid}$ and the battery power setpoint $P_{sp,bat}$.

In some embodiments, economic controller 510 generates and imposes one or more capacity constraints on the operation of the one or more subplants of CEF 300. For example, heating may be provided by heater subplant 202 and cooling may be provided by chiller subplant 206. The operation of heater subplant 202 and chiller subplant 206 may be defined by subplant curves for each of heater subplant 202 and chiller subplant 206. Each subplant curve may define the resource production of the subplant (e.g., tons refrigeration, kW heating, etc.) as a function of one or more resources consumed by the subplant (e.g., electricity, natural gas, water, etc.). Several examples of subplant curves which can be used by economic controller 510 are described in greater detail in U.S. patent application Ser. No. 14/634,609 filed Feb. 27, 2015.

Economic controller 510 can be configured to use the subplant curves to identify a maximum amount of heating that can be provided by heater subplant 202 and a maximum amount of cooling that can be provided by chiller subplant 206. Economic controller 510 can generate and impose a constraint that limits the amount of heating provided by heater subplant 202 between zero and the maximum amount of heating. Similarly, economic controller 510 can generate and impose a constraint that limits the amount of cooling provided by chiller subplant 206 between zero and the maximum amount of cooling.

Economic controller 510 can optimize the predictive cost function J subject to the constraints to determine optimal values for the decision variables $P_{total}$, $P_{chiller}$, $P_{HRC}$, $P_{gas}$, $P_{grid}$, and $P_{bat}$, where $P_{total}=P_{bat}+P_{grid}+P_{PV}$. In some embodiments, economic controller 510 uses the optimal values for $P_{total}$, $P_{bat}$, and/or $P_{grid}$ to generate power setpoints for tracking controller 512. The power setpoints can include battery power setpoints $P_{sp,bat}$, grid power setpoints $P_{sp,grid}$, and/or CEF power setpoints $P_{sp,total}$ for each of the time steps k in the optimization period. Economic controller 510 can provide the power setpoints to tracking controller 512.

Tracking Controller

Tracking controller 512 can use the optimal power setpoints $P_{sp,grid}$, $P_{sp,bat}$, and/or $P_{sp,total}$ generated by economic controller 510 to determine optimal temperature setpoints (e.g., a zone temperature setpoint $T_{sp,zone}$, a chilled water temperature setpoint $T_{sp,chw}$, etc.) and an optimal battery charge or discharge rate (i.e., $Bat_{C/D}$). In some embodiments, tracking controller 512 generates a zone temperature setpoint $T_{sp,zone}$ and/or a chilled water temperature setpoint $T_{sp,chw}$ that are predicted to achieve the power setpoint $P_{sp,total}$ for CEF 300. In other words, tracking controller 512 may generate a zone temperature setpoint $T_{sp,zone}$ and/or a chilled water temperature setpoint $T_{sp,chw}$ that cause CEF 300 to consume the optimal amount of power $P_{total}$ determined by economic controller 510.

In some embodiments, tracking controller 512 relates the power consumption of CEF 300 to the zone temperature $T_{zone}$ and the zone temperature setpoint $T_{sp,zone}$ using a power consumption model. For example, tracking controller 512 can use a model of equipment controller 514 to determine the control action performed by equipment controller 514 as a function of the zone temperature $T_{zone}$ and the zone temperature setpoint $T_{sp,zone}$. An example of such a zone regulatory controller model is shown in the following equation:

$$v_{air} = f_3(T_{zone}, T_{sp,zone})$$

where $v_{air}$ is the rate of airflow to the building zone (i.e., the control action).

Tracking controller 512 can define the power consumption $P_{total}$ of CEF 300 as a function of the zone temperature $T_{zone}$ and the zone temperature setpoint $T_{sp,zone}$. An example of such a model is shown in the following equation:

$$P_{total} = f_4(T_{zone}, T_{sp,zone})$$

The function $f_4$ can be identified from data. For example, tracking controller 512 can collect measurements of $P_{total}$ and $T_{zone}$ and identify the corresponding value of $T_{sp,zone}$. Tracking controller 512 can perform a system identification process using the collected values of $P_{total}$, $T_{zone}$, and $T_{sp,zone}$ as training data to determine the function $f_4$ that defines the relationship between such variables.

Tracking controller 512 may use a similar model to determine the relationship between the total power consumption $P_{total}$ of CEF 300 and the chilled water temperature setpoint $T_{sp,chw}$. For example, tracking controller 512 can define the power consumption $P_{total}$ of CEF 300 as a function of the zone temperature $T_{zone}$ and the chilled water temperature setpoint $T_{sp,chw}$. An example of such a model is shown in the following equation:

$$P_{total} = f_5(T_{zone}, T_{sp,chw})$$

The function $f_s$ can be identified from data. For example, tracking controller 512 can collect measurements of $P_{total}$ and $T_{zone}$ and identify the corresponding value of $T_{sp,chw}$. Tracking controller 512 can perform a system identification process using the collected values of $P_{total}$, $T_{zone}$, and $T_{sp,chw}$ as training data to determine the function $f_s$ that defines the relationship between such variables.

Tracking controller 512 can use the relationships between $P_{total}$, $T_{sp,zone}$, and $T_{sp,chw}$ to determine values for $T_{sp,zone}$ and $T_{sp,chw}$. For example, tracking controller 512 can receive the value of $P_{total}$ as an input from economic controller 510 (i.e., $P_{sp,total}$) and can use determine corresponding values of $T_{sp,zone}$ and $T_{sp,chw}$. Tracking controller 512 can provide the values of $T_{sp,zone}$ and $T_{sp,chw}$ as outputs to equipment controller 514.

In some embodiments, tracking controller 512 uses the battery power setpoint $P_{sp,bat}$ to determine the optimal rate $Bat_{C/D}$ at which to charge or discharge battery unit 302. For example, the battery power setpoint $P_{sp,bat}$ may define a power value (kW) which can be translated by tracking controller 512 into a control signal for power inverter 410 and/or equipment controller 514. In other embodiments, the battery power setpoint $P_{sp,bat}$ is provided directly to power inverter 410 and used by power inverter 410 to control the battery power $P_{bat}$.

Equipment Controller

Equipment controller 514 can use the optimal temperature setpoints $T_{sp,zone}$ or $T_{sp,chw}$ generated by tracking controller 512 to generate control signals for powered CEF components 402. The control signals generated by equipment controller 514 may drive the actual (e.g., measured) temperatures $T_{zone}$ and/or $T_{chw}$ to the setpoints. Equipment controller 514 can use any of a variety of control techniques to generate control signals for powered CEF components 402. For example, equipment controller 514 can use state-based algorithms, extremum seeking control (ESC) algorithms, proportional-integral (PI) control algorithms, proportional-integral-derivative (PID) control algorithms, model predictive control (MPC) algorithms, or other feedback control algorithms, to generate control signals for powered CEF components 402.

The control signals may include on/off commands, speed setpoints for fans of cooling towers 404, power setpoints for compressors of chillers 406, chilled water temperature setpoints for chillers 406, pressure setpoints or flow rate setpoints for pumps 408, or other types of setpoints for individual devices of powered CEF components 402. In other embodiments, the control signals may include the temperature setpoints (e.g., a zone temperature setpoint $T_{sp,zone}$, a chilled water temperature setpoint $T_{sp,chw}$, etc.) generated by predictive CEF controller 304. The temperature setpoints can be provided to powered CEF components 402 or local controllers for powered CEF components 402 which operate to achieve the temperature setpoints. For example, a local controller for chillers 406 may receive a measurement of the chilled water temperature $T_{chw}$ from chilled water temperature sensor and/or a measurement the zone temperature $T_{zone}$ from a zone temperature sensor.

In some embodiments, equipment controller 514 is configured to provide control signals to power inverter 410. The control signals provided to power inverter 410 can include a battery power setpoint $P_{sp,bat}$ and/or the optimal charge/discharge rate $Bat_{C/D}$. Equipment controller 514 can be configured to operate power inverter 410 to achieve the battery power setpoint $P_{sp,bat}$. For example, equipment controller 514 can cause power inverter 410 to charge battery unit 302 or discharge battery unit 302 in accordance with the battery power setpoint $P_{sp,bat}$.

Figure 6:
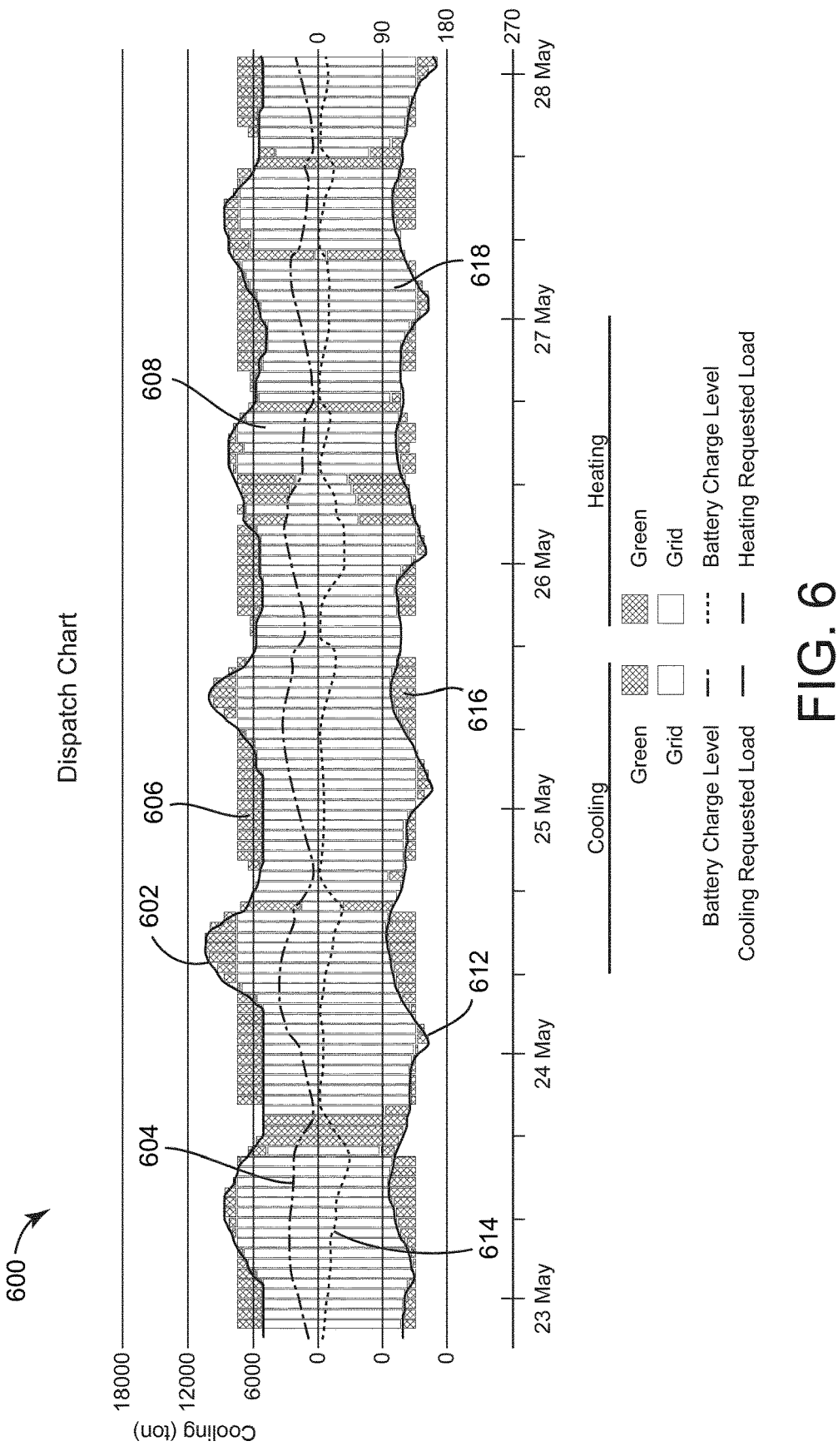
FIG. 6 is a graph of a user interface which can be generated by the predictive CEF controller of FIG. 3, according to some embodiments.

Referring now to FIG. 6, a user interface 600 which can be generated by predictive CEF controller 304 is shown, according to some embodiments. As discussed above, economic controller 510 can be configured to determine the portion of each power consumption value (e.g., $P_{chiller}$, $P_{HRC}$, etc.) that consists of grid power and/or battery power at each time step of the optimization period. User interface 600 can be used to convey to a user the relative portions of each power consumption value that consist of grid power and/or battery power.

Interface 600 illustrates a dispatch chart. The top half of the dispatch chart corresponds to cooling, whereas the bottom half of the dispatch chart corresponds to heating. The midline between the top and bottom halves corresponds to zero load/power for both halves. Positive cooling values are shown as displacement above the midline, whereas positive heating values are shown as displacement below the midline. Lines 602 and 612 represent the requested cooling load and the requested heating load, respectively, at each time step of the optimization period. Lines 604 and 614 represent the charge level of batteries used to power the cooling equipment (e.g., a chiller subplant) and the heating equipment (e.g., a heater subplant) over the duration of the optimization period.

As discussed above, economic controller 510 can be configured to determine optimal power setpoints for each time step of the optimization period. The results of the optimization performed by economic controller 510 can be represented in the dispatch chart. For example, the dispatch chart is shown to include a vertical column for each time step of the optimization period. Each column may include one or more bars representing the power setpoints determined by economic controller 510 for the corresponding time step. The color of each bar indicates the type of power setpoint. For example, gray bars 608 and 618 (shown as white bars in FIG. 6) may indicate the grid power setpoint (e.g., $P_{sp,grid}$) whereas green bars 606 and 616 (shown as shaded bars in FIG. 6) may indicate the battery power setpoint (e.g., $P_{sp,bat}$). The height of each bar indicates the magnitude of the corresponding power setpoint at that time step.

Green bars 606 positioned above requested cooling line 602 indicate that the cooling equipment battery is charging (i.e., excess energy used to charge the battery), whereas green bars 606 positioned below requested cooling line 602 indicate that the cooling equipment battery is discharging (i.e., battery power used to satisfy part of the requested cooling load). The charge level of the cooling equipment battery increases when the cooling equipment battery is charging and decreases when the cooling equipment battery is discharging.

Similarly, green bars 616 positioned below requested heating line 612 indicate that the heating equipment battery is charging (i.e., excess energy used to charge the battery), whereas green bars 616 positioned above requested heating line 612 indicate that the heating equipment battery is discharging (i.e., battery power used to satisfy part of the requested heating load). The charge level of the heating equipment battery increases when the heating equipment battery is charging and decreases when the heating equipment battery is discharging.

Air Cooled Chiller with Battery Unit and Predictive Control

Figure 7:
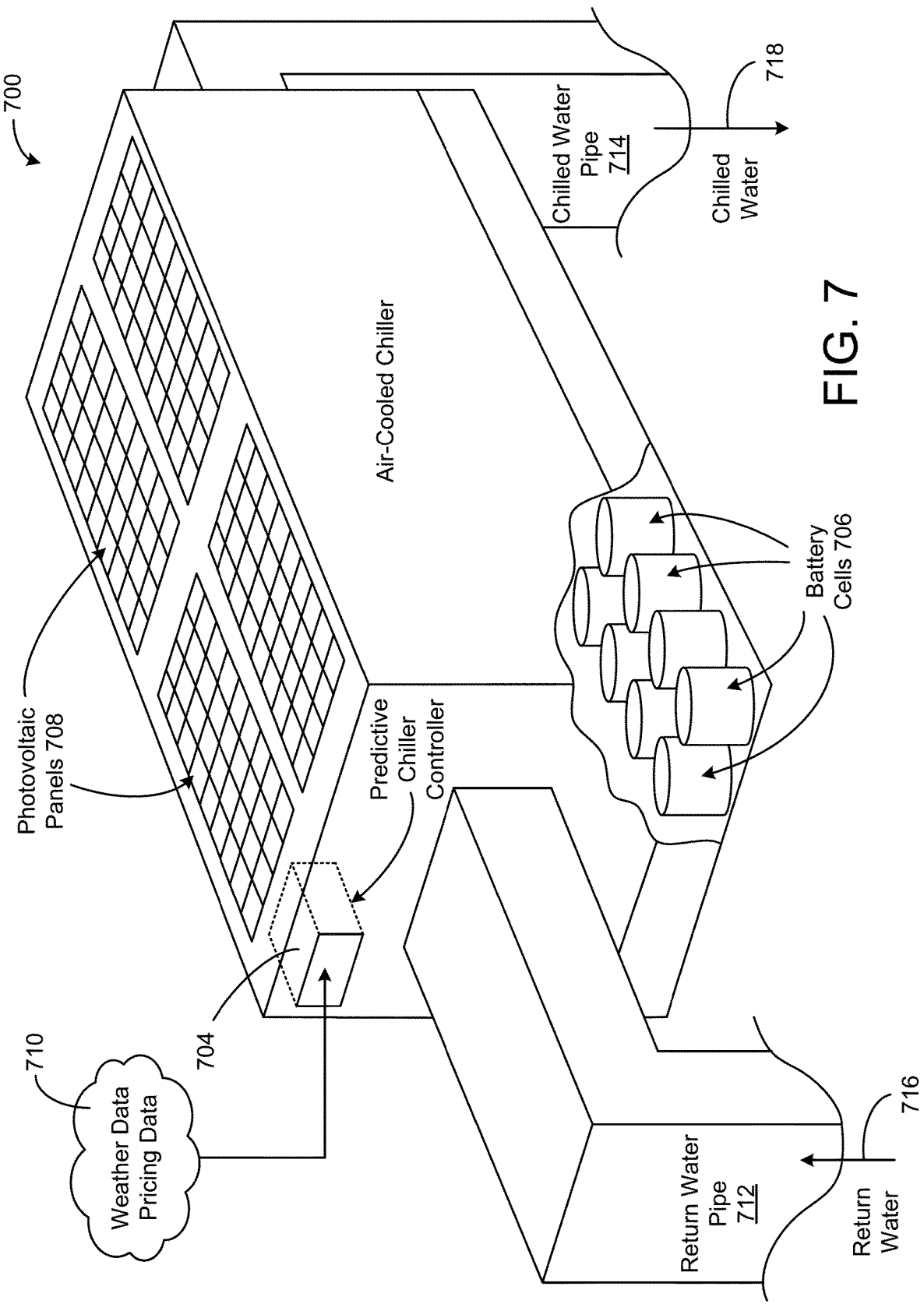
FIG. 7 is a drawing of an air-cooled chiller unit with a battery unit and a predictive chiller controller, according to some embodiments.
Figure 8:
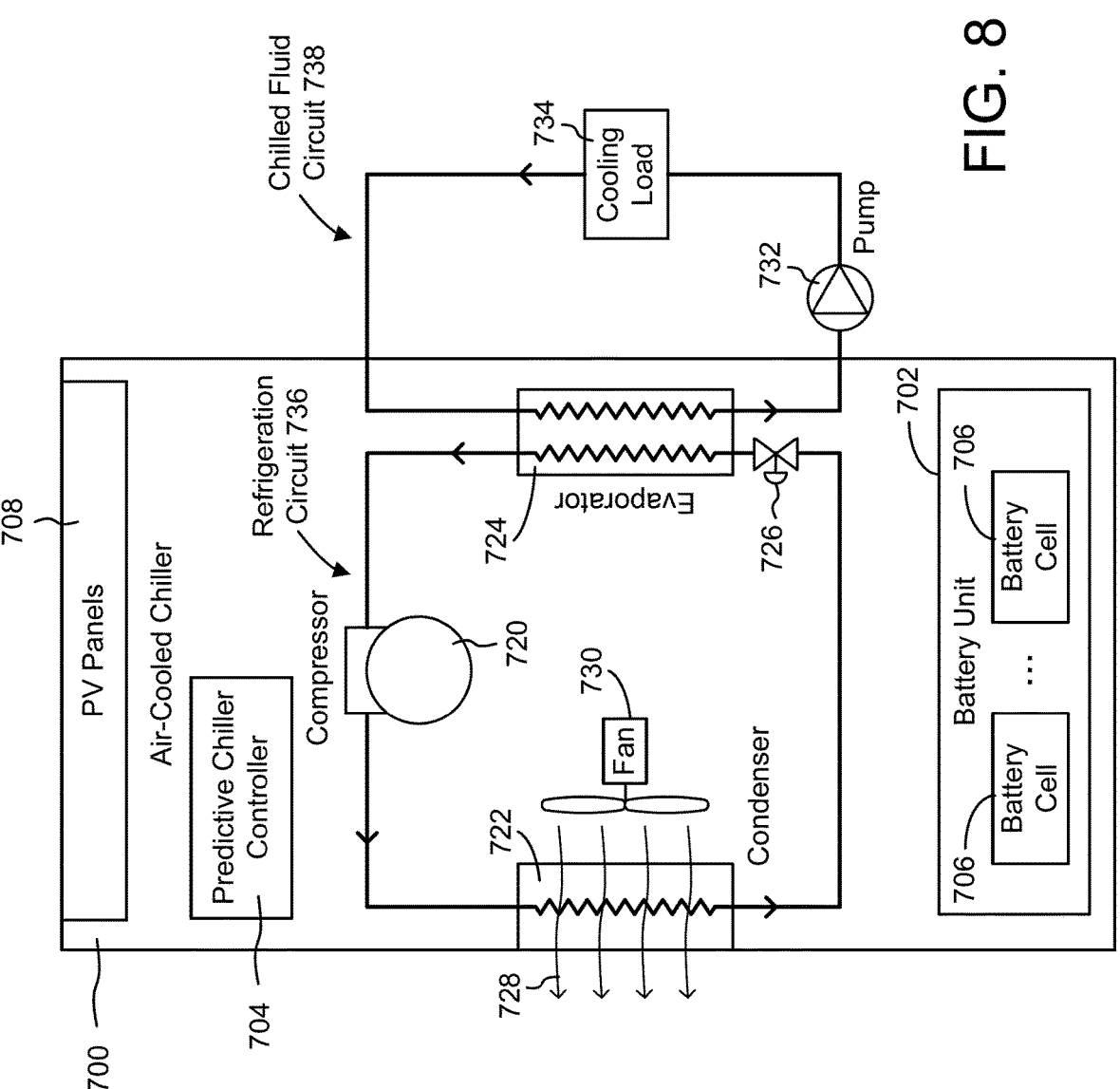
FIG. 8 is a block diagram of the air-cooled chiller unit of FIG. 7, according to some embodiments.

Referring now to FIGS. 7-8, an air-cooled chiller 700 with a battery unit 702 and predictive chiller controller 704 is shown, according to some embodiments. Chiller 700 can be configured to provide a chilled fluid (e.g., chilled water 718) to a cooling load 734 via chilled water pipe 714. Cooling load 734 can include, for example, a building zone, a supply airstream flowing through an air duct, an airflow in an air handling unit or rooftop unit, fluid flowing through a heat exchanger, a refrigerator or freezer, a condenser or evaporator, a cooling coil, or any other type of system, device, or space which requires cooling. In some embodiments, a pump 732 circulates a chilled fluid to cooling load 734 via a chilled fluid circuit 738. The chilled fluid can absorb heat from cooling load 734, thereby providing cooling to cooling load 734 and warming the chilled fluid. The warmed fluid (shown in FIG. 7 as return water 716) may return to chiller 700 via return water pipe 712.

Chiller 700 is shown to include a condenser 722, a compressor 720, an evaporator 724, an expansion device 726, and a fan 730. Compressor 720 can be configured to circulate a refrigerant between condenser 722 and evaporator 724 via refrigeration circuit 736. Compressor 720 operates to compress the refrigerant to a high pressure, high temperature state. The compressed refrigerant flows through condenser 722, which transfers heat from the refrigerant in refrigeration circuit 736 to an airflow 728. A fan 730 can be used to force airflow 728 through or over condenser 722 to provide cooling for the refrigerant in condenser 722. The cooled refrigerant then flows through expansion device 726, which expands the refrigerant to a low temperature, low pressure state. The expanded refrigerant flows through evaporator 724, which transfers heat from the chilled fluid in chilled fluid circuit 738 to the refrigerant in refrigeration circuit 736.

In some embodiments, chiller 700 includes one or more photovoltaic (PV) panels 708. PV panels 708 may include a collection of photovoltaic cells. The photovoltaic cells are configured to convert solar energy (i.e., sunlight) into electricity using a photovoltaic material such as monocrystalline silicon, polycrystalline silicon, amorphous silicon, cadmium telluride, copper indium gallium selenide/sulfide, or other materials that exhibit the photovoltaic effect. In some embodiments, the photovoltaic cells are contained within packaged assemblies that form PV panels 708. Each PV panel 708 may include a plurality of linked photovoltaic cells. PV panels 708 may combine to form a photovoltaic array.

In some embodiments, PV panels 708 are configured to maximize solar energy collection. For example, chiller 700 may include a solar tracker (e.g., a GPS tracker, a sunlight sensor, etc.) that adjusts the angle of PV panels 708 so that PV panels 708 are aimed directly at the sun throughout the day. The solar tracker may allow PV panels 708 to receive direct sunlight for a greater portion of the day and may increase the total amount of power produced by PV panels 708. In some embodiments, chiller 700 includes a collection of mirrors, lenses, or solar concentrators configured to direct and/or concentrate sunlight on PV panels 708. The energy generated by PV panels 708 may be stored in battery unit 702 and/or used to power various components of chiller 700.

In some embodiments, battery unit 702 includes one or more battery cells 706. Battery cells 706 are configured to store and discharge electric energy (i.e., electricity). In some embodiments, battery unit 702 is charged using electricity from an external energy grid (e.g., provided by an electric utility). The electricity stored in battery unit 702 can be discharged to power one or more powered components of chiller 700 (e.g., fan 730, compressor 720, pump 732, etc.). Advantageously, battery unit 702 allows chiller 700 to draw electricity from the energy grid and charge battery unit 702 when energy prices are low and discharge the stored electricity when energy prices are high to time-shift the electric load of chiller 700. In some embodiments, battery unit 702 has sufficient energy capacity to power chiller 700 for approximately 4-6 hours when operating at maximum capacity such that battery unit 702 can be utilized during high energy cost periods and charged during low energy cost periods.

In some embodiments, predictive chiller controller 704 performs an optimization process to determine whether to charge or discharge battery unit 702 during each of a plurality of time steps that occur during an optimization period. Predictive chiller controller 704 may use weather and pricing data 710 to predict the amount of heating/cooling required and the cost of electricity during each of the plurality of time steps. Predictive chiller controller 704 can optimize an objective function that accounts for the cost of electricity purchased from the energy grid over the duration of the optimization period. Predictive chiller controller 704 can determine an amount of electricity to purchase from the energy grid and an amount of electricity to store or discharge from battery unit 702 during each time step. The objective function and the optimization performed by predictive chiller controller 704 are described in greater detail with reference to FIGS. 9-10.

Predictive Chiller Control System

Figure 9:
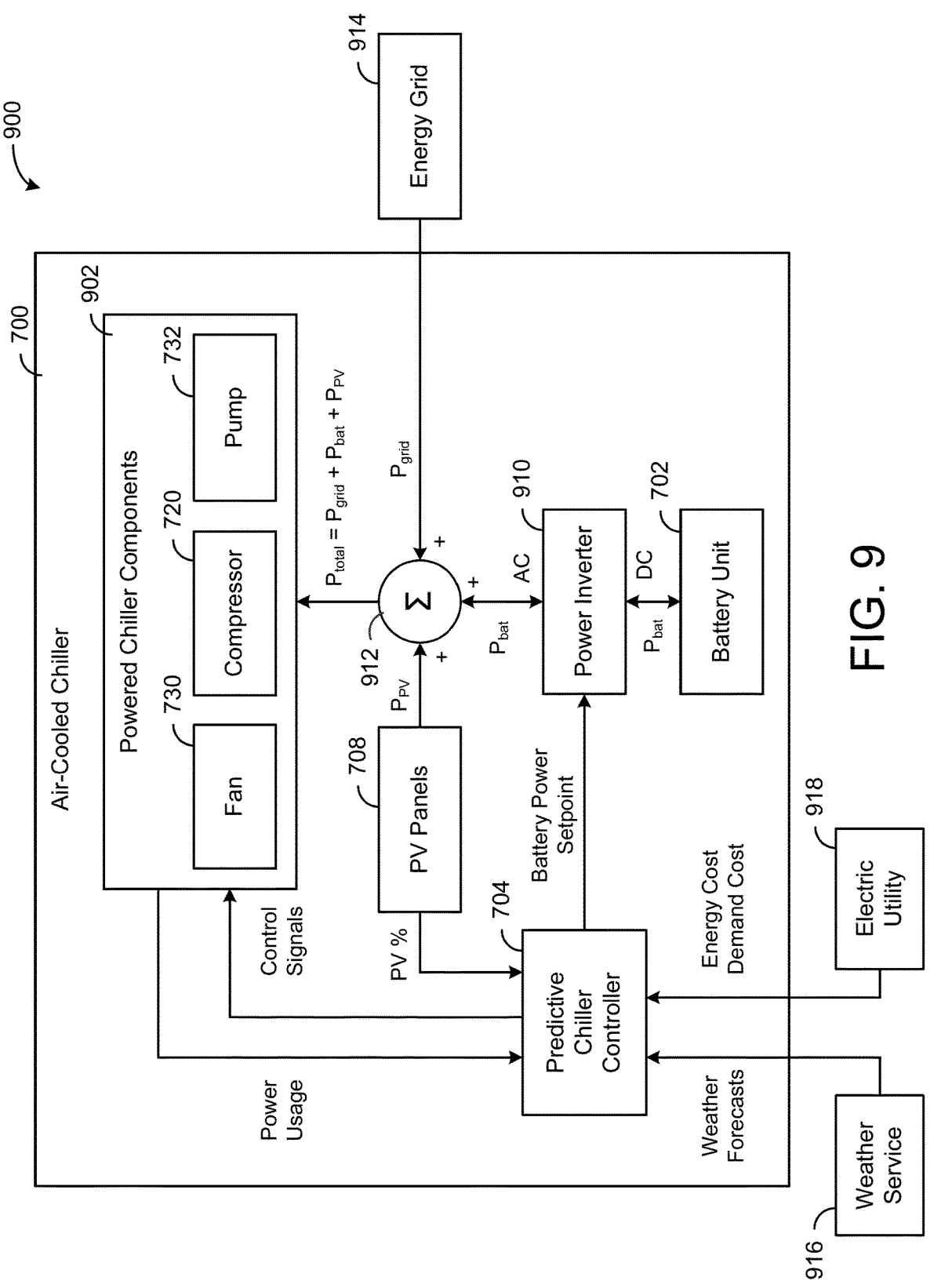
FIG. 9 is a block diagram of a predictive chiller control system including the battery unit and predictive chiller controller of FIG. 7, according to some embodiments.

Referring now to FIG. 9, a block diagram of a predictive chiller control system 900 is shown, according to some embodiments. Several of the components shown in control system 900 may be part of chiller 700. For example, chiller 700 may include powered chiller components 902, battery unit 702, predictive chiller controller 704, power inverter 910, and a power junction 912. Powered chiller components 902 may include any component of chiller 700 that consumes power (e.g., electricity) during operation. For example, powered chiller components 902 are shown to include cooling fan 730, compressor 720, and pump 732.

Power inverter 910 may be configured to convert electric power between direct current (DC) and alternating current (AC). For example, battery unit 702 may be configured to store and output DC power, whereas energy grid 914 and powered chiller components 902 may be configured to consume and provide AC power. Power inverter 910 may be used to convert DC power from battery unit 702 into a sinusoidal AC output synchronized to the grid frequency of energy grid 914 and/or powered chiller components 902. Power inverter 910 may also be used to convert AC power from energy grid 914 into DC power that can be stored in battery unit 702. The power output of battery unit 702 is shown as $P_{bat}$. $P_{bat}$ may be positive if battery unit 702 is providing power to power inverter 910 (i.e., battery unit 702 is discharging) or negative if battery unit 702 is receiving power from power inverter 910 (i.e., battery unit 702 is charging).

In some instances, power inverter 910 receives a DC power output from battery unit 702 and converts the DC power output to an AC power output that can be provided to powered chiller components 902. Power inverter 910 may synchronize the frequency of the AC power output with that of energy grid 914 (e.g., 50 Hz or 60 Hz) using a local oscillator and may limit the voltage of the AC power output to no higher than the grid voltage. In some embodiments, power inverter 910 is a resonant inverter that includes or uses LC circuits to remove the harmonics from a simple square wave in order to achieve a sine wave matching the frequency of energy grid 914. In various embodiments, power inverter 910 may operate using high-frequency transformers, low-frequency transformers, or without transformers. Low-frequency transformers may convert the DC output from battery unit 702 directly to the AC output provided to powered chiller components 902. High-frequency transformers may employ a multi-step process that involves converting the DC output to high-frequency AC, then back to DC, and then finally to the AC output provided to powered chiller components 902.

The power output of PV panels 708 is shown as $P_{PV}$. The power output $P_{PV}$ of PV panels 708 can be stored in battery unit 702 and/or used to power powered chiller components 902. In some embodiments, PV panels 708 measure the amount of power $P_{PV}$ generated by PV panels 708 and provides an indication of the PV power to predictive chiller controller 704. For example, PV panels 708 are shown providing an indication of the PV power percentage (i.e., PV %) to predictive chiller controller 704. The PV power percentage may represent a percentage of the maximum PV power at which PV panels 708 are currently operating.

Power junction 912 is the point at which powered chiller components 902, energy grid 914, PV panels 708, and power inverter 910 are electrically connected. The power supplied to power junction 912 from power inverter 910 is shown as $P_{bat}$. $P_{bat}$ may be positive if power inverter 910 is providing power to power junction 912 (i.e., battery unit 702 is discharging) or negative if power inverter 910 is receiving power from power junction 912 (i.e., battery unit 702 is charging). The power supplied to power junction 912 from energy grid 914 is shown as $P_{grid}$ and the power supplied to power junction 912 from PV panels 708 is shown as $P_{PV}$. $P_{bat}$, $P_{PV}$, and $P_{grid}$ combine at power junction 912 to form $P_{total}$ (i.e. $P_{total}=P_{grid}+P_{bat}+P_{PV}$) $P_{total}$ may be defined as the power provided to powered chiller components 902 from power junction 912. In some instances, $P_{total}$ is greater than $P_{grid}$. For example, when battery unit 702 is discharging, $P_{bat}$ may be positive which adds to the grid power $P_{grid}$ and the PV power $P_{PV}$ when $P_{bat}$ and $P_{PV}$ combine with $P_{grid}$ to form $P_{total}$ In other instances, $P_{total}$ may be less than $P_{grid}$. For example, when battery unit 702 is charging, $P_{bat}$ may be negative which subtracts from the grid power $P_{grid}$ and the PV power $P_{PV}$ when $P_{bat}$, $P_{PV}$, and combine to form $P_{total}$.

Predictive chiller controller 704 can be configured to control powered chiller components 902 and power inverter 910. In some embodiments, predictive chiller controller 704 generates and provides a battery power setpoint $P_{sp,bat}$ to power inverter 910. The battery power setpoint $P_{sp,bat}$ may include a positive or negative power value (e.g., kW) which causes power inverter 910 to charge battery unit 702 (when $P_{sp,bat}$ is negative) using power available at power junction 912 or discharge battery unit 702 (when $P_{sp,bat}$ is positive) to provide power to power junction 912 in order to achieve the battery power setpoint $P_{sp,bat}$.

In some embodiments, predictive chiller controller 704 generates and provides control signals to powered chiller components 902. Predictive chiller controller 704 may use a multi-stage optimization technique to generate the control signals. For example, predictive chiller controller 704 may include an economic controller configured to determine the optimal amount of power to be consumed by powered chiller components 902 at each time step during the optimization period. The optimal amount of power to be consumed may minimize a cost function that accounts for the cost of energy consumed by chiller 700. The cost of energy may be based on time-varying energy prices from electric utility 918. In some embodiments, predictive chiller controller 704 determines an optimal amount of power to purchase from energy grid 914 (i.e., a grid power setpoint $P_{sp,grid}$) and an optimal amount of power to store or discharge from battery unit 702 (i.e., a battery power setpoint $P_{sp,bat}$) at each of the plurality of time steps. Predictive chiller controller 704 may monitor the actual power usage of powered chiller components 902 and may utilize the actual power usage as a feedback signal when generating the optimal power setpoints.

Predictive chiller controller 704 may include a tracking controller configured to generate temperature setpoints (e.g., an air temperature setpoint $T_{sp,air}$, a chilled water temperature setpoint $T_{sp,water}$, etc.) that achieve the optimal amount of power consumption at each time step. In some embodiments, predictive chiller controller 704 uses equipment models for powered chiller components 902 to determine an amount of heating or cooling that can be generated by chiller components 902 based on the optimal amount of power consumption. Predictive chiller controller 704 can use a temperature model to predict how the temperature of the chilled water $T_{water}$ will change based on the power setpoints.

In some embodiments, predictive chiller controller 704 uses the temperature setpoints to generate the control signals for powered chiller components 902. The control signals may include on/off commands, speed setpoints for fan 730, power setpoints for compressor 720, chilled water temperature setpoints chiller 700, pressure setpoints or flow rate setpoints for pump 732, or other types of setpoints for individual devices of powered chiller components 902. In other embodiments, the control signals may include the temperature setpoints (e.g., an air temperature setpoint $T_{sp,air}$, a chilled water temperature setpoint $T_{sp,water}$, etc.) generated by predictive chiller controller 704. The temperature setpoints can be provided to powered chiller components 902 or local controllers for powered chiller components 902 which operate to achieve the temperature setpoints. For example, a local controller for fan 730 may receive a measurement of the chilled water temperature $T_{water}$ from a chilled water temperature sensor and/or a measurement the air temperature $T_{air}$ (i.e., the temperature of airflow 728) from an air temperature sensor. The local controller can use a feedback control process (e.g., PID, ESC, MPC, etc.) to increase or decrease the airflow provided by fan 730 to drive the measured temperature(s) to the temperature setpoint(s). Similar feedback control processes can be used to compressor 720 and/or pump 732. The multi-stage optimization performed by predictive chiller controller 704 is described in greater detail with reference to FIG. 10.

Predictive Chiller Controller

Figure 10:
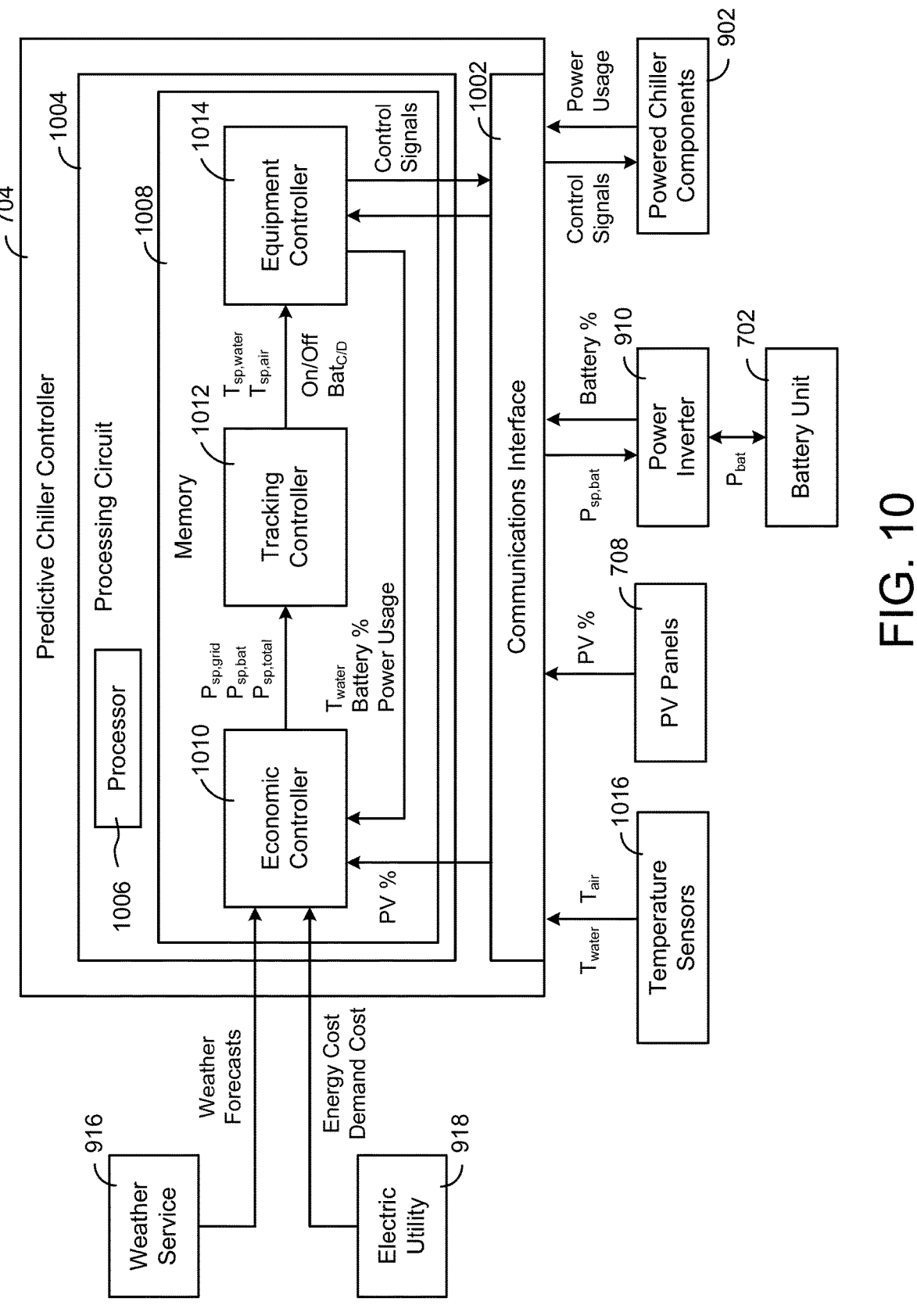
FIG. 10 is a block diagram illustrating the predictive chiller controller of FIG. 7 in greater detail, according to some embodiments.

Referring now to FIG. 10, a block diagram illustrating predictive chiller controller 704 in greater detail is shown, according to an exemplary embodiment. Predictive chiller controller 704 is shown to include a communications interface 1002 and a processing circuit 1004. Communications interface 1002 may facilitate communications between controller 704 and external systems or devices. For example, communications interface 1002 may receive measurements of the air temperature $T_{air}$ and the chilled water temperature $T_{water}$ from temperature sensors 1016 and measurements of the power usage of powered chiller components 902. In some embodiments, communications interface 1002 receives measurements of the state-of-charge (SOC) of battery unit 702, which can be provided as a percentage of the maximum battery capacity (i.e., battery %). Communications interface 1002 can receive weather forecasts from a weather service 916 and predicted energy costs and demand costs from an electric utility 918. In some embodiments, predictive chiller controller 704 uses communications interface 1002 to provide control signals powered chiller components 902 and power inverter 910.

Communications interface 1002 may include wired or wireless communications interfaces (e.g., jacks, antennas, transmitters, receivers, transceivers, wire terminals, etc.) for conducting data communications external systems or devices. In various embodiments, the communications may be direct (e.g., local wired or wireless communications) or via a communications network (e.g., a WAN, the Internet, a cellular network, etc.). For example, communications interface 1002 can include an Ethernet card and port for sending and receiving data via an Ethernet-based communications link or network. In another example, communications interface 1002 can include a Wi-Fi transceiver for communicating via a wireless communications network or cellular or mobile phone communications transceivers.

Processing circuit 1004 is shown to include a processor 1006 and memory 1008. Processor 1006 may be a general purpose or specific purpose processor, an application specific integrated circuit (ASIC), one or more field programmable gate arrays (FPGAs), a group of processing components, or other suitable processing components. Processor 1006 is configured to execute computer code or instructions stored in memory 1008 or received from other computer readable media (e.g., CDROM, network storage, a remote server, etc.).

Memory 1008 may include one or more devices (e.g., memory units, memory devices, storage devices, etc.) for storing data and/or computer code for completing and/or facilitating the various processes described in the present disclosure. Memory 1008 may include random access memory (RAM), read-only memory (ROM), hard drive storage, temporary storage, non-volatile memory, flash memory, optical memory, or any other suitable memory for storing software objects and/or computer instructions. Memory 1008 may include database components, object code components, script components, or any other type of information structure for supporting the various activities and information structures described in the present disclosure. Memory 1008 may be communicably connected to processor 1006 via processing circuit 1004 and may include computer code for executing (e.g., by processor 1006) one or more processes described herein. When processor 1006 executes instructions stored in memory 1008 for completing the various activities described herein, processor 1006 generally configures controller 704 (and more particularly processing circuit 1004) to complete such activities.

Still referring to FIG. 10, predictive chiller controller 704 is shown to include an economic controller 1010, a tracking controller 1012, and an equipment controller 1014. Controllers 1010-1014 can be configured to perform a multi-state optimization process to generate control signals for power inverter 910 and powered chiller components 902. In brief overview, economic controller 1010 can optimize a predictive cost function to determine an optimal amount of power to purchase from energy grid 914 (i.e., a grid power setpoint $P_{sp,grid}$), an optimal amount of power to store or discharge from battery unit 702 (i.e., a battery power setpoint $P_{sp,bat}$), and/or an optimal amount of power to be consumed by powered chiller components 902 (i.e., a chiller power setpoint $P_{sp,total}$) at each time step of an optimization period. Tracking controller 1012 can use the optimal power setpoints $P_{sp,grid}$, $P_{sp,bat}$, and/or $P_{sp,total}$ to determine optimal temperature setpoints (e.g., an air setpoint $T_{sp,air}$, a chilled water temperature setpoint $T_{sp,water}$, etc.) and an optimal battery charge or discharge rate (i.e., $Bat_{C/D}$). Equipment controller 1014 can use the optimal temperature setpoints $T_{sp,air}$ or $T_{sp,water}$ to generate control signals for powered chiller components 902 that drive the actual (e.g., measured) temperatures $T_{air}$ and/or $T_{water}$ to the setpoints (e.g., using a feedback control technique). Each of controllers 1010-1014 is described in detail below.

Economic Controller

Economic controller 1010 can be configured to optimize a predictive cost function to determine an optimal amount of power to purchase from energy grid 914 (i.e., a grid power setpoint $P_{sp,grid}$), an optimal amount of power to store or discharge from battery unit 702 (i.e., a battery power setpoint $P_{sp,bat}$), and/or an optimal amount of power to be consumed by powered chiller components 902 (i.e., a chiller power setpoint $P_{sp,total}$) at each time step of an optimization period. An example of a predictive cost function which can be optimized by economic controller 1010 is shown in the following equation:

$$\min(J) = \sum_{k=1}^{h} C_{ec}(k)P_{fan}(k)\Delta t + \sum_{k=1}^{h} C_{ec}(k)P_{comp}(k)\Delta t +$$
$$\sum_{k=1}^{h} C_{ec}(k)P_{pump}(k)\Delta t + C_{DC}\max_{k}(P_{grid}(k)) - \sum_{k=1}^{h} C_{ec}(k)P_{bat}(k)\Delta t$$

where $C_{ec}(k)$ is the cost per unit of electricity (e.g., $/kWh) purchased from electric utility 918 during time step k, $P_{fan}(k)$ is the power consumption (e.g., kW) of fan 730 during time step k, $P_{comp}(k)$ is the power consumption of compressor 720 at time step k, $P_{pump}(k)$ is the power consumption of pump 732 at time step k, $C_{DC}$ is the demand charge rate (e.g., $/kW), where the max( ) term selects the maximum electricity purchase of chiller 700 (i.e., the maximum value of $P_{grid}(k)$) during any time step k of the optimization period, $P_{bat}(k)$ is the amount of power discharged from battery unit 702 during time step k, and $\Delta t$ is the duration of each time step k. Economic controller 1010 can optimize the predictive cost function J over the duration of the optimization period (e.g., from time step k=1 to time step k=h) to predict the total cost of operating chiller 700 over the duration of the optimization period.

The first, second, and third terms of the predictive cost function J represent the cost of electricity consumed by powered chiller components 902 over the duration of the optimization period. The values of the parameter $C_{ec}(k)$ at each time step k can be defined by the energy cost information provided by electric utility 918. In some embodiments, the cost of electricity varies as a function of time, which results in different values of $C_{ec}(k)$ at different time steps k. The variables $P_{fan}(k)$, $P_{comp}(k)$, and $P_{pump}(k)$ are decision variables which can be optimized by economic controller 1010. In some embodiments, the total power consumption $P_{total}(k)$ of powered chiller components 902 at time step k is equal to the sum of $P_{fan}(k)$, $P_{comp}(k)$, and $P_{pump}(k)$ (i.e., $P_{total}(k)=P_{fan}(k)+P_{comp}(k)+P_{pump}(k)$) Accordingly, the first three terms of the predictive cost function can be replaced with the summation $$\sum_{k=1}^{h} C_{ec}(k)P_{total}(k)\Delta t$$

some embodiments.

The fourth term of the predictive cost function J represents the demand charge. Demand charge is an additional charge imposed by some utility providers based on the maximum power consumption during an applicable demand charge period. For example, the demand charge rate $C_{DC}$ may be specified in terms of dollars per unit of power (e.g., $/kW) and may be multiplied by the peak power usage (e.g., kW) during a demand charge period to calculate the demand charge. In the predictive cost function J, the demand charge rate $C_{DC}$ may be defined by the demand cost information received from electric utility 918. The variable $P_{grid}(k)$ is a decision variable which can be optimized by economic controller 1010 in order to reduce the peak power usage $\max(P_{grid}(k))$ that occurs during the demand charge period. Load shifting may allow economic controller 1010 to smooth momentary spikes in the electric demand of chiller 700 by storing energy in battery unit 702 when the power consumption of powered chiller components 902 is low. The stored energy can be discharged from battery unit 702 when the power consumption of powered chiller components 902 is high in order to reduce the peak power draw $P_{grid}$ from energy grid 914, thereby decreasing the demand charge incurred.

The final term of the predictive cost function J represents the cost savings resulting from the use of battery unit 702. Unlike the previous terms in the cost function J, the final term subtracts from the total cost. The values of the parameter $C_{ec}(k)$ at each time step k can be defined by the energy cost information provided by electric utility 918. In some embodiments, the cost of electricity varies as a function of time, which results in different values of $C_{ec}(k)$ at different time steps k. The variable $P_{bat}(k)$ is a decision variable which can be optimized by economic controller 1010. A positive value of $P_{bat}(k)$ indicates that battery unit 702 is discharging, whereas a negative value of $P_{bat}(k)$ indicates that battery unit 702 is charging. The power discharged from battery unit 702 $P_{bat}(k)$ can be used to satisfy some or all of the total power consumption $P_{total}(k)$ of powered chiller components 902, which reduces the amount of power $P_{grid}$(k) purchased from energy grid 914 (i.e., $P_{grid}(k)=P_{total}(k)-P_{bat}(k)-P_{PV}(k)$). However, charging battery unit 702 results in a negative value of $P_{bat}(k)$ which adds to the total amount of power $P_{grid}(k)$ purchased from energy grid 914.

In some embodiments, the power $P_{PV}$ provided by PV panels 708 is not included in the predictive cost function J because generating PV power does not incur a cost. However, the power $P_{PV}$ generated by PV panels 708 can be used to satisfy some or all of the total power consumption $P_{total}(k)$ of powered chiller components 902, which reduces the amount of power $P_{grid}(k)$ purchased from energy grid 914 (i.e., $P_{grid}(k)=P_{total}(k)-P_{bat}(k)-P_{PV}(k)$). The amount of PV power $P_{PV}$ generated during any time step k can be predicted by economic controller 1010. Several techniques for predicting the amount of PV power generated by PV panels are described in U.S. patent application Ser. No. 15/247,869, U.S. patent application Ser. No. 15/247,844, and U.S. patent application Ser. No. 15/247,788. Each of these patent applications has a filing date of Aug. 25, 2016, and the entire disclosure of each of these patent applications is incorporated by reference herein.

Economic controller 1010 can optimize the predictive cost function J over the duration of the optimization period to determine optimal values of the decision variables at each time step during the optimization period. In some embodiments, the optimization period has a duration of approximately one day and each time step is approximately fifteen minutes. However, the durations of the optimization period and the time steps can vary in other embodiments and can be adjusted by a user. Advantageously, economic controller 1010 can use battery unit 702 to perform load shifting by drawing electricity from energy grid 914 when energy prices are low and/or when the power consumed by powered chiller components 902 is low. The electricity can be stored in battery unit 702 and discharged later when energy prices are high and/or the power consumption of powered chiller components 902 is high. This enables economic controller 1010 to reduce the cost of electricity consumed by chiller 700 and can smooth momentary spikes in the electric demand of chiller 700, thereby reducing the demand charge incurred.

Economic controller 1010 can be configured to impose constraints on the optimization of the predictive cost function J. In some embodiments, the constraints include constraints on the temperature $T_{water}$ of the chilled water produced by chiller 700. Economic controller 1010 can be configured to maintain the actual or predicted temperature $T_{water}$ between a minimum temperature bound $T_{min}$ and a maximum temperature bound $T_{max}$ (i.e., $T_{min} \leq T_{water} \leq T_{max}$) at all times. The parameters $T_{min}$ and $T_{max}$ may be time-varying to define different temperature ranges at different times.

In addition to constraints on the water temperature $T_{water}$, economic controller 1010 can impose constraints on the state-of-charge (SOC) and charge/discharge rates of battery unit 702. In some embodiments, economic controller 1010 generates and imposes the following power constraints on the predictive cost function J:

$$P_{bat} \leq P_{rated}$$

$$-P_{bat} \leq P_{rated}$$

where $P_{bat}$ is the amount of power discharged from battery unit 702 and $P_{rated}$ is the rated battery power of battery unit 702 (e.g., the maximum rate at which battery unit 702 can be charged or discharged). These power constraints ensure that battery unit 702 is not charged or discharged at a rate that exceeds the maximum possible battery charge/discharge rate $P_{rated}$.

In some embodiments, economic controller 1010 generates and imposes one or more capacity constraints on the predictive cost function J The capacity constraints may be used to relate the battery power $P_{bat}$ charged or discharged during each time step to the capacity and SOC of battery unit 702. The capacity constraints may ensure that the capacity of battery unit 702 is maintained within acceptable lower and upper bounds at each time step of the optimization period. In some embodiments, economic controller 1010 generates the following capacity constraints:

$$C_a(k) - P_{bat}(k)\Delta t \leq C_{rated}$$

$$C_a(k) - P_{bat}(k)\Delta t \geq 0$$

where $C_a(k)$ is the available battery capacity (e.g., kWh) at the beginning of time step k, $P_{bat}(k)$ is the rate at which battery unit 702 is discharged during time step k (e.g., kW), $\Delta t$ is the duration of each time step, and $C_{rated}$ is the maximum rated capacity of battery unit 702 (e.g., kWh). The term $P_{bat}(k)\Delta t$ represents the change in battery capacity during time step k. These capacity constraints ensure that the capacity of battery unit 702 is maintained between zero and the maximum rated capacity $C_{rated}$.

In some embodiments, economic controller 1010 generates and imposes one or more capacity constraints on the operation of powered chiller components 902. For example, powered chiller components 902 may have a maximum operating point (e.g., a maximum pump speed, a maximum cooling capacity, etc.) which corresponds to a maximum power consumption $P_{total,max}$. Economic controller 1010 can be configured to generate a constraint which limits the power $P_{total}$ provided to powered chiller components 902 between zero and the maximum power consumption $P_{total}$, max as shown in the following equation:

$$0 \leq P_{total} \leq P_{total,max}$$

$$P_{total} = P_{sp,grid} + P_{sp,bat}$$

where the total power $P_{total}$ provided to powered chiller components 902 is the sum of the grid power setpoint $P_{sp,grid}$ and the battery power setpoint $P_{sp,bat}$.

Economic controller 1010 can optimize the predictive cost function J subject to the constraints to determine optimal values for the decision variables $P_{total}$, $P_{fan}$, $P_{comp}$, $P_{pump}$, $P_{grid}$, and $P_{bat}$, where $P_{total}=P_{bat}+P_{grid}+P_{PV}$. In some embodiments, economic controller 1010 uses the optimal values for $P_{total}$, $P_{bat}$, and/or $P_{grid}$ to generate power setpoints for tracking controller 1012. The power setpoints can include battery power setpoints $P_{sp,bat}$, grid power setpoints $P_{sp,grid}$, and/or chiller power setpoints $P_{sp,total}$ for each of the time steps k in the optimization period. Economic controller 1010 can provide the power setpoints to tracking controller 1012.

Tracking Controller

Tracking controller 1012 can use the optimal power setpoints $P_{sp,grid}$, $P_{sp,bat}$, and/or $P_{sp,total}$ generated by economic controller 1010 to determine optimal temperature setpoints (e.g., an air temperature setpoint $T_{sp,air}$, a chilled water temperature setpoint $T_{sp,water}$, etc.) and an optimal battery charge or discharge rate (i.e., $Bat_{C/D}$). In some embodiments, tracking controller 1012 generates an air temperature setpoint $T_{sp,air}$ and/or a chilled water temperature setpoint $T_{sp,water}$ that are predicted to achieve the power setpoint $P_{sp,total}$ for chiller 700. In other words, tracking controller 1012 may generate an air temperature setpoint $T_{sp,air}$ and/or a chilled water temperature setpoint $T_{sp,water}$ that cause chiller 700 to consume the optimal amount of power $P_{total}$ determined by economic controller 1010.

In some embodiments, tracking controller 1012 uses the battery power setpoint $P_{sp,bat}$ to determine the optimal rate $Bat_{C/D}$ at which to charge or discharge battery unit 702. For example, the battery power setpoint $P_{sp,bat}$ may define a power value (kW) which can be translated by tracking controller 1012 into a control signal for power inverter 910 and/or equipment controller 1014. In other embodiments, the battery power setpoint $P_{sp,bat}$ is provided directly to power inverter 910 and used by power inverter 910 to control the battery power $P_{bat}$.

Equipment Controller

Equipment controller 1014 can use the optimal temperature setpoints $T_{sp,air}$ or $T_{sp,water}$ generated by tracking controller 1012 to generate control signals for powered chiller components 902. The control signals generated by equipment controller 1014 may drive the actual (e.g., measured) temperatures $T_{air}$ and/or $T_{water}$ to the setpoints. Equipment controller 1014 can use any of a variety of control techniques to generate control signals for powered chiller components 902. For example, equipment controller 1014 can use state-based algorithms, extremum seeking control (ESC) algorithms, proportional-integral (PI) control algorithms, proportional-integral-derivative (PID) control algorithms, model predictive control (MPC) algorithms, or other feedback control algorithms, to generate control signals for powered chiller components 902.

The control signals may include on/off commands, speed setpoints for fan 730, power setpoints for compressor 720, pressure setpoints or flow rate setpoints for pump 732, or other types of setpoints for individual devices of powered chiller components 902. In other embodiments, the control signals may include the temperature setpoints (e.g., an air temperature setpoint $T_{sp,air}$, a chilled water temperature setpoint $T_{sp,water}$, etc.) generated by predictive chiller controller 704. The temperature setpoints can be provided to powered chiller components 902 or local controllers for powered chiller components 902 which operate to achieve the temperature setpoints. For example, a local controller for fan 730 may receive a measurement of the chilled water temperature $T_{water}$ from chilled water temperature sensor and/or a measurement the air temperature $T_{air}$ from an air temperature sensor and can modulate the speed of fan 730 to drive the measured temperatures to the temperature setpoints.

In some embodiments, equipment controller 1014 is configured to provide control signals to power inverter 910. The control signals provided to power inverter 910 can include a battery power setpoint $P_{sp,bat}$ and/or the optimal charge/discharge rate $Bat_{C/D}$. Equipment controller 1014 can be configured to operate power inverter 910 to achieve the battery power setpoint $P_{sp,bat}$. For example, equipment controller 1014 can cause power inverter 910 to charge battery unit 702 or discharge battery unit 702 in accordance with the battery power setpoint $P_{sp,bat}$.

Pump Unit with Battery and Predictive Control

Figure 11:
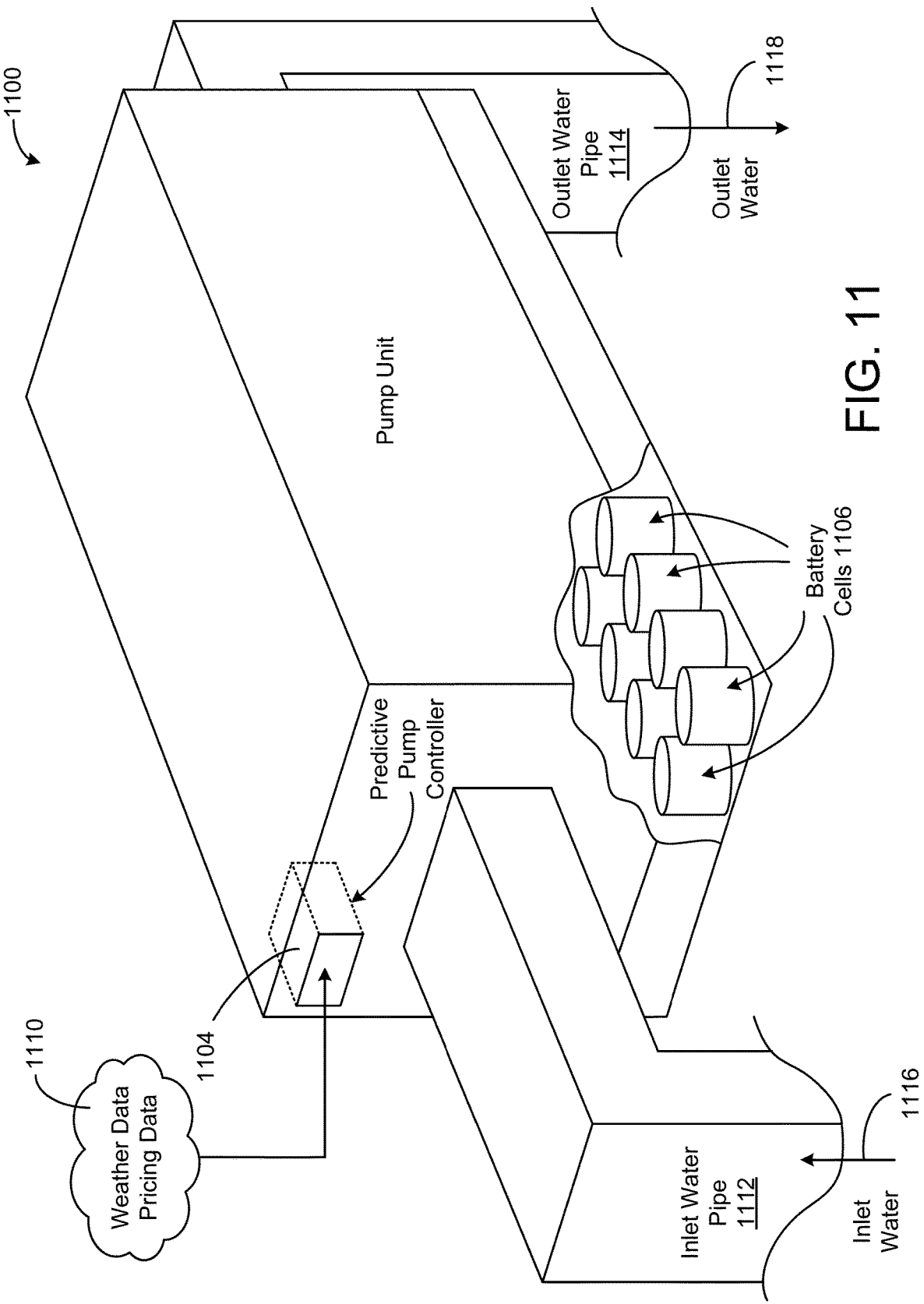
FIG. 11 is a drawing of a pump unit with a battery unit and a predictive pump controller, according to some embodiments.
Figure 12:
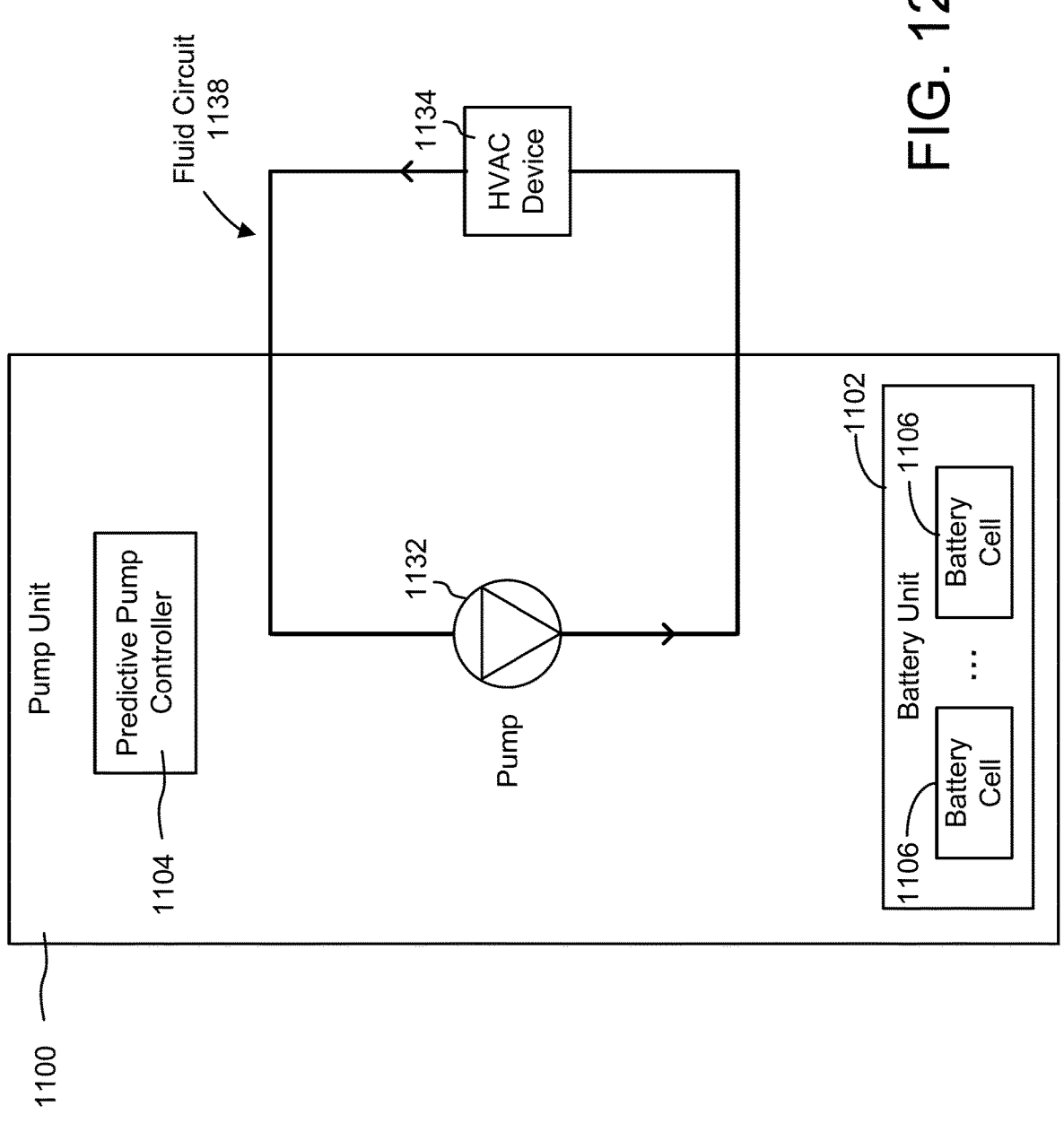
FIG. 12 is a block diagram of the pump unit of FIG. 11, according to some embodiments.

Referring now to FIGS. 11-12, a pump unit 1100 with a battery unit 1102 and predictive pump controller 1104 is shown, according to some embodiments. Pump unit 1100 can be configured to circulate a fluid through a HVAC device 1134 via a fluid circuit 1138. HVAC device 1134 can include, for example, a heating coil or cooling coil, an air handling unit, a rooftop unit, a heat exchanger, a refrigerator or freezer, a condenser or evaporator, a cooling tower, or any other type of system or device that receives a fluid in a HVAC system. In some embodiments, a pump 1132 receives the fluid (e.g., inlet water 1116) via an inlet water pipe 1112 and outputs the fluid (e.g., outlet water 1118) via an outlet water pipe 1114.

In some embodiments, battery unit 1102 includes one or more battery cells 1106. Battery cells 1106 are configured to store and discharge electric energy (i.e., electricity). In some embodiments, battery unit 1102 is charged using electricity from an external energy grid (e.g., provided by an electric utility). The electricity stored in battery unit 1102 can be discharged to power one or more powered components of pump unit 1100 (e.g., pump 1132). Advantageously, battery unit 1102 allows pump unit 1100 to draw electricity from the energy grid and charge battery unit 1102 when energy prices are low and discharge the stored electricity when energy prices are high to time-shift the electric load of pump unit 1100. In some embodiments, battery unit 1102 has sufficient energy capacity to power pump unit 1100 for approximately 4-6 hours when operating at maximum capacity such that battery unit 1102 can be utilized during high energy cost periods and charged during low energy cost periods.

In some embodiments, predictive pump controller 1104 performs an optimization process to determine whether to charge or discharge battery unit 1102 during each of a plurality of time steps that occur during an optimization period. Predictive pump controller 1104 may use weather and pricing data 1110 to predict the amount of heating/cooling required and the cost of electricity during each of the plurality of time steps. Predictive pump controller 1104 can optimize an objective function that accounts for the cost of electricity purchased from the energy grid over the duration of the optimization period. Predictive pump controller 1104 can determine an amount of electricity to purchase from the energy grid and an amount of electricity to store or discharge from battery unit 1102 during each time step. The objective function and the optimization performed by predictive pump controller 1104 are described in greater detail with reference to FIGS. 13-14.

Predictive Pump Control System

Figure 13:
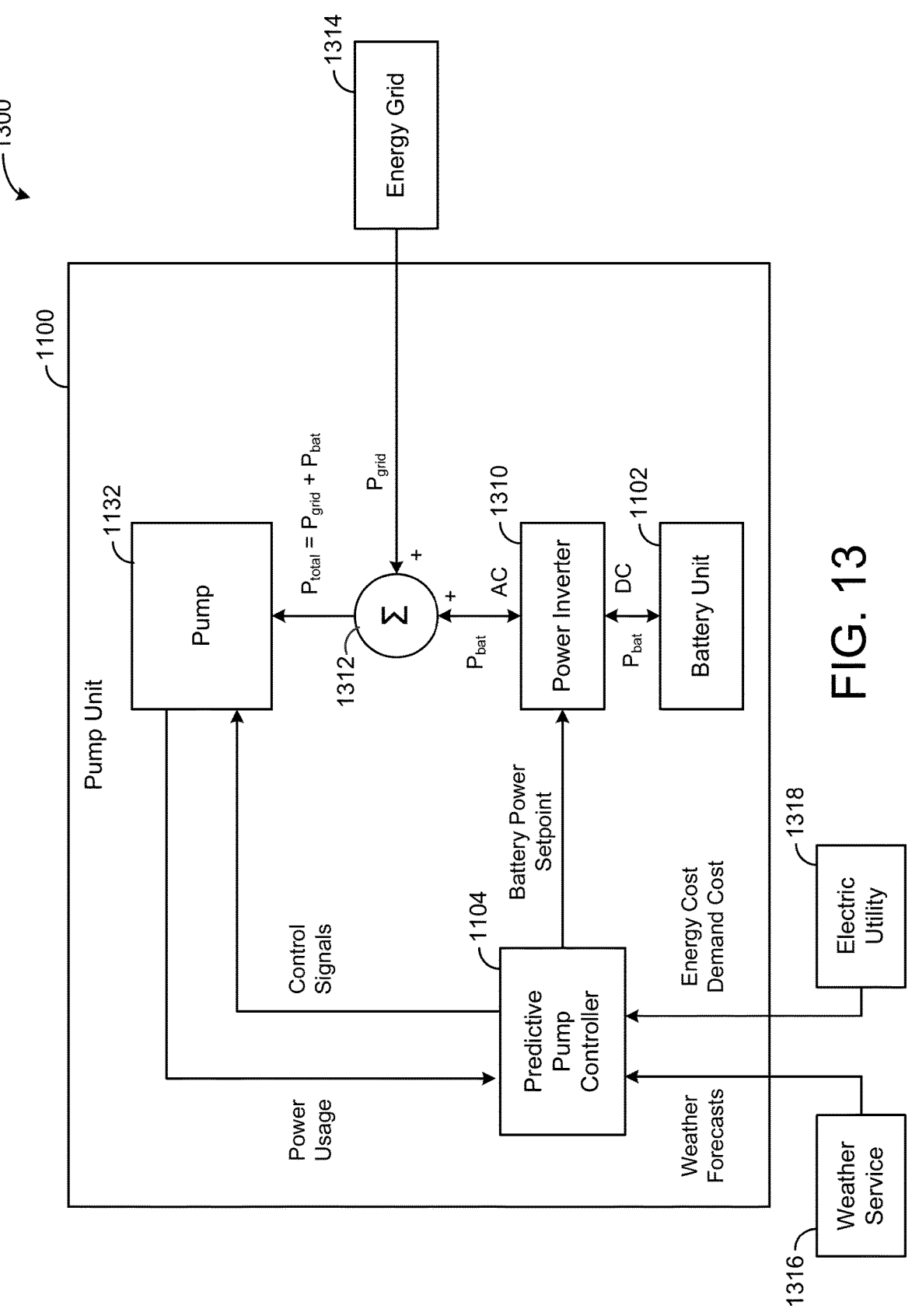
FIG. 13 is a block diagram of a predictive pump control system including the battery unit and predictive pump controller of FIG. 11, according to some embodiments.

Referring now to FIG. 13, a block diagram of a predictive pump control system 1300 is shown, according to some embodiments. Several of the components shown in control system 1300 may be part of pump unit 1100. For example, pump unit 1100 may include pump 1132, battery unit 1102, predictive pump controller 1104, power inverter 1310, and a power junction 1312.

Power inverter 1310 may be configured to convert electric power between direct current (DC) and alternating current (AC). For example, battery unit 1102 may be configured to store and output DC power, whereas energy grid 1314 and pump 1132 may be configured to consume and provide AC power. Power inverter 1310 may be used to convert DC power from battery unit 1102 into a sinusoidal AC output synchronized to the grid frequency of energy grid 1314 and/or pump 1132. Power inverter 1310 may also be used to convert AC power from energy grid 1314 into DC power that can be stored in battery unit 1102. The power output of battery unit 1102 is shown as $P_{bat}$. $P_{bat}$ may be positive if battery unit 1102 is providing power to power inverter 1310 (i.e., battery unit 1102 is discharging) or negative if battery unit 1102 is receiving power from power inverter 1310 (i.e., battery unit 1102 is charging).

In some instances, power inverter 1310 receives a DC power output from battery unit 1102 and converts the DC power output to an AC power output that can be provided to pump 1132. Power inverter 1310 may synchronize the frequency of the AC power output with that of energy grid 1314 (e.g., 50 Hz or 60 Hz) using a local oscillator and may limit the voltage of the AC power output to no higher than the grid voltage. In some embodiments, power inverter 1310 is a resonant inverter that includes or uses LC circuits to remove the harmonics from a simple square wave in order to achieve a sine wave matching the frequency of energy grid 1314. In various embodiments, power inverter 1310 may operate using high-frequency transformers, low-frequency transformers, or without transformers. Low-frequency transformers may convert the DC output from battery unit 1102 directly to the AC output provided to pump 1132. High-frequency transformers may employ a multi-step process that involves converting the DC output to high-frequency AC, then back to DC, and then finally to the AC output provided to pump 1132.

Power junction 1312 is the point at which pump 1132, energy grid 1314, and power inverter 1310 are electrically connected. The power supplied to power junction 1312 from power inverter 1310 is shown as $P_{bat}$. $P_{bat}$ may be positive if power inverter 1310 is providing power to power junction 1312 (i.e., battery unit 1102 is discharging) or negative if power inverter 1310 is receiving power from power junction 1312 (i.e., battery unit 1102 is charging). The power supplied to power junction 1312 from energy grid 1314 is shown as $P_{grid}$. $P_{bat}$ and $P_{grid}$ combine at power junction 1312 to form $P_{total}$ (i.e. $P_{total}=P_{grid}+P_{bat}$). $P_{total}$ may be defined as the power provided to pump 1132 from power junction 1312. In some instances, $P_{total}$ is greater than $P_{grid}$. For example, when battery unit 1102 is discharging, $P_{bat}$ may be positive which adds to the grid power $P_{grid}$ when $P_{bat}$ combines with $P_{grid}$ to form $P_{total}$ In other instances, $P_{total}$ may be less than $P_{grid}$. For example, when battery unit 1102 is charging, $P_{bat}$ may be negative which subtracts from the grid power $P_{grid}$ when $P_{bat}$ and $P_{grid}$ combine to form $P_{total}$.

Predictive pump controller 1104 can be configured to control pump 1132 and power inverter 1310. In some embodiments, predictive pump controller 1104 generates and provides a battery power setpoint $P_{sp,bat}$ to power inverter 1310. The battery power setpoint $P_{sp,bat}$ may include a positive or negative power value (e.g., kW) which causes power inverter 1310 to charge battery unit 1102 (when $P_{sp,bat}$ is negative) using power available at power junction 1312 or discharge battery unit 1102 (when $P_{sp,bat}$ is positive) to provide power to power junction 1312 in order to achieve the battery power setpoint $P_{sp,bat}$.

In some embodiments, predictive pump controller 1104 generates and provides control signals to pump 1132. Predictive pump controller 1104 may use a multi-stage optimization technique to generate the control signals. For example, predictive pump controller 1104 may include an economic controller configured to determine the optimal amount of power to be consumed by pump 1132 at each time step during the optimization period. The optimal amount of power to be consumed may minimize a cost function that accounts for the cost of energy consumed by pump unit 1100. The cost of energy may be based on time-varying energy prices from electric utility 1318. In some embodiments, predictive pump controller 1104 determines an optimal amount of power to purchase from energy grid 1314 (i.e., a grid power setpoint $P_{sp,grid}$) and an optimal amount of power to store or discharge from battery unit 1102 (i.e., a battery power setpoint $P_{sp,bat}$) at each of the plurality of time steps. Predictive pump controller 1104 may monitor the actual power usage of pump 1132 and may utilize the actual power usage as a feedback signal when generating the optimal power setpoints.

Predictive pump controller 1104 may include a tracking controller configured to generate flow setpoints $Flow_{sp}$ and differential pressure setpoints $DP_{sp}$ that achieve the optimal amount of power consumption at each time step. In some embodiments, predictive pump controller 1104 uses an equipment model for pump 1132 to determine an amount of fluid flow and/or differential pressure be generated by pump 1132 based on the optimal amount of power consumption.

In some embodiments, predictive pump controller 1104 uses the flow setpoints $Flow_{sp}$ and differential pressure setpoints $DP_{sp}$ to generate the control signals for pump 1132. The control signals may include on/off commands, speed setpoints, or other types of setpoints that affect the operation of pump 1132. In other embodiments, the control signals may include the flow setpoints $Flow_{sp}$ and differential pressure setpoints $DP_{sp}$ generated by predictive pump controller 1104. The setpoints can be provided to pump 1132 or local controllers for pump 1132 which operate to achieve the setpoints. For example, a local controller for pump 1132 may receive a measurement of the differential pressure DP across pump 1132 from one or more pressure sensors and/or a measurement of the fluid flow caused by pump 1132 from one or more flow sensors. The local controller can use a feedback control process (e.g., PID, ESC, MPC, etc.) to increase or decrease the speed of pump 1132 to drive the measured fluid flow and/or differential pressure to the setpoint(s). The multi-stage optimization performed by predictive pump controller 1104 is described in greater detail with reference to FIG. 14.

Predictive Pump Controller

Figure 14:
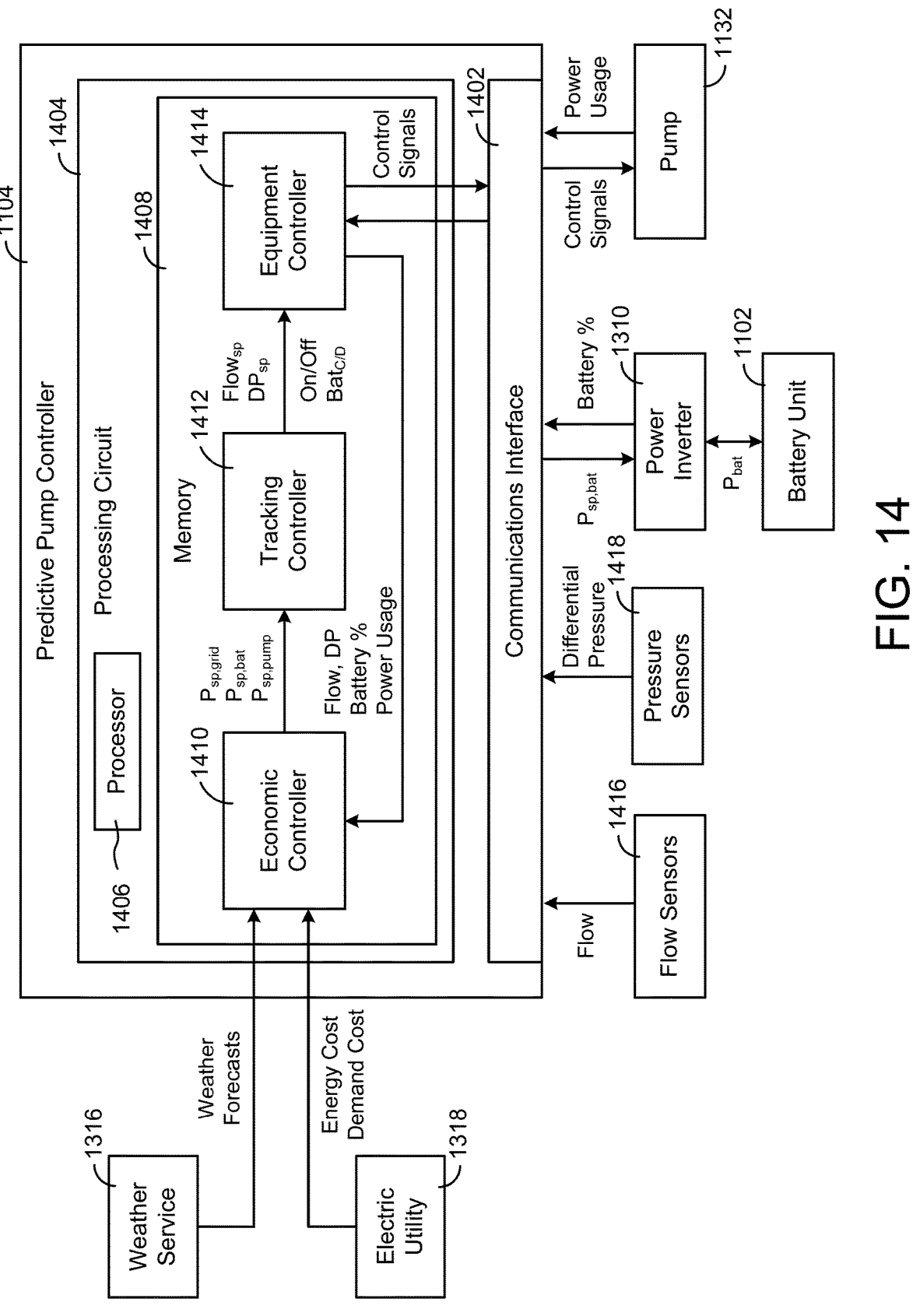
FIG. 14 is a block diagram illustrating the predictive pump controller of FIG. 11 in greater detail, according to some embodiments.

Referring now to FIG. 14, a block diagram illustrating predictive pump controller 1104 in greater detail is shown, according to an exemplary embodiment. Predictive pump controller 1104 is shown to include a communications interface 1402 and a processing circuit 1404. Communications interface 1402 may facilitate communications between controller 1104 and external systems or devices. For example, communications interface 1402 may receive measurements of the fluid flow Flow from flow sensors 1416, measurements of the differential pressure DP across pump 1132 from pressure sensors 1418, and measurements of the power usage of pump 1132. In some embodiments, communications interface 1402 receives measurements of the state-of-charge (SOC) of battery unit 1102, which can be provided as a percentage of the maximum battery capacity (i.e., battery %). Communications interface 1402 can receive weather forecasts from a weather service 916 and predicted energy costs and demand costs from an electric utility 1318. In some embodiments, predictive pump controller 1104 uses communications interface 1402 to provide control signals pump 1132 and power inverter 1310.

Communications interface 1402 may include wired or wireless communications interfaces (e.g., jacks, antennas, transmitters, receivers, transceivers, wire terminals, etc.) for conducting data communications external systems or devices. In various embodiments, the communications may be direct (e.g., local wired or wireless communications) or via a communications network (e.g., a WAN, the Internet, a cellular network, etc.). For example, communications interface 1402 can include an Ethernet card and port for sending and receiving data via an Ethernet-based communications link or network. In another example, communications interface 1402 can include a Wi-Fi transceiver for communicating via a wireless communications network or cellular or mobile phone communications transceivers.

Processing circuit 1404 is shown to include a processor 1406 and memory 1408. Processor 1406 may be a general purpose or specific purpose processor, an application specific integrated circuit (ASIC), one or more field programmable gate arrays (FPGAs), a group of processing components, or other suitable processing components. Processor 1406 is configured to execute computer code or instructions stored in memory 1408 or received from other computer readable media (e.g., CDROM, network storage, a remote server, etc.).

Memory 1408 may include one or more devices (e.g., memory units, memory devices, storage devices, etc.) for storing data and/or computer code for completing and/or facilitating the various processes described in the present disclosure. Memory 1408 may include random access memory (RAM), read-only memory (ROM), hard drive storage, temporary storage, non-volatile memory, flash memory, optical memory, or any other suitable memory for storing software objects and/or computer instructions. Memory 1408 may include database components, object code components, script components, or any other type of information structure for supporting the various activities and information structures described in the present disclosure. Memory 1408 may be communicably connected to processor 1406 via processing circuit 1404 and may include computer code for executing (e.g., by processor 1406) one or more processes described herein. When processor 1406 executes instructions stored in memory 1408 for completing the various activities described herein, processor 1406 generally configures controller 1104 (and more particularly processing circuit 1404) to complete such activities.

Still referring to FIG. 14, predictive pump controller 1104 is shown to include an economic controller 1410, a tracking controller 1412, and an equipment controller 1414. Controllers 1410-1414 can be configured to perform a multi-state optimization process to generate control signals for power inverter 1310 and pump 1132. In brief overview, economic controller 1410 can optimize a predictive cost function to determine an optimal amount of power to purchase from energy grid 1314 (i.e., a grid power setpoint $P_{sp,grid}$), an optimal amount of power to store or discharge from battery unit 1102 (i.e., a battery power setpoint $P_{sp,bat}$), and/or an optimal amount of power to be consumed by pump 1132 (i.e., a pump power setpoint $P_{sp,pump}$) at each time step of an optimization period. Tracking controller 1412 can use the optimal power setpoints $P_{sp,grid}$, $P_{sp,bat}$, and/or $P_{sp,pump}$ to determine optimal flow setpoints $Flow_{sp}$, pressure setpoints $DP_{sp}$, and an optimal battery charge or discharge rate (i.e., $Bat_{C/D}$). Equipment controller 1414 can use the optimal setpoints $Flow_{sp}$ and/or $DP_{sp}$ to generate control signals for pump 1132 that drive the actual (e.g., measured) flowrate Flow and/or pressure DP to the setpoints (e.g., using a feedback control technique). Each of controllers 1410-1414 is described in detail below.

Economic Controller

Economic controller 1410 can be configured to optimize a predictive cost function to determine an optimal amount of power to purchase from energy grid 1314 (i.e., a grid power setpoint $P_{sp,grid}$), an optimal amount of power to store or discharge from battery unit 1102 (i.e., a battery power setpoint $P_{sp,bat}$), and/or an optimal amount of power to be consumed by pump 1132 (i.e., a pump power setpoint $P_{sp,pump}$) at each time step of an optimization period. An example of a predictive cost function which can be optimized by economic controller 1410 is shown in the following equation:

$$\min(J) = \sum_{k=1}^{h} C_{ec}(k)P_{pump}(k)\Delta t + C_{DC}\max_{k}(P_{grid}(k)) - \sum_{k=1}^{h} C_{ec}(k)P_{bat}(k)\Delta t$$

where $C_{ec}(k)$ is the cost per unit of electricity (e.g., \$/kWh) purchased from electric utility 1318 during time step k, $P_{pump}(k)$ is the power consumption of pump 1132 at time step k, $C_{DC}$ is the demand charge rate (e.g., \$/kW), where the max( ) term selects the maximum electricity purchase of pump unit 1100 (i.e., the maximum value of $P_{grid}(k)$) during any time step k of the optimization period, $P_{bat}(k)$ is the amount of power discharged from battery unit 1102 during time step k, and $\Delta t$ is the duration of each time step k. Economic controller 1410 can optimize the predictive cost function J over the duration of the optimization period (e.g., from time step k=1 to time step k=h) to predict the total cost of operating pump unit 1100 over the duration of the optimization period.

The first term of the predictive cost function J represents the cost of electricity consumed by pump 1132 over the duration of the optimization period. The values of the parameter $C_{ec}(k)$ at each time step k can be defined by the energy cost information provided by electric utility 1318. In some embodiments, the cost of electricity varies as a function of time, which results in different values of $C_{ec}(k)$ at different time steps k. The variable $P_{pump}(k)$ is a decision variable which can be optimized by economic controller 1410.

The second term of the predictive cost function J represents the demand charge. Demand charge is an additional charge imposed by some utility providers based on the maximum power consumption during an applicable demand charge period. For example, the demand charge rate $C_{DC}$ may be specified in terms of dollars per unit of power (e.g., \$/kW) and may be multiplied by the peak power usage (e.g., kW) during a demand charge period to calculate the demand charge. In the predictive cost function J, the demand charge rate $C_{DC}$ may be defined by the demand cost information received from electric utility 1318. The variable $P_{grid}(k)$ is a decision variable which can be optimized by economic controller 1410 in order to reduce the peak power usage $\max(P_{grid}(k))$ that occurs during the demand charge period. Load shifting may allow economic controller 1410 to smooth momentary spikes in the electric demand of pump unit 1100 by storing energy in battery unit 1102 when the power consumption of pump 1132 is low. The stored energy can be discharged from battery unit 1102 when the power consumption of pump 1132 is high in order to reduce the peak power draw $P_{grid}$ from energy grid 1314, thereby decreasing the demand charge incurred.

The final term of the predictive cost function J represents the cost savings resulting from the use of battery unit 1102. Unlike the previous terms in the cost function J, the final term subtracts from the total cost. The values of the parameter $C_{ec}(k)$ at each time step k can be defined by the energy cost information provided by electric utility 1318. In some embodiments, the cost of electricity varies as a function of time, which results in different values of $C_{ec}(k)$ at different time steps k. The variable $P_{bat}(k)$ is a decision variable which can be optimized by economic controller 1410. A positive value of $P_{bat}(k)$ indicates that battery unit 1102 is discharging, whereas a negative value of $P_{bat}(k)$ indicates that battery unit 1102 is charging. The power discharged from battery unit 1102 $P_{bat}(k)$ can be used to satisfy some or all of the total power consumption $P_{total}(k)$ of pump 1132, which reduces the amount of power $P_{grid}(k)$ purchased from energy grid 1314 (i.e., $P_{grid}(k)=P_{total}(k)-P_{bat}(k)$). However, charging battery unit 1102 results in a negative value of $P_{bat}(k)$ which adds to the total amount of power $P_{grid}(k)$ purchased from energy grid 1314.

Economic controller 1410 can optimize the predictive cost function J over the duration of the optimization period to determine optimal values of the decision variables at each time step during the optimization period. In some embodiments, the optimization period has a duration of approximately one day and each time step is approximately fifteen minutes. However, the durations of the optimization period and the time steps can vary in other embodiments and can be adjusted by a user. Advantageously, economic controller 1410 can use battery unit 1102 to perform load shifting by drawing electricity from energy grid 1314 when energy prices are low and/or when the power consumed by pump 1132 is low. The electricity can be stored in battery unit 1102 and discharged later when energy prices are high and/or the power consumption of pump 1132 is high. This enables economic controller 1410 to reduce the cost of electricity consumed by pump unit 1100 and can smooth momentary spikes in the electric demand of pump unit 1100, thereby reducing the demand charge incurred.

Economic controller 1410 can be configured to impose constraints on the optimization of the predictive cost function J. In some embodiments, the constraints include constraints on the flow rate Flow and/or differential pressure DP produced by pump 1132. Economic controller 1410 can be configured to maintain the actual or predicted flow rate Flow between a minimum flow bound $Flow_{min}$ and a maximum flow bound $Flow_{max}$ (i.e., $Flow_{min} \leq Flow \leq Flow_{max}$) at all times. The parameters $Flow_{min}$ and $Flow_{max}$ may be time-varying to define different flow ranges at different times. Similarly, economic controller 1410 can be configured to maintain the actual or predicted pressure DP between a minimum pressure bound $DP_{min}$ and a maximum pressure bound $DP_{max}$ (i.e., $DP_{min} \leq DP \leq DP_{max}$) at all times. The parameters $DP_{min}$ and $DP_{max}$ may be time-varying to define different flow ranges at different times.

In addition to constraints on the fluid flowrate Flow and the differential pressure DP, economic controller 1410 can impose constraints on the state-of-charge (SOC) and charge/discharge rates of battery unit 1102. In some embodiments, economic controller 1410 generates and imposes the following power constraints on the predictive cost function J:

$$P_{bat} \leq P_{rated}$$

$$-P_{bat} \leq P_{rated}$$

where $P_{bat}$ is the amount of power discharged from battery unit 1102 and $P_{rated}$ is the rated battery power of battery unit 1102 (e.g., the maximum rate at which battery unit 1102 can be charged or discharged). These power constraints ensure that battery unit 1102 is not charged or discharged at a rate that exceeds the maximum possible battery charge/discharge rate $P_{rated}$.

In some embodiments, economic controller 1410 generates and imposes one or more capacity constraints on the predictive cost function J. The capacity constraints may be used to relate the battery power $P_{bat}$ charged or discharged during each time step to the capacity and SOC of battery unit 1102. The capacity constraints may ensure that the capacity of battery unit 1102 is maintained within acceptable lower and upper bounds at each time step of the optimization period. In some embodiments, economic controller 1410 generates the following capacity constraints:

$$C_a(k) - P_{bat}(k)\Delta t \leq C_{rated}$$

$$C_a(k) - P_{bat}(k)\Delta t \geq 0$$

where $C_a(k)$ is the available battery capacity (e.g., kWh) at the beginning of time step k, $P_{bat}(k)$ is the rate at which battery unit 1102 is discharged during time step k (e.g., kW), $\Delta t$ is the duration of each time step, and $C_{rated}$ is the maximum rated capacity of battery unit 1102 (e.g., kWh). The term $P_{bat}(k)\Delta t$ represents the change in battery capacity during time step k. These capacity constraints ensure that the capacity of battery unit 1102 is maintained between zero and the maximum rated capacity $C_{rated}$.

In some embodiments, economic controller 1410 generates and imposes one or more capacity constraints on the operation of pump 1132. For example, pump 1132 may have a maximum operating point (e.g., a maximum pump speed, a maximum differential pressure, etc.) which corresponds to a maximum power consumption $P_{pump,max}$. Economic controller 1410 can be configured to generate a constraint which limits the power $P_{pump}$ provided to pump 1132 between zero and the maximum power consumption $P_{pump,max}$ as shown in the following equation:

$$0 \leq P_{pump} \leq P_{pump,max}$$

$$P_{pump} = P_{sp,grid} + P_{sp,bat}$$

where the total power $P_{pump}$ provided to pump 1132 is the sum of the grid power setpoint $P_{sp,grid}$ and the battery power setpoint $P_{sp,bat}$.

Economic controller 1410 can optimize the predictive cost function J subject to the constraints to determine optimal values for the decision variables $P_{pump}$, $P_{grid}$, and $P_{bat}$, where $P_{pump}=P_{bat}+P_{grid}$. In some embodiments, economic controller 1410 uses the optimal values for $P_{pump}$, $P_{bat}$, and/or $P_{grid}$ to generate power setpoints for tracking controller 1412. The power setpoints can include battery power setpoints $P_{sp,bat}$, grid power setpoints $P_{sp,grid}$, and/or pump power setpoints $P_{sp,pump}$ for each of the time steps k in the optimization period. Economic controller 1410 can provide the power setpoints to tracking controller 1412.

Tracking Controller

Tracking controller 1412 can use the optimal power setpoints $P_{sp,grid}$, $P_{sp,bat}$, and/or $P_{sp,pump}$ generated by economic controller 1410 to determine optimal flow setpoints $Flow_{sp}$, optimal pressure setpoints $DP_{sp}$, and an optimal battery charge or discharge rate (i.e., $Bat_{C/D}$). In some embodiments, tracking controller 1412 generates a flow setpoint $Flow_{sp}$ and/or a pressure setpoint $DP_{sp}$ that are predicted to achieve the power setpoint $P_{sp,pump}$ for pump 1132. In other words, tracking controller 1412 may generate a flow setpoint $Flow_{sp}$ and/or a pressure setpoint $DP_{sp}$ that cause pump 1132 to consume the optimal amount of power $P_{pump}$ determined by economic controller 1410.

In some embodiments, tracking controller 1412 uses the battery power setpoint $P_{sp,bat}$ to determine the optimal rate $Bat_{C/D}$ at which to charge or discharge battery unit 1102. For example, the battery power setpoint $P_{sp,bat}$ may define a power value (kW) which can be translated by tracking controller 1412 into a control signal for power inverter 1310 and/or equipment controller 1414. In other embodiments, the battery power setpoint $P_{sp,bat}$ is provided directly to power inverter 1310 and used by power inverter 1310 to control the battery power $P_{bat}$.

Equipment Controller

Equipment controller 1414 can use the optimal flow setpoints $Flow_{sp}$ and/or a pressure setpoints $DP_{sp}$ generated by tracking controller 1412 to generate control signals for pump 1132. The control signals generated by equipment controller 1414 may drive the actual (e.g., measured) flow rate Flow and pressure DP to the setpoints. Equipment controller 1414 can use any of a variety of control techniques to generate control signals for pump 1132. For example, equipment controller 1414 can use state-based algorithms, extremum seeking control (ESC) algorithms, proportional-integral (PI) control algorithms, proportional-integral-derivative (PID) control algorithms, model predictive control (MPC) algorithms, or other feedback control algorithms, to generate control signals for pump 1132.

The control signals may include on/off commands, speed commands for pump 1132, power commands for pump 1132, or other types of operating commands for pump 1132. In other embodiments, the control signals may include the flow setpoints $Flow_{sp}$ and/or a pressure setpoints $DP_{sp}$ generated by predictive pump controller 1104. The setpoints can be provided to pump 1132 or a local controller for pump 1132 which operate to achieve the setpoints. For example, a local controller for pump 1132 may receive a measurement of the fluid flowrate Flow from flow sensors 1416 and/or a measurement the differential pressure DP from pressure sensors 1418 and can modulate the speed of pump 1132 to drive the measured flowrate and/or pressure to the setpoints.

In some embodiments, equipment controller 1414 is configured to provide control signals to power inverter 1310. The control signals provided to power inverter 1310 can include a battery power setpoint $P_{sp,bat}$ and/or the optimal charge/discharge rate $Bat_{C/D}$. Equipment controller 1414 can be configured to operate power inverter 1310 to achieve the battery power setpoint $P_{sp,bat}$ For example, equipment controller 1414 can cause power inverter 1310 to charge battery unit 1102 or discharge battery unit 1102 in accordance with the battery power setpoint $P_{sp,bat}$.

Cooling Tower with Battery Unit and Predictive Control

Figure 15:
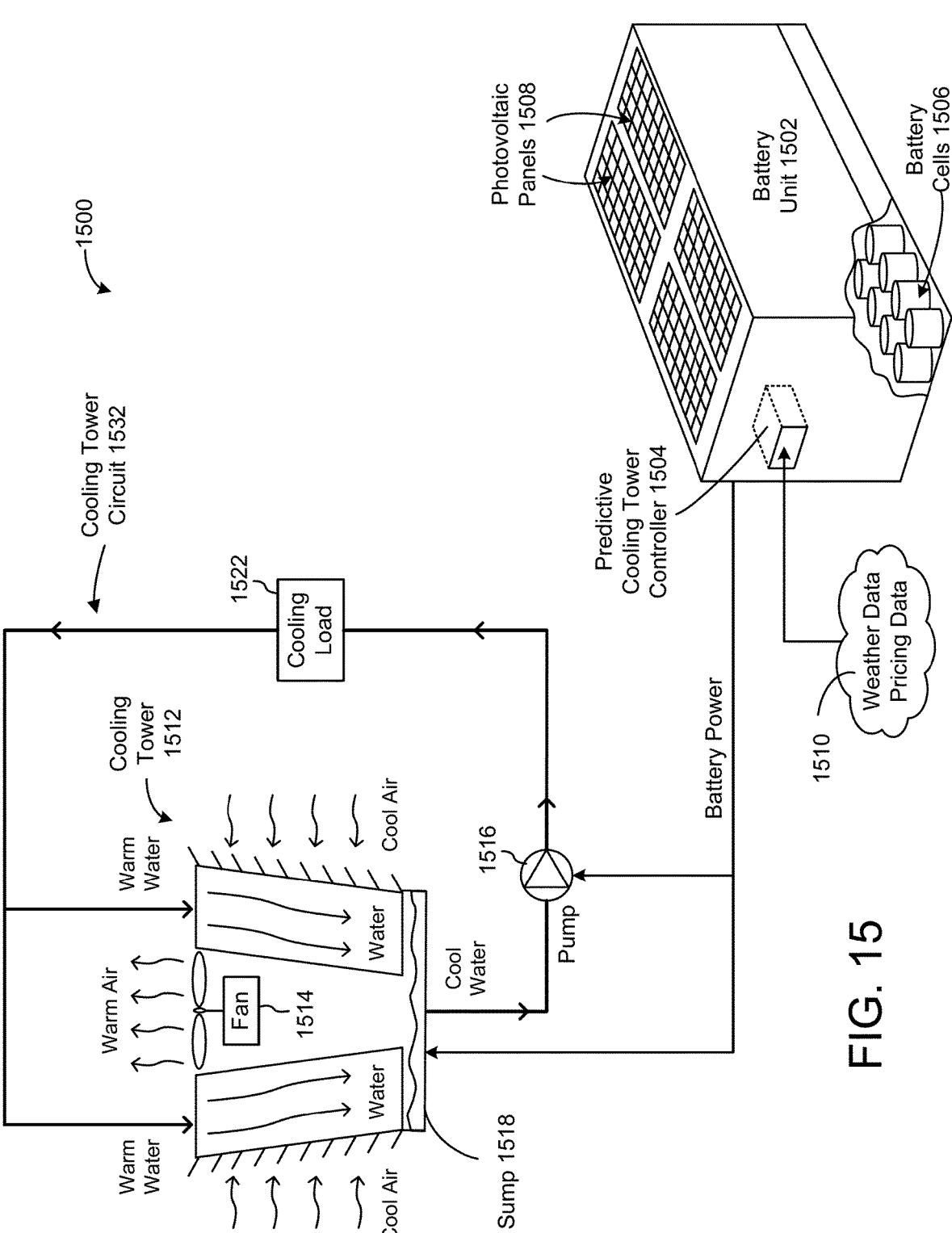
FIG. 15 is a drawing of a cooling tower unit with a battery unit and a predictive cooling tower controller, according to some embodiments.

Referring now to FIG. 15, a cooling tower system 1500 is shown, according to some embodiments. System 1500 is shown to include a cooling tower 1512 and a battery unit 1502 with a predictive cooling tower controller 1504. Cooling tower 1512 can be configured to provide cooling to a cooling load 1522. Cooling load 1522 can include, for example, a building zone, a supply airstream flowing through an air duct, an airflow in an air handling unit or rooftop unit, fluid flowing through a heat exchanger, a refrigerator or freezer, a condenser or evaporator, a cooling coil, or any other type of system, device, or space which requires cooling. In some embodiments, a pump 1516 circulates a chilled fluid to cooling load 1522 via a cooling tower circuit 1532. The chilled fluid can absorb heat from cooling load 1522, thereby providing cooling to cooling load 1522 and warming the chilled fluid.

Cooling tower 1512 can be configured to cool the water in cooling tower circuit 1532 by transferring heat from the water to outside air. Cooling tower 1512 may include a fan 1514 which causes cool air to flow through cooling tower 1512. Cooling tower 1512 places the cool air in a heat exchange relationship with the warmer water, thereby transferring heat from warmer water to the cooler air. Although cooling tower circuit 1532 is shown and described as circulating water, it should be understood that any type of coolant or working fluid (e.g., water, glycol, $CO_2$, etc.) can be used in cooling tower circuit 1532.

Still referring to FIG. 15, system 1500 is shown to include a battery unit 1502. In some embodiments, battery unit 1502 includes one or more photovoltaic (PV) panels 1508. PV panels 1508 may include a collection of photovoltaic cells. The photovoltaic cells are configured to convert solar energy (i.e., sunlight) into electricity using a photovoltaic material such as monocrystalline silicon, polycrystalline silicon, amorphous silicon, cadmium telluride, copper indium gallium selenide/sulfide, or other materials that exhibit the photovoltaic effect. In some embodiments, the photovoltaic cells are contained within packaged assemblies that form PV panels 1508. Each PV panel 1508 may include a plurality of linked photovoltaic cells. PV panels 1508 may combine to form a photovoltaic array.

In some embodiments, PV panels 1508 are configured to maximize solar energy collection. For example, battery unit 1502 may include a solar tracker (e.g., a GPS tracker, a sunlight sensor, etc.) that adjusts the angle of PV panels 1508 so that PV panels 1508 are aimed directly at the sun throughout the day. The solar tracker may allow PV panels 1508 to receive direct sunlight for a greater portion of the day and may increase the total amount of power produced by PV panels 1508. In some embodiments, battery unit 1502 includes a collection of mirrors, lenses, or solar concentrators configured to direct and/or concentrate sunlight on PV panels 1508. The energy generated by PV panels 1508 may be stored in battery cells 1506 and/or used to power various components of cooling tower 1512.

In some embodiments, battery unit 1502 includes one or more battery cells 1506. Battery cells 1506 are configured to store and discharge electric energy (i.e., electricity). In some embodiments, battery unit 1502 is charged using electricity from an external energy grid (e.g., provided by an electric utility). The electricity stored in battery unit 1502 can be discharged to power one or more powered components of cooling tower 1512 (e.g., fan 1514, pump 1516, etc.). Advantageously, battery unit 1502 allows cooling tower 1512 to draw electricity from the energy grid and charge battery unit 1502 when energy prices are low and discharge the stored electricity when energy prices are high to time-shift the electric load of cooling tower 1512. In some embodiments, battery unit 1502 has sufficient energy capacity to power cooling tower 1512 for approximately 4-6 hours when operating at maximum capacity such that battery unit 1502 can be utilized during high energy cost periods and charged during low energy cost periods.

In some embodiments, predictive cooling tower controller 1504 performs an optimization process to determine whether to charge or discharge battery unit 1502 during each of a plurality of time steps that occur during an optimization period. Predictive cooling tower controller 1504 may use weather and pricing data 1510 to predict the amount of heating/cooling required and the cost of electricity during each of the plurality of time steps. Predictive cooling tower controller 1504 can optimize an objective function that accounts for the cost of electricity purchased from the energy grid over the duration of the optimization period. In some embodiments, the objective function also accounts for the cost of operating various components of cooling tower 1512 (e.g., cost of natural gas used to fuel boilers). Predictive cooling tower controller 1504 can determine an amount of electricity to purchase from the energy grid and an amount of electricity to store or discharge from battery unit 1502 during each time step. The objective function and the optimization performed by predictive cooling tower controller 1504 are described in greater detail with reference to FIGS. 16-17.

Predictive Cooling Tower Control System

Figure 16:
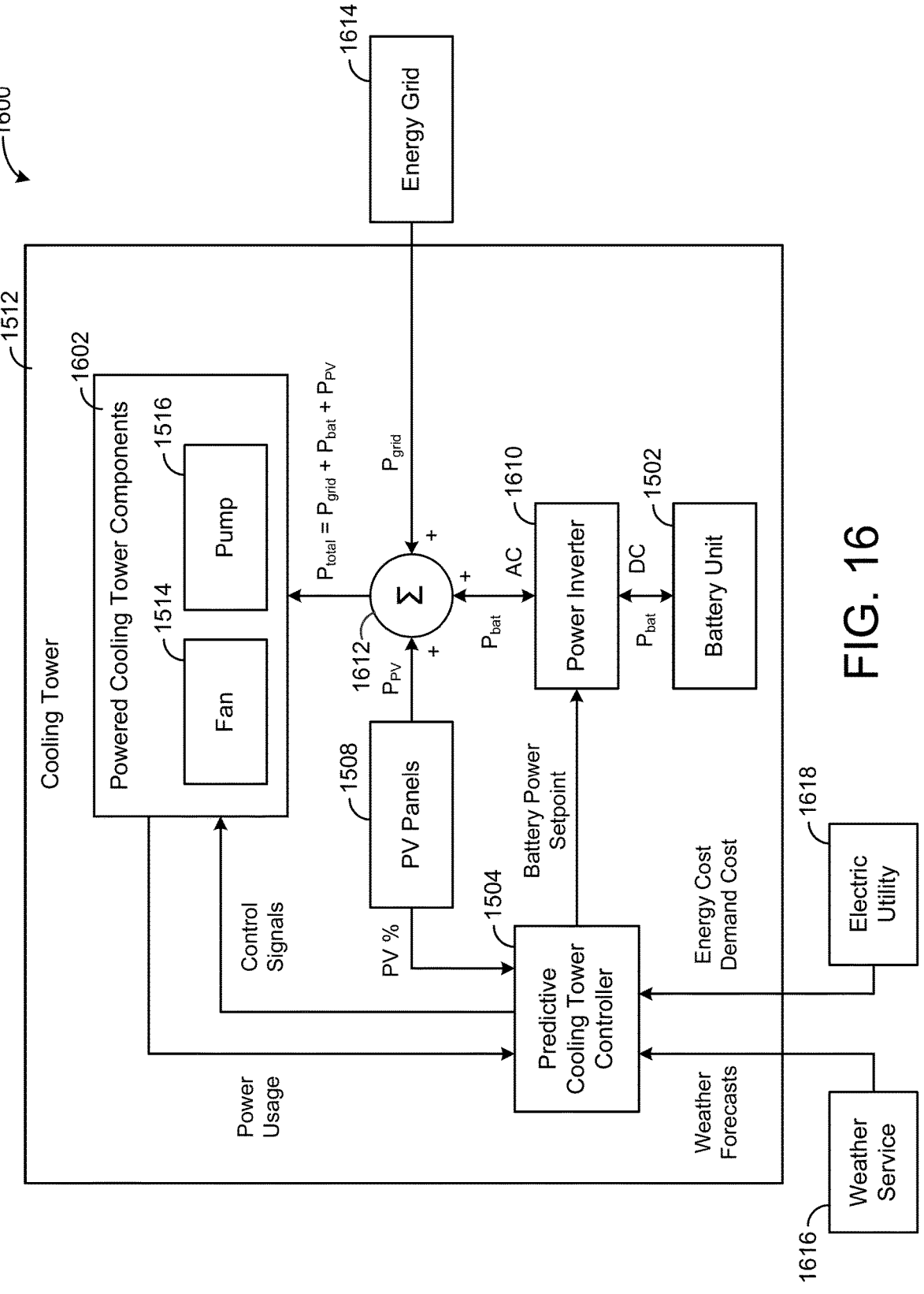
FIG. 16 is a block diagram of a predictive cooling tower control system including the battery unit and predictive cooling tower controller of FIG. 15, according to some embodiments.

Referring now to FIG. 16, a block diagram of a predictive cooling tower control system 1600 is shown, according to some embodiments. Several of the components shown in control system 1600 may be part of cooling tower 1512. For example, cooling tower 1512 may include powered cooling tower components 1602, battery unit 1502, predictive cooling tower controller 1504, power inverter 1610, and a power junction 1612. Powered cooling tower components 1602 may include any component of cooling tower 1512 that consumes power (e.g., electricity) during operation. For example, powered cooling tower components 1602 are shown to include cooling fan 1514 and pump 1516.

Power inverter 1610 may be configured to convert electric power between direct current (DC) and alternating current (AC). For example, battery unit 1502 may be configured to store and output DC power, whereas energy grid 1614 and powered cooling tower components 1602 may be configured to consume and provide AC power. Power inverter 1610 may be used to convert DC power from battery unit 1502 into a sinusoidal AC output synchronized to the grid frequency of energy grid 1614 and/or powered cooling tower components 1602. Power inverter 1610 may also be used to convert AC power from energy grid 1614 into DC power that can be stored in battery unit 1502. The power output of battery unit 1502 is shown as $P_{bat}$. $P_{bat}$ may be positive if battery unit 1502 is providing power to power inverter 1610 (i.e., battery unit 1502 is discharging) or negative if battery unit 1502 is receiving power from power inverter 1610 (i.e., battery unit 1502 is charging).

In some instances, power inverter 1610 receives a DC power output from battery unit 1502 and converts the DC power output to an AC power output that can be provided to powered cooling tower components 1602. Power inverter 1610 may synchronize the frequency of the AC power output with that of energy grid 1614 (e.g., 50 Hz or 60 Hz) using a local oscillator and may limit the voltage of the AC power output to no higher than the grid voltage. In some embodiments, power inverter 1610 is a resonant inverter that includes or uses LC circuits to remove the harmonics from a simple square wave in order to achieve a sine wave matching the frequency of energy grid 1614. In various embodiments, power inverter 1610 may operate using high-frequency transformers, low-frequency transformers, or without transformers. Low-frequency transformers may convert the DC output from battery unit 1502 directly to the AC output provided to powered cooling tower components 1602. High-frequency transformers may employ a multi-step process that involves converting the DC output to high-frequency AC, then back to DC, and then finally to the AC output provided to powered cooling tower components 1602.

The power output of PV panels 1508 is shown as $P_{PV}$. The power output $P_{PV}$ of PV panels 1508 can be stored in battery unit 1502 and/or used to power powered cooling tower components 1602. In some embodiments, PV panels 1508 measure the amount of power $P_{PV}$ generated by PV panels 1508 and provides an indication of the PV power to predictive cooling tower controller 1504. For example, PV panels 1508 are shown providing an indication of the PV power percentage (i.e., PV %) to predictive cooling tower controller 1504. The PV power percentage may represent a percentage of the maximum PV power at which PV panels 1508 are currently operating.

Power junction 1612 is the point at which powered cooling tower components 1602, energy grid 1614, PV panels 1508, and power inverter 1610 are electrically connected. The power supplied to power junction 1612 from power inverter 1610 is shown as $P_{bat}$. $P_{bat}$ may be positive if power inverter 1610 is providing power to power junction 1612 (i.e., battery unit 1502 is discharging) or negative if power inverter 1610 is receiving power from power junction 1612 (i.e., battery unit 1502 is charging). The power supplied to power junction 1612 from energy grid 1614 is shown as $P_{grid}$ and the power supplied to power junction 1612 from PV panels 1508 is shown as $P_{PV}$. $P_{bat}$, $P_{PV}$, and $P_{grid}$ combine at power junction 1612 to form $P_{total}$ (i.e., $P_{total}=P_{grid}+P_{bat}+P_{PV}$). $P_{total}$ may be defined as the power provided to powered cooling tower components 1602 from power junction 1612. In some instances, $P_{total}$ is greater than $P_{grid}$. For example, when battery unit 1502 is discharging, $P_{bat}$ may be positive which adds to the grid power $P_{grid}$ and the PV power $P_{PV}$ when $P_{bat}$ and $P_{PV}$ combine with $P_{grid}$ to form $P_{total}$. In other instances, $P_{total}$ may be less than $P_{grid}$. For example, when battery unit 1502 is charging, $P_{bat}$ may be negative which subtracts from the grid power $P_{grid}$ and the PV power $P_{PV}$ when $P_{bat}$, $P_{PV}$, and $P_{grid}$ combine to form $P_{total}$.

Predictive cooling tower controller 1504 can be configured to control powered cooling tower components 1602 and power inverter 1610. In some embodiments, predictive cooling tower controller 1504 generates and provides a battery power setpoint $P_{sp,bat}$ to power inverter 1610. The battery power setpoint $P_{sp,bat}$ may include a positive or negative power value (e.g., kW) which causes power inverter 1610 to charge battery unit 1502 (when $P_{sp,bat}$ is negative) using power available at power junction 1612 or discharge battery unit 1502 (when $P_{sp,bat}$ is positive) to provide power to power junction 1612 in order to achieve the battery power setpoint $P_{sp,bat}$.

In some embodiments, predictive cooling tower controller 1504 generates and provides control signals to powered cooling tower components 1602. Predictive cooling tower controller 1504 may use a multi-stage optimization technique to generate the control signals. For example, predictive cooling tower controller 1504 may include an economic controller configured to determine the optimal amount of power to be consumed by powered cooling tower components 1602 at each time step during the optimization period. The optimal amount of power to be consumed may minimize a cost function that accounts for the cost of energy consumed by cooling tower 1512. The cost of energy may be based on time-varying energy prices from electric utility 1618. In some embodiments, predictive cooling tower controller 1504 determines an optimal amount of power to purchase from energy grid 1614 (i.e., a grid power setpoint $P_{sp,grid}$) and an optimal amount of power to store or discharge from battery unit 1502 (i.e., a battery power setpoint $P_{sp,bat}$) at each of the plurality of time steps. Predictive cooling tower controller 1504 may monitor the actual power usage of powered cooling tower components 1602 and may utilize the actual power usage as a feedback signal when generating the optimal power setpoints.

Predictive cooling tower controller 1504 may include a tracking controller configured to generate temperature setpoints that achieve the optimal amount of power consumption at each time step. The temperature setpoints may include, for example, a sump water temperature setpoint $T_{sp,sump}$ (i.e., a temperature setpoint for the water in sump 1518) and/or a condenser water temperature setpoint $T_{sp,cond}$ (i.e., a temperature setpoint for the warm water returning to cooling tower 1512). In some embodiments, predictive cooling tower controller 1504 uses equipment models for powered cooling tower components 1602 to determine an amount of cooling that can be generated by cooling tower 1512 based on the optimal amount of power consumption.

In some embodiments, predictive cooling tower controller 1504 uses the temperature setpoints to generate the control signals for powered cooling tower components 1602. The control signals may include on/off commands, speed setpoints for fan 1514, differential pressure setpoints or flow rate setpoints for pump 1516, or other types of setpoints for individual devices of powered cooling tower components 1602. In other embodiments, the control signals may include the temperature setpoints (e.g., a sump water temperature setpoint $T_{sp,sump}$, a condenser water temperature setpoint $T_{sp,cond}$, etc.) generated by predictive cooling tower controller 1504. The temperature setpoints can be provided to powered cooling tower components 1602 or local controllers for powered cooling tower components 1602 which operate to achieve the temperature setpoints. For example, a local controller for fan 1514 may receive a measurement of the sump water temperature $T_{cump}$ from a sump water temperature sensor and/or a measurement the condenser temperature $T_{cond}$ from a condenser water temperature sensor. The local controller can use a feedback control process (e.g., PID, ESC, MPC, etc.) to increase or decrease the speed of fan 1514 to drive the measured temperature(s) to the temperature setpoint(s). Similar feedback control processes can be used to control pump 1516. The multi-stage optimization performed by predictive cooling tower controller 1504 is described in greater detail with reference to FIG. 17.

Predictive Cooling Tower Controller

Figure 17:
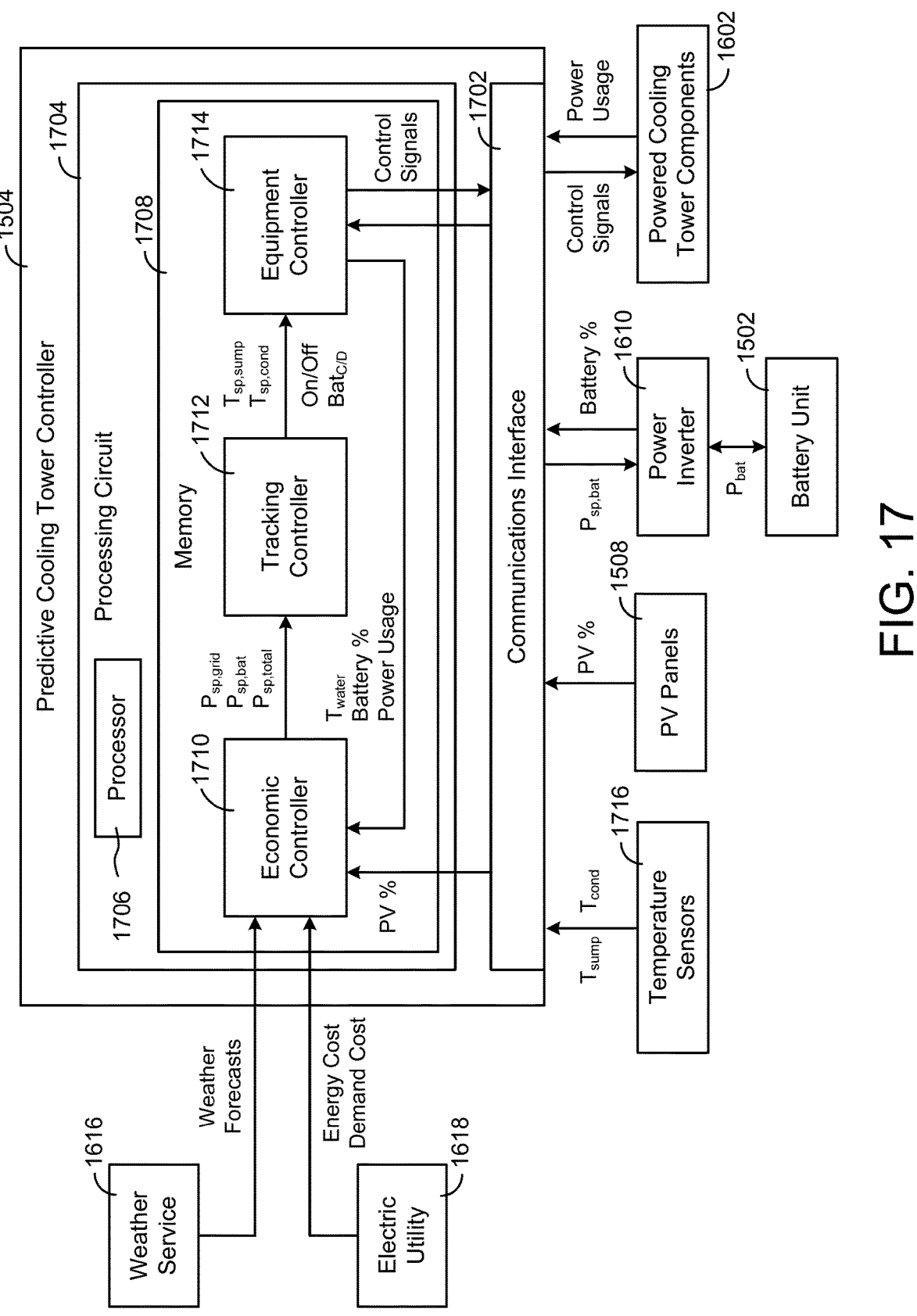
FIG. 17 is a block diagram illustrating the predictive cooling tower controller of FIG. 15 in greater detail, according to some embodiments.

Referring now to FIG. 17, a block diagram illustrating predictive cooling tower controller 1504 in greater detail is shown, according to an exemplary embodiment. Predictive cooling tower controller 1504 is shown to include a communications interface 1702 and a processing circuit 1704. Communications interface 1702 may facilitate communications between controller 1504 and external systems or devices. For example, communications interface 1702 may receive measurements of the sump water temperature $T_{sump}$ and the condenser water temperature $T_{cond}$ from temperature sensors 1716 and measurements of the power usage of powered cooling tower components 1602. In some embodiments, communications interface 1702 receives measurements of the state-of-charge (SOC) of battery unit 1502, which can be provided as a percentage of the maximum battery capacity (i.e., battery %). Communications interface 1702 can receive weather forecasts from a weather service 1616 and predicted energy costs and demand costs from an electric utility 1618. In some embodiments, predictive cooling tower controller 1504 uses communications interface 1702 to provide control signals powered cooling tower components 1602 and power inverter 1610.

Communications interface 1702 may include wired or wireless communications interfaces (e.g., jacks, antennas, transmitters, receivers, transceivers, wire terminals, etc.) for conducting data communications external systems or devices. In various embodiments, the communications may be direct (e.g., local wired or wireless communications) or via a communications network (e.g., a WAN, the Internet, a cellular network, etc.). For example, communications interface 1702 can include an Ethernet card and port for sending and receiving data via an Ethernet-based communications link or network. In another example, communications interface 1702 can include a Wi-Fi transceiver for communicating via a wireless communications network or cellular or mobile phone communications transceivers.

Processing circuit 1704 is shown to include a processor 1706 and memory 1708. Processor 1706 may be a general purpose or specific purpose processor, an application specific integrated circuit (ASIC), one or more field programmable gate arrays (FPGAs), a group of processing components, or other suitable processing components. Processor 1706 is configured to execute computer code or instructions stored in memory 1708 or received from other computer readable media (e.g., CDROM, network storage, a remote server, etc.).

Memory 1708 may include one or more devices (e.g., memory units, memory devices, storage devices, etc.) for storing data and/or computer code for completing and/or facilitating the various processes described in the present disclosure. Memory 1708 may include random access memory (RAM), read-only memory (ROM), hard drive storage, temporary storage, non-volatile memory, flash memory, optical memory, or any other suitable memory for storing software objects and/or computer instructions. Memory 1708 may include database components, object code components, script components, or any other type of information structure for supporting the various activities and information structures described in the present disclosure. Memory 1708 may be communicably connected to processor 1706 via processing circuit 1704 and may include computer code for executing (e.g., by processor 1706) one or more processes described herein. When processor 1706 executes instructions stored in memory 1708 for completing the various activities described herein, processor 1706 generally configures controller 1504 (and more particularly processing circuit 1704) to complete such activities.

Still referring to FIG. 17, predictive cooling tower controller 1504 is shown to include an economic controller 1710, a tracking controller 1712, and an equipment controller 1714. Controllers 1710-1714 can be configured to perform a multi-state optimization process to generate control signals for power inverter 1610 and powered cooling tower components 1602. In brief overview, economic controller 1710 can optimize a predictive cost function to determine an optimal amount of power to purchase from energy grid 1614 (i.e., a grid power setpoint $P_{sp,grid}$), an optimal amount of power to store or discharge from battery unit 1502 (i.e., a battery power setpoint $P_{sp,bat}$), and/or an optimal amount of power to be consumed by powered cooling tower components 1602 (i.e., a cooling tower power setpoint $P_{sp,total}$) at each time step of an optimization period. Tracking controller 1712 can use the optimal power setpoints $P_{sp,grid}$, $P_{sp,bat}$, and/or $P_{sp,total}$ to determine optimal temperature setpoints (e.g., a sump water temperature setpoint $T_{sp,sump}$, a condenser water temperature setpoint $T_{sp,cond}$, etc.) and an optimal battery charge or discharge rate (i.e., $Bat_{C/D}$). Equipment controller 1714 can use the optimal temperature setpoints $T_{sp,zone}$ or $T_{sp,chw}$ to generate control signals for powered cooling tower components 1602 that drive the actual (e.g., measured) temperatures $T_{zone}$ and/or $T_{am}$, to the setpoints (e.g., using a feedback control technique). Each of controllers 1710-1714 is described in detail below.

Economic Controller

Economic controller 1710 can be configured to optimize a predictive cost function to determine an optimal amount of power to purchase from energy grid 1614 (i.e., a grid power setpoint $P_{sp,grid}$), an optimal amount of power to store or discharge from battery unit 1502 (i.e., a battery power setpoint $P_{sp,bat}$), and/or an optimal amount of power to be consumed by powered cooling tower components 1602 (i.e., a cooling tower power setpoint $P_{sp,total}$) at each time step of an optimization period. An example of a predictive cost function which can be optimized by economic controller 1710 is shown in the following equation:

$$\min(J) = \sum_{k=1}^{h} C_{ec}(k)P_{fan}(k)\Delta t +$$

$$\sum_{k=1}^{h} C_{ec}(k)P_{pump}(k)\Delta t + C_{DC}\max_{k}(P_{grid}(k)) - \sum_{k=1}^{h} C_{ec}(k)P_{bat}(k)\Delta t$$

where $C_{ec}(k)$ is the cost per unit of electricity (e.g., \$/kWh) purchased from electric utility 1618 during time step k, $P_{fan}(k)$ is the power consumption (e.g., kW) of fan 1514 during time step k, $P_{pump}(k)$ is the power consumption of pump 1516 at time step k, $C_{DC}$ is the demand charge rate (e.g., \$/kW), where the max( ) term selects the maximum electricity purchase of cooling tower 1512 (i.e., the maximum value of $P_{grid}(k)$) during any time step k of the optimization period, $P_{bat}(k)$ is the amount of power discharged from battery unit 1502 during time step k, and $\Delta t$ is the duration of each time step k. Economic controller 1710 can optimize the predictive cost function J over the duration of the optimization period (e.g., from time step k=1 to time step k=h) to predict the total cost of operating cooling tower 1512 over the duration of the optimization period.

The first and second terms of the predictive cost function J represent the cost of electricity consumed by powered cooling tower components 1602 over the duration of the optimization period. The values of the parameter $C_{ec}(k)$ at each time step k can be defined by the energy cost information provided by electric utility 1618. In some embodiments, the cost of electricity varies as a function of time, which results in different values of $C_{ec}(k)$ at different time steps k. The variables $P_{fan}(k)$ and $P_{cond}(k)$ are decision variables which can be optimized by economic controller 1710. In some embodiments, the total power consumption $P_{total}(k)$ of powered cooling tower components 1602 at time step k is equal to the sum of $P_{fan}(k)$ and $P_{pump}(k)$ (i.e., $P_{total}(k)=P_{fan}(k)+P_{pump}(k)$). Accordingly, the first two terms of the predictive cost function can be replaced with the summation $$\sum_{k=1}^{h} C_{ec}(k)P_{total}(k)\Delta t$$

in some embodiments.

The third term of the predictive cost function J represents the demand charge. Demand charge is an additional charge imposed by some utility providers based on the maximum power consumption during an applicable demand charge period. For example, the demand charge rate $C_{DC}$ may be specified in terms of dollars per unit of power (e.g., \$/kW) and may be multiplied by the peak power usage (e.g., kW) during a demand charge period to calculate the demand charge. In the predictive cost function J, the demand charge rate $C_{DC}$ may be defined by the demand cost information received from electric utility 1618. The variable $P_{grid}(k)$ is a decision variable which can be optimized by economic controller 1710 in order to reduce the peak power usage $\max(P_{grid}(k))$ that occurs during the demand charge period.

Load shifting may allow economic controller 1710 to smooth momentary spikes in the electric demand of cooling tower 1512 by storing energy in battery unit 1502 when the power consumption of powered cooling tower components 1602 is low. The stored energy can be discharged from battery unit 1502 when the power consumption of powered cooling tower components 1602 is high in order to reduce the peak power draw $P_{grid}$ from energy grid 1614, thereby decreasing the demand charge incurred.

The final term of the predictive cost function J represents the cost savings resulting from the use of battery unit 1502. Unlike the previous terms in the cost function J, the final term subtracts from the total cost. The values of the parameter $C_{ec}(k)$ at each time step k can be defined by the energy cost information provided by electric utility 1618. In some embodiments, the cost of electricity varies as a function of time, which results in different values of $C_{ec}(k)$ at different time steps k. The variable $P_{bat}(k)$ is a decision variable which can be optimized by economic controller 1710. A positive value of $P_{bat}(k)$ indicates that battery unit 1502 is discharging, whereas a negative value of $P_{bat}(k)$ indicates that battery unit 1502 is charging. The power discharged from battery unit 1502 $P_{bat}(k)$ can be used to satisfy some or all of the total power consumption $P_{total}(k)$ of powered cooling tower components 1602, which reduces the amount of power $P_{grid}(k)$ purchased from energy grid 1614 (i.e., $P_{grid}(k)=P_{total}(k)-P_{bat}(k)-P_{PV}(k)$). However, charging battery unit 1502 results in a negative value of $P_{bat}(k)$ which adds to the total amount of power $P_{grid}(k)$ purchased from energy grid 1614.

In some embodiments, the power $P_{PV}$ provided by PV panels 1508 is not included in the predictive cost function J because generating PV power does not incur a cost. However, the power $P_{PV}$ generated by PV panels 1508 can be used to satisfy some or all of the total power consumption $P_{total}(k)$ of powered cooling tower components 1602, which reduces the amount of power $P_{grid}(k)$ purchased from energy grid 1614 (i.e., $P_{grid}(k)=P_{total}(k)-P_{bat}(k)-P_{PV}(k)$). The amount of PV power $P_{PV}$ generated during any time step k can be predicted by economic controller 1710. Several techniques for predicting the amount of PV power generated by PV panels are described in U.S. patent application Ser. No. 15/247,869, U.S. patent application Ser. No. 15/247, 844, and U.S. patent application Ser. No. 15/247,788. Each of these patent applications has a filing date of Aug. 25, 2016, and the entire disclosure of each of these patent applications is incorporated by reference herein.

Economic controller 1710 can optimize the predictive cost function J over the duration of the optimization period to determine optimal values of the decision variables at each time step during the optimization period. In some embodiments, the optimization period has a duration of approximately one day and each time step is approximately fifteen minutes. However, the durations of the optimization period and the time steps can vary in other embodiments and can be adjusted by a user. Advantageously, economic controller 1710 can use battery unit 1502 to perform load shifting by drawing electricity from energy grid 1614 when energy prices are low and/or when the power consumed by powered cooling tower components 1602 is low. The electricity can be stored in battery unit 1502 and discharged later when energy prices are high and/or the power consumption of powered cooling tower components 1602 is high. This enables economic controller 1710 to reduce the cost of electricity consumed by cooling tower 1512 and can smooth momentary spikes in the electric demand of cooling tower 1512, thereby reducing the demand charge incurred.

Economic controller 1710 can be configured to impose constraints on the optimization of the predictive cost function J. In some embodiments, the constraints include constraints on the temperature $T_{sump}$ of the sump water produced by cooling tower 1512. Economic controller 1710 can be configured to maintain the actual or predicted temperature $T_{zump}$ between a minimum temperature bound $T_{min}$ and a maximum temperature bound $T_{max}$ (i.e., $T_{min} \leq T_{sump} \leq T_{max}$) at all times. Similarly, economic controller 1710 can be configured to maintain the actual or predicted temperature $T_{cond}$ between a minimum temperature bound $T_{min}$ and a maximum temperature bound $T_{max}$ (i.e., $T_{min} \leq T_{cond} \leq T_{max}$) at all times. The parameters $T_{min}$ and $T_{max}$ may be time-varying to define different temperature ranges at different times.

In order to ensure that the temperature constraints are satisfied, economic controller 1710 can model the temperatures $T_{sump}$ and $T_{cond}$ as a function of the decision variables optimized by economic controller 1710. Several techniques for developing temperature models and relating temperatures to the decision variables in the predictive cost function J are described in greater detail in U.S. Pat. No. 9,436,179 granted Sep. 6, 2016, U.S. patent application Ser. No. 14/694,633 filed Apr. 23, 2015, and U.S. patent application Ser. No. 15/199,910 filed Jun. 30, 2016. The entire disclosure of each of these patents and patent applications is incorporated by reference herein.

In addition to constraints on the temperature $T_{sump}$ and $T_{cond}$, economic controller 1710 can impose constraints on the state-of-charge (SOC) and charge/discharge rates of battery unit 1502. In some embodiments, economic controller 1710 generates and imposes the following power constraints on the predictive cost function J:

$$P_{bat} \leq P_{rated}$$

$$-P_{bat} \leq P_{rated}$$

where $P_{bat}$ is the amount of power discharged from battery unit 1502 and $P_{rated}$ is the rated battery power of battery unit 1502 (e.g., the maximum rate at which battery unit 1502 can be charged or discharged). These power constraints ensure that battery unit 1502 is not charged or discharged at a rate that exceeds the maximum possible battery charge/discharge rate $P_{rated}$.

In some embodiments, economic controller 1710 generates and imposes one or more capacity constraints on the predictive cost function J The capacity constraints may be used to relate the battery power $P_{bat}$ charged or discharged during each time step to the capacity and SOC of battery unit 1502. The capacity constraints may ensure that the capacity of battery unit 1502 is maintained within acceptable lower and upper bounds at each time step of the optimization period. In some embodiments, economic controller 1710 generates the following capacity constraints:

$$C_a(k) - P_{bat}(k)\Delta t \leq C_{rated}$$

$$C_a(k) - P_{bat}(k)\Delta t \geq 0$$

where $C_a(k)$ is the available battery capacity (e.g., kWh) at the beginning of time step k, $P_{bat}(k)$ is the rate at which battery unit 1502 is discharged during time step k (e.g., kW), $\Delta t$ is the duration of each time step, and $C_{rated}$ is the maximum rated capacity of battery unit 1502 (e.g., kWh). The term $P_{bat}(k)\Delta t$ represents the change in battery capacity during time step k. These capacity constraints ensure that the capacity of battery unit 1502 is maintained between zero and the maximum rated capacity $C_{rated}$.

In some embodiments, economic controller 1710 generates and imposes one or more capacity constraints on the operation of powered cooling tower components 1602. For example, powered cooling tower components 1602 may have a maximum operating point (e.g., a maximum pump speed, a maximum cooling capacity, etc.) which corresponds to a maximum power consumption $P_{total,max}$. Economic controller 1710 can be configured to generate a constraint which limits the power $P_{total}$ provided to powered cooling tower components 1602 between zero and the maximum power consumption $P_{total}$,max as shown in the following equation:

$$0 \leq P_{total} \leq P_{total,max}$$

$$P_{total} = P_{sp,grid} + P_{sp,bat}$$

where the total power $P_{total}$ provided to powered cooling tower components 1602 is the sum of the grid power setpoint $P_{sp,grid}$ and the battery power setpoint $P_{sp,bat}$.

Economic controller 1710 can optimize the predictive cost function J subject to the constraints to determine optimal values for the decision variables $P_{total}$, $P_{fan}$, $P_{pump}$, $P_{grid}$, and $P_{bat}$, where $P_{total}=P_{bat}+P_{grid}+P_{PV}$ In some embodiments, economic controller 1710 uses the optimal values for $P_{total}$, $P_{bat}$, and/or $P_{grid}$ to generate power setpoints for tracking controller 1712. The power setpoints can include battery power setpoints $P_{sp,bat}$, grid power setpoints $P_{sp,grid}$, and/or cooling tower power setpoints $P_{sp,total}$ for each of the time steps k in the optimization period. Economic controller 1710 can provide the power setpoints to tracking controller 1712.

Tracking Controller

Tracking controller 1712 can use the optimal power setpoints $P_{sp,grid}$, $P_{sp,bat}$, and/or $P_{sp,total}$ generated by economic controller 1710 to determine optimal temperature setpoints (e.g., a sump water temperature setpoint $T_{sp,sump}$, a condenser water temperature setpoint $T_{sp,cond}$ etc.) and an optimal battery charge or discharge rate (i.e., $Bat_{C/D}$). In some embodiments, tracking controller 1712 generates a sump water temperature setpoint $T_{sp,sump}$ and/or a condenser water temperature setpoint $T_{sp,cond}$ that are predicted to achieve the power setpoint $P_{sp,total}$ for cooling tower 1512. In other words, tracking controller 1712 may generate a sump water temperature setpoint $T_{sp,sump}$ and/or a condenser water temperature setpoint $T_{sp,cond}$ that cause cooling tower 1512 to consume the optimal amount of power $P_{total}$ determined by economic controller 1710.

In some embodiments, tracking controller 1712 relates the power consumption of cooling tower 1512 to the sump water temperature $T_{sump}$ and the sump water temperature setpoint $T_{sp,sump}$ using a power consumption model. For example, tracking controller 1712 can use a model of equipment controller 1714 to determine the control action performed by equipment controller 1714 as a function of the sump water temperature $T_{sump}$ and the sump water temperature setpoint $T_{sp,sump}$. An example of such a zone regulatory controller model is shown in the following equation:

$$P_{total} = f_4(T_{sump}, T_{sp,sump})$$

The function $f_4$ can be identified from data. For example, tracking controller 1712 can collect measurements of $P_{total}$ and $T_{sump}$ and identify the corresponding value of $T_{sp,sump}$. Tracking controller 1712 can perform a system identification process using the collected values of $P_{total}$, $T_{sump}$, and $T_{sp,sump}$ as training data to determine the function $f_4$ that defines the relationship between such variables.

Tracking controller 1712 may use a similar model to determine the relationship between the total power consumption $P_{total}$ of cooling tower 1512 and the condenser water temperature setpoint $T_{sp,cond}$ For example, tracking controller 1712 can define the power consumption $P_{total}$ of cooling tower 1512 as a function of the condenser water temperature $T_{cond}$ and the condenser water temperature setpoint $T_{sp,cond}$ An example of such a model is shown in the following equation:

$$P_{total} = f_5(T_{cond}, T_{sp,cond})$$

The function $f_5$ can be identified from data. For example, tracking controller 1712 can collect measurements of P total and $T_{cond}$ and identify the corresponding value of $T_{sp,cond}$. Tracking controller 1712 can perform a system identification process using the collected values of $P_{total}$, $T_{cond}$, and $T_{sp,cond}$ as training data to determine the function $f_5$ that defines the relationship between such variables.

Tracking controller 1712 can use the relationships between $P_{total}$, $T_{sp}$,sump, and $T_{sp,cond}$ to determine values for $T_{sp,sump}$ and $T_{sp,cond}$. For example, tracking controller 1712 can receive the value of $P_{total}$ as an input from economic controller 1710 (i.e., $P_{sp,total}$) and can use determine corresponding values of $T_{sp,sump}$ and $T_{sp,cond}$. Tracking controller 1712 can provide the values of $T_{sp,sump}$ and $T_{sp,cond}$ as outputs to equipment controller 1714.

In some embodiments, tracking controller 1712 uses the battery power setpoint $P_{sp,bat}$ to determine the optimal rate $Bat_{C/D}$ at which to charge or discharge battery unit 1502. For example, the battery power setpoint $P_{sp,bat}$ may define a power value (kW) which can be translated by tracking controller 1712 into a control signal for power inverter 1610 and/or equipment controller 1714. In other embodiments, the battery power setpoint $P_{sp,bat}$ is provided directly to power inverter 1610 and used by power inverter 1610 to control the battery power $P_{bat}$.

Equipment Controller

Equipment controller 1714 can use the optimal temperature setpoints $T_{sp,sump}$ or $T_{sp,cond}$ generated by tracking controller 1712 to generate control signals for powered cooling tower components 1602. The control signals generated by equipment controller 1714 may drive the actual (e.g., measured) temperatures $T_{sump}$ and/or $T_{cond}$ to the setpoints. Equipment controller 1714 can use any of a variety of control techniques to generate control signals for powered cooling tower components 1602. For example, equipment controller 1714 can use state-based algorithms, extremum seeking control (ESC) algorithms, proportional-integral (PI) control algorithms, proportional-integral-derivative (PID) control algorithms, model predictive control (MPC) algorithms, or other feedback control algorithms, to generate control signals for powered cooling tower components 1602.

The control signals may include on/off commands, speed setpoints for fan 1514, pressure setpoints or flow rate setpoints for pump 1516, or other types of setpoints for individual devices of powered cooling tower components 1602. In other embodiments, the control signals may include the temperature setpoints (e.g., a sump water temperature setpoint $T_{sp,sump}$, a condenser water temperature setpoint $T_{sp,cond}$, etc.) generated by predictive cooling tower controller 1504. The temperature setpoints can be provided to powered cooling tower components 1602 or local controllers for powered cooling tower components 1602 which operate to achieve the temperature setpoints. For example, a local controller for fan 1514 may receive a measurement of the sump water temperature $T_{sump}$ and/or a measurement the condenser water temperature $T_{cond}$ from temperature sensors 1716 and can modulate the speed of fan 1514 to drive the measured temperatures to the setpoints.

In some embodiments, equipment controller 1714 is configured to provide control signals to power inverter 1610. The control signals provided to power inverter 1610 can include a battery power setpoint $P_{sp,bat}$ and/or the optimal charge/discharge rate $Bat_{C/D}$. Equipment controller 1714 can be configured to operate power inverter 1610 to achieve the battery power setpoint $P_{sp,bat}$. For example, equipment controller 1714 can cause power inverter 1610 to charge battery unit 1502 or discharge battery unit 1502 in accordance with the battery power setpoint $P_{sp,bat}$.

Valve Unit with Battery and Predictive Control

Figure 18:
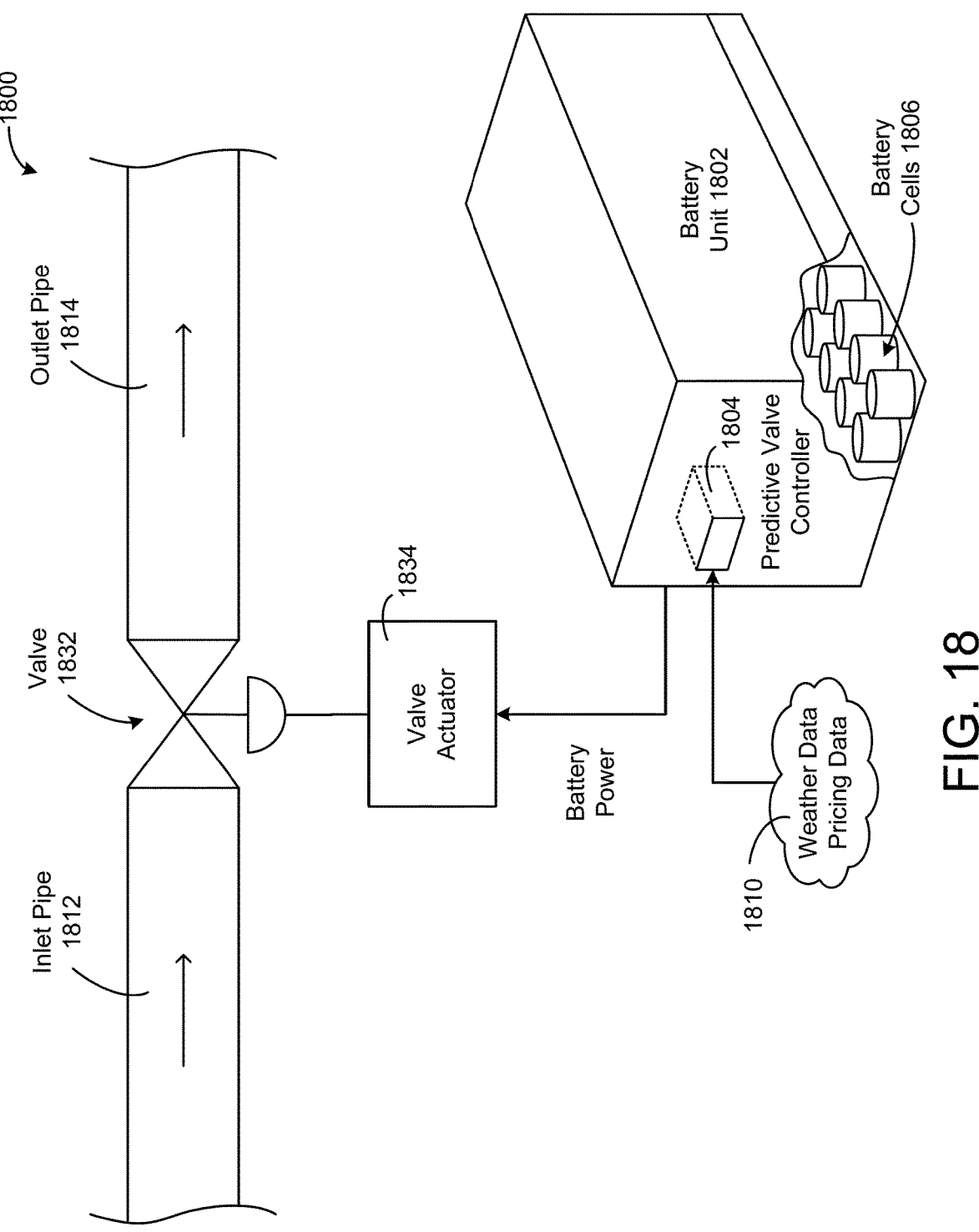
FIG. 18 is a drawing of a valve unit with a battery unit and a predictive valve controller, according to some embodiments.
Figure 19:
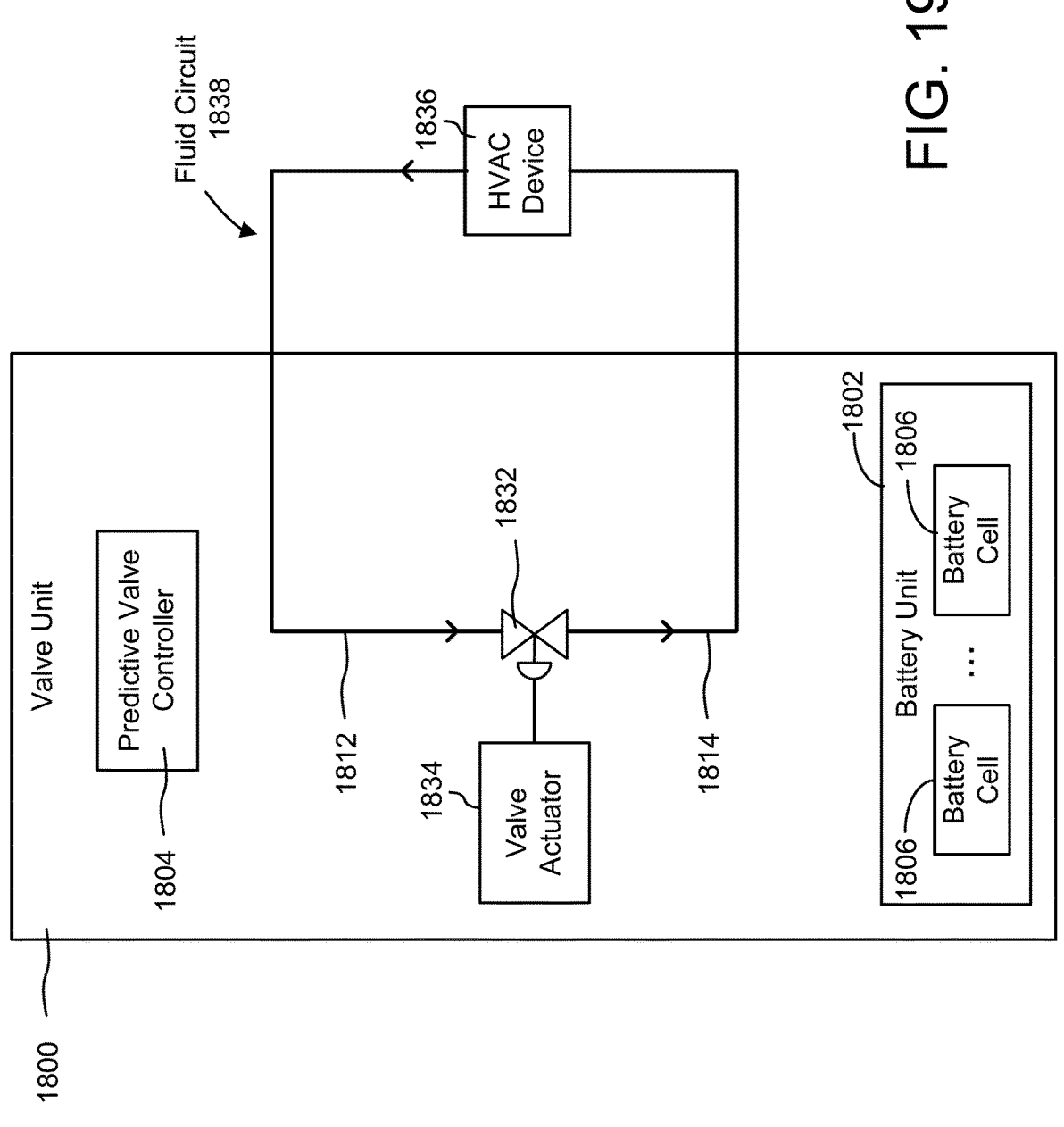
FIG. 19 is a block diagram of the valve unit of FIG. 18, according to some embodiments.

Referring now to FIGS. 18-19, a valve unit 1800 with a battery unit 1802 and predictive valve controller 1804 is shown, according to some embodiments. Valve unit 1800 can be configured to control a valve 1832 via a valve actuator 1834. Valve 1832 can be a fluid control valve configured to control the flowrate of fluid from an inlet pipe 1812 to an outlet pipe 1814. Actuator 1834 may include a motor or other powered component configured to modulate the position of valve 1832. In some embodiments, valve unit 1800 is configured to control the flow of fluid through a HVAC device 1836 via a fluid circuit 1838. HVAC device 1836 may include, for example, a heating coil or cooling coil, an air handling unit, a rooftop unit, a heat exchanger, a refrigerator or freezer, a condenser or evaporator, a cooling tower, or any other type of system or device that receives a fluid in a HVAC system.

In some embodiments, battery unit 1802 includes one or more battery cells 1806. Battery cells 1806 are configured to store and discharge electric energy (i.e., electricity). In some embodiments, battery unit 1802 is charged using electricity from an external energy grid (e.g., provided by an electric utility). The electricity stored in battery unit 1802 can be discharged to power one or more powered components of valve unit 1800 (e.g., actuator 1834). Advantageously, battery unit 1802 allows valve unit 1800 to draw electricity from the energy grid and charge battery unit 1802 when energy prices are low and discharge the stored electricity when energy prices are high to time-shift the electric load of valve unit 1800. In some embodiments, battery unit 1802 has sufficient energy capacity to power valve unit 1800 for approximately 4-6 hours when operating at maximum capacity such that battery unit 1802 can be utilized during high energy cost periods and charged during low energy cost periods.

In some embodiments, predictive valve controller 1804 performs an optimization process to determine whether to charge or discharge battery unit 1802 during each of a plurality of time steps that occur during an optimization period. Predictive valve controller 1804 may use weather and pricing data 1810 to predict the amount of heating/cooling required and the cost of electricity during each of the plurality of time steps. Predictive valve controller 1804 can optimize an objective function that accounts for the cost of electricity purchased from the energy grid over the duration of the optimization period. Predictive valve controller 1804 can determine an amount of electricity to purchase from the energy grid and an amount of electricity to store or discharge from battery unit 1802 during each time step. The objective function and the optimization performed by predictive valve controller 1804 are described in greater detail with reference to FIGS. 20-21.

Predictive Valve Control System

Figure 20:
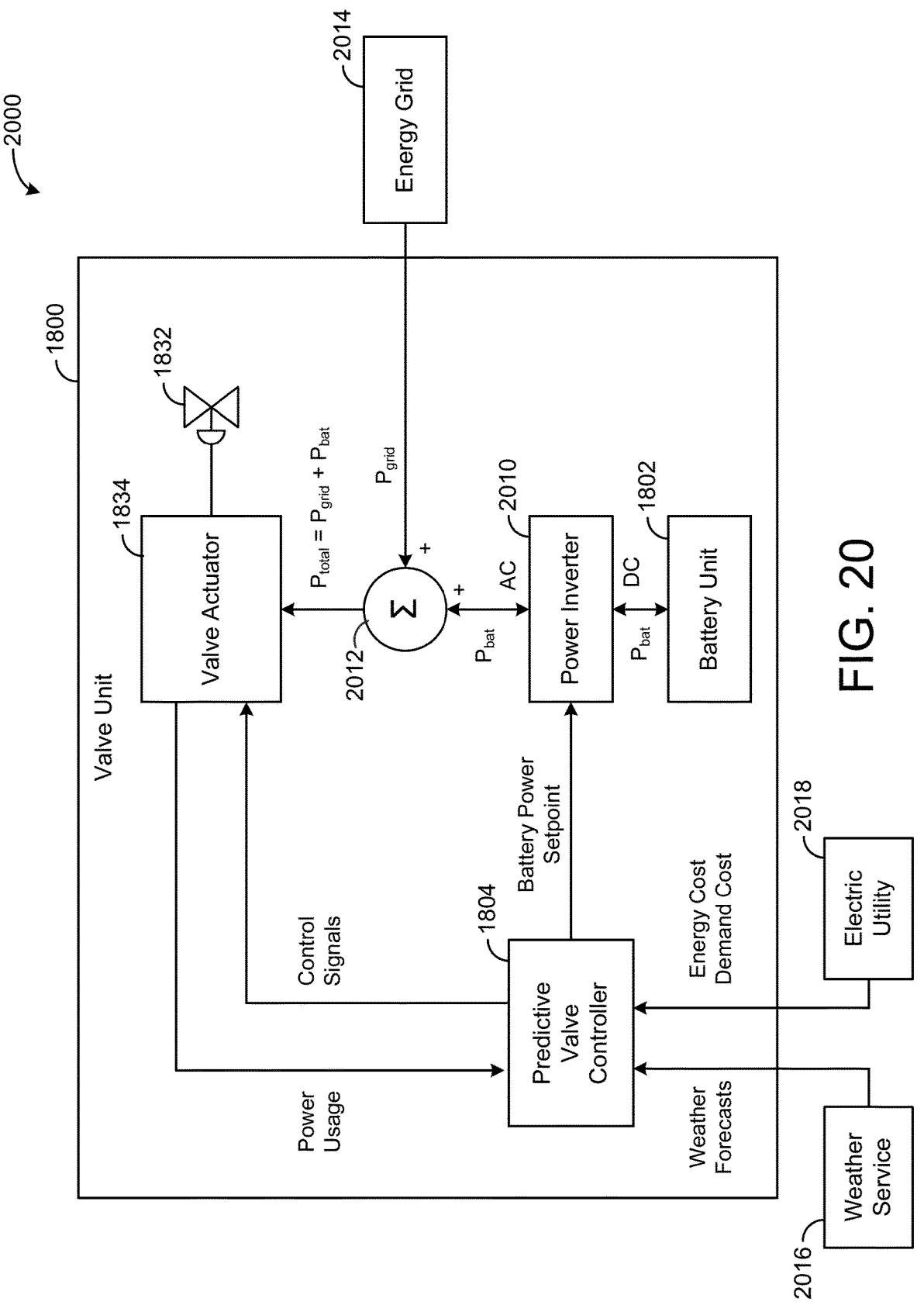
FIG. 20 is a block diagram of a predictive valve control system including the battery unit and predictive valve controller of FIG. 18, according to some embodiments.

Referring now to FIG. 20, a block diagram of a predictive valve control system 2000 is shown, according to some embodiments. Several of the components shown in control system 2000 may be part of valve unit 1800. For example, valve unit 1800 may include actuator 1834, battery unit 1802, predictive valve controller 1804, power inverter 2010, and a power junction 2012.

Power inverter 2010 may be configured to convert electric power between direct current (DC) and alternating current (AC). For example, battery unit 1802 may be configured to store and output DC power, whereas energy grid 2014 and actuator 1834 may be configured to consume and provide AC power. Power inverter 2010 may be used to convert DC power from battery unit 1802 into a sinusoidal AC output synchronized to the grid frequency of energy grid 2014 and/or actuator 1834. Power inverter 2010 may also be used to convert AC power from energy grid 2014 into DC power that can be stored in battery unit 1802. The power output of battery unit 1802 is shown as $P_{bat}$. $P_{bat}$ may be positive if battery unit 1802 is providing power to power inverter 2010 (i.e., battery unit 1802 is discharging) or negative if battery unit 1802 is receiving power from power inverter 2010 (i.e., battery unit 1802 is charging).

In some instances, power inverter 2010 receives a DC power output from battery unit 1802 and converts the DC power output to an AC power output that can be provided to actuator 1834. Power inverter 2010 may synchronize the frequency of the AC power output with that of energy grid 2014 (e.g., 50 Hz or 60 Hz) using a local oscillator and may limit the voltage of the AC power output to no higher than the grid voltage. In some embodiments, power inverter 2010 is a resonant inverter that includes or uses LC circuits to remove the harmonics from a simple square wave in order to achieve a sine wave matching the frequency of energy grid 2014. In various embodiments, power inverter 2010 may operate using high-frequency transformers, low-frequency transformers, or without transformers. Low-frequency transformers may convert the DC output from battery unit 1802 directly to the AC output provided to actuator 1834. High-frequency transformers may employ a multi-step process that involves converting the DC output to high-frequency AC, then back to DC, and then finally to the AC output provided to actuator 1834.

Power junction 2012 is the point at which actuator 1834, energy grid 2014, and power inverter 2010 are electrically connected. The power supplied to power junction 2012 from power inverter 2010 is shown as $P_{bat}$. $P_{bat}$ may be positive if power inverter 2010 is providing power to power junction 2012 (i.e., battery unit 1802 is discharging) or negative if power inverter 2010 is receiving power from power junction 2012 (i.e., battery unit 1802 is charging). The power supplied to power junction 2012 from energy grid 2014 is shown as $P_{grid}$. $P_{bat}$ and $P_{grid}$ combine at power junction 2012 to form $P_{total}$ (i.e. $P_{total}=P_{grid}+P_{bat}$). $P_{total}$ may be defined as the power provided to actuator 1834 from power junction 2012. In some instances, $P_{total}$ is greater than $P_{grid}$. For example, when battery unit 1802 is discharging, $P_{bat}$ may be positive which adds to the grid power $P_{grid}$ when $P_{bat}$ combines with $P_{grid}$ to form $P_{total}$. In other instances, $P_{total}$ may be less than $P_{grid}$. For example, when battery unit 1802 is charging, $P_{bat}$ may be negative which subtracts from the grid power $P_{grid}$ when $P_{bat}$ and $P_{grid}$ combine to form $P_{total}$.

Predictive valve controller 1804 can be configured to control actuator 1834 and power inverter 2010. In some embodiments, predictive valve controller 1804 generates and provides a battery power setpoint $P_{sp,bat}$ to power inverter 2010. The battery power setpoint $P_{sp,bat}$ may include a positive or negative power value (e.g., kW) which causes power inverter 2010 to charge battery unit 1802 (when $P_{sp,bat}$ is negative) using power available at power junction 2012 or discharge battery unit 1802 (when $P_{sp,bat}$ is positive) to provide power to power junction 2012 in order to achieve the battery power setpoint $P_{sp,bat}$.

In some embodiments, predictive valve controller 1804 generates and provides control signals to actuator 1834. Predictive valve controller 1804 may use a multi-stage optimization technique to generate the control signals. For example, predictive valve controller 1804 may include an economic controller configured to determine the optimal amount of power to be consumed by actuator 1834 at each time step during the optimization period. The optimal amount of power to be consumed may minimize a cost function that accounts for the cost of energy consumed by valve unit 1800. The cost of energy may be based on time-varying energy prices from electric utility 2018. In some embodiments, predictive valve controller 1804 determines an optimal amount of power to purchase from energy grid 2014 (i.e., a grid power setpoint $P_{sp,grid}$) and an optimal amount of power to store or discharge from battery unit 1802 (i.e., a battery power setpoint $P_{sp,bat}$) at each of the plurality of time steps. Predictive valve controller 1804 may monitor the actual power usage of actuator 1834 and may utilize the actual power usage as a feedback signal when generating the optimal power setpoints.

Predictive valve controller 1804 may include a tracking controller configured to generate position setpoints for actuator 1834 that achieve the optimal amount of power consumption at each time step. In some embodiments, predictive valve controller 1804 uses an equipment model for actuator 1834 to determine an a position of actuator 1834 that corresponds to the optimal amount of power consumption.

In some embodiments, predictive valve controller 1804 uses the position setpoints to generate the control signals for actuator 1834. The control signals may include on/off commands, position commands, voltage signals, or other types of setpoints that affect the operation of actuator 1834. In other embodiments, the control signals may include the position setpoints generated by predictive valve controller 1804. The setpoints can be provided to actuator 1834 or local controllers for actuator 1834 which operate to achieve the setpoints. For example, a local controller for actuator 1834 may receive a measurement of the valve position from one or more position sensors. The local controller can use a feedback control process (e.g., PID, ESC, MPC, etc.) to adjust the position of actuator 1834 and/or valve 1832 to drive the measured position to the setpoint(s). The multi-stage optimization performed by predictive valve controller 1804 is described in greater detail with reference to FIG. 21.

Predictive Valve Controller

Figure 21:
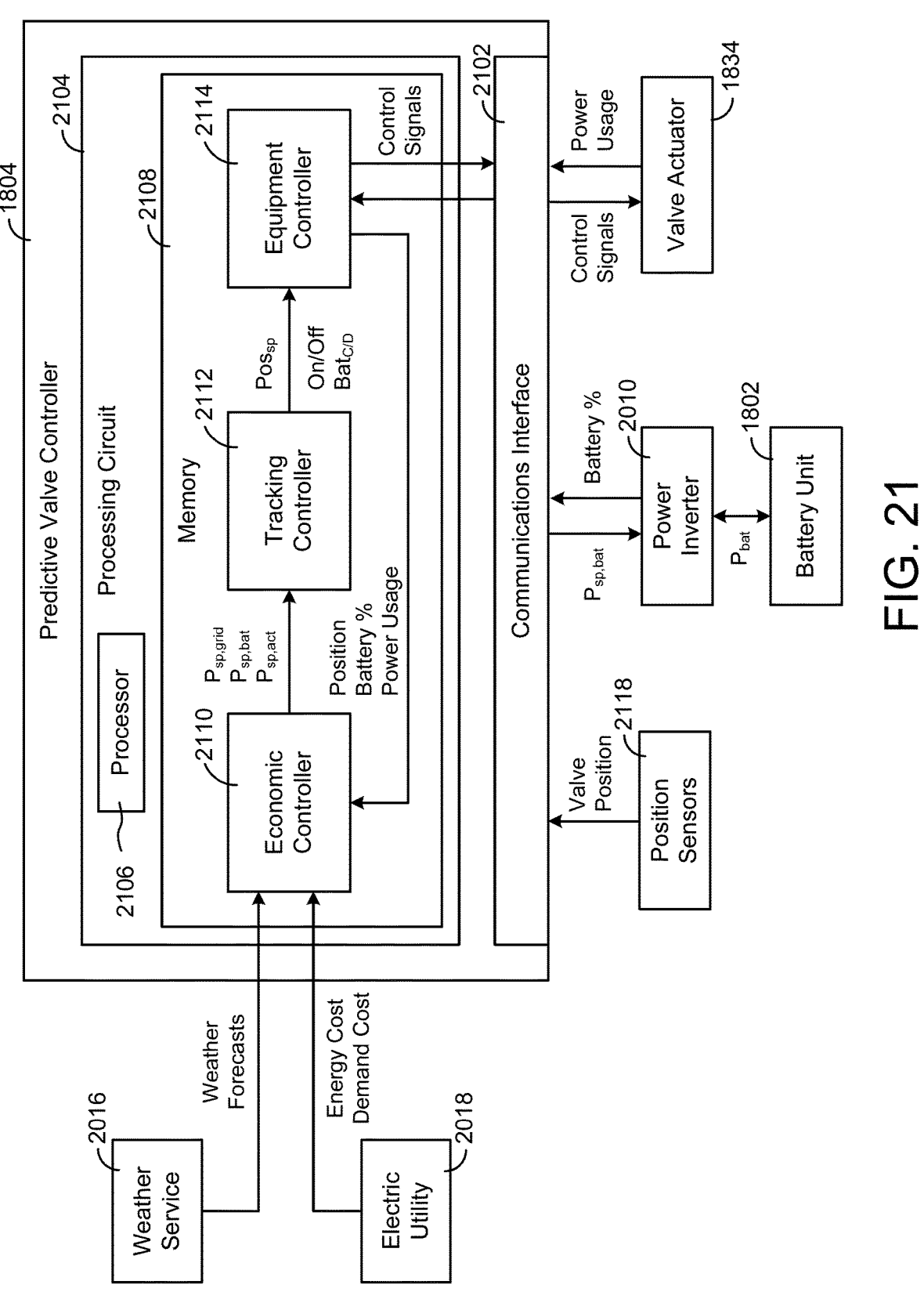
FIG. 21 is a block diagram illustrating the predictive valve controller of FIG. 18 in greater detail, according to some embodiments.

Referring now to FIG. 21, a block diagram illustrating predictive valve controller 1804 in greater detail is shown, according to an exemplary embodiment. Predictive valve controller 1804 is shown to include a communications interface 2102 and a processing circuit 2104. Communications interface 2102 may facilitate communications between controller 1804 and external systems or devices. For example, communications interface 2102 may receive measurements of the valve position from position sensors 2118 and measurements of the power usage of actuator 1834. In some embodiments, communications interface 2102 receives measurements of the state-of-charge (SOC) of battery unit 1802, which can be provided as a percentage of the maximum battery capacity (i.e., battery %). Communications interface 2102 can receive weather forecasts from a weather service 916 and predicted energy costs and demand costs from an electric utility 2018. In some embodiments, predictive valve controller 1804 uses communications interface 2102 to provide control signals actuator 1834 and power inverter 2010.

Communications interface 2102 may include wired or wireless communications interfaces (e.g., jacks, antennas, transmitters, receivers, transceivers, wire terminals, etc.) for conducting data communications external systems or devices. In various embodiments, the communications may be direct (e.g., local wired or wireless communications) or via a communications network (e.g., a WAN, the Internet, a cellular network, etc.). For example, communications interface 2102 can include an Ethernet card and port for sending and receiving data via an Ethernet-based communications link or network. In another example, communications interface 2102 can include a Wi-Fi transceiver for communicating via a wireless communications network or cellular or mobile phone communications transceivers.

Processing circuit 2104 is shown to include a processor 2106 and memory 2108. Processor 2106 may be a general purpose or specific purpose processor, an application specific integrated circuit (ASIC), one or more field programmable gate arrays (FPGAs), a group of processing components, or other suitable processing components. Processor 2106 is configured to execute computer code or instructions stored in memory 2108 or received from other computer readable media (e.g., CDROM, network storage, a remote server, etc.).

Memory 2108 may include one or more devices (e.g., memory units, memory devices, storage devices, etc.) for storing data and/or computer code for completing and/or facilitating the various processes described in the present disclosure. Memory 2108 may include random access memory (RAM), read-only memory (ROM), hard drive storage, temporary storage, non-volatile memory, flash memory, optical memory, or any other suitable memory for storing software objects and/or computer instructions. Memory 2108 may include database components, object code components, script components, or any other type of information structure for supporting the various activities and information structures described in the present disclosure. Memory 2108 may be communicably connected to processor 2106 via processing circuit 2104 and may include computer code for executing (e.g., by processor 2106) one or more processes described herein. When processor 2106 executes instructions stored in memory 2108 for completing the various activities described herein, processor 2106 generally configures controller 1804 (and more particularly processing circuit 2104) to complete such activities.

Still referring to FIG. 21, predictive valve controller 1804 is shown to include an economic controller 2110, a tracking controller 2112, and an equipment controller 2114. Controllers 2110-2114 can be configured to perform a multi-state optimization process to generate control signals for power inverter 2010 and actuator 1834. In brief overview, economic controller 2110 can optimize a predictive cost function to determine an optimal amount of power to purchase from energy grid 2014 (i.e., a grid power setpoint $P_{sp,grid}$), an optimal amount of power to store or discharge from battery unit 1802 (i.e., a battery power setpoint $P_{sp,bat}$), and/or an optimal amount of power to be consumed by actuator 1834 (i.e., a pump power setpoint $P_{sp,bat}$) at each time step of an optimization period. Tracking controller 2112 can use the optimal power setpoints $P_{sp,grid}$, $P_{sp,bat}$, and/or $P_{sp,act}$ to determine optimal position setpoints $Pos_{sp}$ for valve 1832 and an optimal battery charge or discharge rate (i.e., $Bat_{C/D}$). Equipment controller 2114 can use the optimal position setpoints $Pos_{sp}$ to generate control signals for actuator 1834 that drive the actual (e.g., measured) position to the setpoints (e.g., using a feedback control technique). Each of controllers 2110-2114 is described in detail below.

Economic Controller

Economic controller 2110 can be configured to optimize a predictive cost function to determine an optimal amount of power to purchase from energy grid 2014 (i.e., a grid power setpoint $P_{sp,grid}$), an optimal amount of power to store or discharge from battery unit 1802 (i.e., a battery power setpoint $P_{sp,bat}$), and/or an optimal amount of power to be consumed by actuator 1834 (i.e., an actuator power setpoint $P_{sp,bat}$) at each time step of an optimization period. An example of a predictive cost function which can be optimized by economic controller 2110 is shown in the following equation:

$$\min(J) = \sum_{k=1}^{h} C_{ec}(k)P_{act}(k)\Delta t + C_{DC}\max_{k}(P_{grid}(k)) - \sum_{k=1}^{h} C_{ec}(k)P_{bat}(k)\Delta t$$

where $C_{ec}(k)$ is the cost per unit of electricity (e.g., \$/kWh) purchased from electric utility 2018 during time step k, $P_{act}(k)$ is the power consumption of actuator 1834 at time step k, $C_{DC}$ is the demand charge rate (e.g., \$/kW), where the max( ) term selects the maximum electricity purchase of valve unit 1800 (i.e., the maximum value of $P_{grid}(k)$) during any time step k of the optimization period, $P_{bat}(k)$ is the amount of power discharged from battery unit 1802 during time step k, and $\Delta t$ is the duration of each time step k. Economic controller 2110 can optimize the predictive cost function J over the duration of the optimization period (e.g., from time step k=1 to time step k=h) to predict the total cost of operating valve unit 1800 over the duration of the optimization period.

The first term of the predictive cost function J represents the cost of electricity consumed by actuator 1834 over the duration of the optimization period. The values of the parameter $C_{ec}(k)$ at each time step k can be defined by the energy cost information provided by electric utility 2018. In some embodiments, the cost of electricity varies as a function of time, which results in different values of $C_{ec}(k)$ at different time steps k. The variable $P_{act}(k)$ is a decision variable which can be optimized by economic controller 2110.

The second term of the predictive cost function J represents the demand charge. Demand charge is an additional charge imposed by some utility providers based on the maximum power consumption during an applicable demand charge period. For example, the demand charge rate $C_{DC}$ may be specified in terms of dollars per unit of power (e.g., \$/kW) and may be multiplied by the peak power usage (e.g., kW) during a demand charge period to calculate the demand charge. In the predictive cost function J, the demand charge rate $C_{DC}$ may be defined by the demand cost information received from electric utility 2018. The variable $P_{grid}(k)$ is a decision variable which can be optimized by economic controller 2110 in order to reduce the peak power usage $\max(P_{grid}(k))$ that occurs during the demand charge period. Load shifting may allow economic controller 2110 to smooth momentary spikes in the electric demand of valve unit 1800 by storing energy in battery unit 1802 when the power consumption of actuator 1834 is low. The stored energy can be discharged from battery unit 1802 when the power consumption of actuator 1834 is high in order to reduce the peak power draw $P_{grid}$ from energy grid 2014, thereby decreasing the demand charge incurred.

The final term of the predictive cost function J represents the cost savings resulting from the use of battery unit 1802. Unlike the previous terms in the cost function J, the final term subtracts from the total cost. The values of the parameter $C_{ec}(k)$ at each time step k can be defined by the energy cost information provided by electric utility 2018. In some embodiments, the cost of electricity varies as a function of time, which results in different values of $C_{ec}(k)$ at different time steps k. The variable $P_{bat}(k)$ is a decision variable which can be optimized by economic controller 2110. A positive value of $P_{bat}(k)$ indicates that battery unit 1802 is discharging, whereas a negative value of $P_{bat}(k)$ indicates that battery unit 1802 is charging. The power discharged from battery unit 1802 $P_{bat}(k)$ can be used to satisfy some or all of the total power consumption $P_{total}(k)$ of actuator 1834, which reduces the amount of power $P_{grid}(k)$ purchased from energy grid 2014 (i.e., $P_{grid}(k)=P_{total}(k)-P_{bat}(k)$). However, charging battery unit 1802 results in a negative value of $P_{bat}(k)$ which adds to the total amount of power $P_{grid}(k)$ purchased from energy grid 2014.

Economic controller 2110 can optimize the predictive cost function J over the duration of the optimization period to determine optimal values of the decision variables at each time step during the optimization period. In some embodiments, the optimization period has a duration of approximately one day and each time step is approximately fifteen minutes. However, the durations of the optimization period and the time steps can vary in other embodiments and can be adjusted by a user. Advantageously, economic controller 2110 can use battery unit 1802 to perform load shifting by drawing electricity from energy grid 2014 when energy prices are low and/or when the power consumed by actuator 1834 is low. The electricity can be stored in battery unit 1802 and discharged later when energy prices are high and/or the power consumption of actuator 1834 is high. This enables economic controller 2110 to reduce the cost of electricity consumed by valve unit 1800 and can smooth momentary spikes in the electric demand of valve unit 1800, thereby reducing the demand charge incurred.

Economic controller 2110 can be configured to impose constraints on the optimization of the predictive cost function J. In some embodiments, the constraints include constraints on the position of actuator 1834. Economic controller 2110 can be configured to maintain the actual or predicted position between a minimum position bound $Pos_{min}$ and a maximum position bound $Pos_{max}$ (i.e., $Pos_{min} \leq Pos \leq Pos_{max}$) at all times. The parameters $Pos_{min}$ and $Pos_{max}$ may be time-varying to define different position ranges at different times.

In addition to constraints on the position of valve 1832, economic controller 2110 can impose constraints on the state-of-charge (SOC) and charge/discharge rates of battery unit 1802. In some embodiments, economic controller 2110 generates and imposes the following power constraints on the predictive cost function J:

$$P_{bat} \leq P_{rated}$$

$$-P_{bat} \leq P_{rated}$$

where $P_{bat}$ is the amount of power discharged from battery unit 1802 and $P_{rated}$ is the rated battery power of battery unit 1802 (e.g., the maximum rate at which battery unit 1802 can be charged or discharged). These power constraints ensure that battery unit 1802 is not charged or discharged at a rate that exceeds the maximum possible battery charge/discharge rate $P_{rated}$.

In some embodiments, economic controller 2110 generates and imposes one or more capacity constraints on the predictive cost function J The capacity constraints may be used to relate the battery power $P_{bat}$ charged or discharged during each time step to the capacity and SOC of battery unit 1802. The capacity constraints may ensure that the capacity of battery unit 1802 is maintained within acceptable lower and upper bounds at each time step of the optimization period. In some embodiments, economic controller 2110 generates the following capacity constraints:

$$C_a(k) - P_{bat}(k)\Delta t \leq C_{rated}$$

$$C_a(k) - P_{bat}(k)\Delta t \geq 0$$

where $C_a(k)$ is the available battery capacity (e.g., kWh) at the beginning of time step k, $P_{bat}(k)$ is the rate at which battery unit 1802 is discharged during time step k (e.g., kW), $\Delta t$ is the duration of each time step, and $C_{rated}$ is the maximum rated capacity of battery unit 1802 (e.g., kWh). The term $P_{bat}(k)\Delta t$ represents the change in battery capacity during time step k. These capacity constraints ensure that the capacity of battery unit 1802 is maintained between zero and the maximum rated capacity $C_{rated}$.

In some embodiments, economic controller 2110 generates and imposes one or more capacity constraints on the operation of actuator 1834. For example, actuator 1834 may have a maximum operating point (e.g., a maximum actuation speed, a maximum position, etc.) which corresponds to a maximum power consumption $P_{act,max}$. Economic controller 2110 can be configured to generate a constraint which limits the power $P_{act}$ provided to actuator 1834 between zero and the maximum power consumption $P_{act,max}$ as shown in the following equation:

$$0 \leq P_{act} \leq P_{act,max}$$

$$P_{act} = P_{sp,grid} + P_{sp,bat}$$

where the total power $P_{act}$ provided to actuator 1834 is the sum of the grid power setpoint $P_{sp,grid}$ and the battery power setpoint $P_{sp,bat}$.

Economic controller 2110 can optimize the predictive cost function J subject to the constraints to determine optimal values for the decision variables $P_{act}$, $P_{grid}$, and $P_{bat}$, where $P_{act}=P_{bat}+P_{grid}$ In some embodiments, economic controller 2110 uses the optimal values for $P_{act}$, $P_{bat}$, and/or $P_{grid}$ to generate power setpoints for tracking controller 2112. The power setpoints can include battery power setpoints $P_{sp,bat}$, grid power setpoints $P_{sp,grid}$, and/or actuator power setpoints $P_{sp,act}$ for each of the time steps k in the optimization period. Economic controller 2110 can provide the power setpoints to tracking controller 2112.

Tracking Controller

Tracking controller 2112 can use the optimal power setpoints $P_{sp,grid}$, $P_{sp,bat}$, and/or $P_{sp,act}$ generated by economic controller 2110 to determine optimal position setpoints $Pos_{sp}$ and an optimal battery charge or discharge rate (i.e., $Bat_{C/D}$). In some embodiments, tracking controller 2112 generates a position setpoint $Pos_{sp}$ predicted to achieve the power setpoint $P_{sp,act}$ for actuator 1834. In other words, tracking controller 2112 may generate a position setpoint $Pos_{sp}$ that causes actuator 1834 to consume the optimal amount of power $P_{act}$ determined by economic controller 2110.

In some embodiments, tracking controller 2112 uses the battery power setpoint $P_{sp,bat}$ to determine the optimal rate $Bat_{C/D}$ at which to charge or discharge battery unit 1802. For example, the battery power setpoint $P_{sp,bat}$ may define a power value (kW) which can be translated by tracking controller 2112 into a control signal for power inverter 2010 and/or equipment controller 2114. In other embodiments, the battery power setpoint $P_{sp,bat}$ is provided directly to power inverter 2010 and used by power inverter 2010 to control the battery power $P_{bat}$.

Equipment Controller

Equipment controller 2114 can use the optimal position setpoints $Pos_{sp}$ generated by tracking controller 2112 to generate control signals for actuator 1834. The control signals generated by equipment controller 2114 may drive the actual (e.g., measured) position of valve 1832 the setpoints. Equipment controller 2114 can use any of a variety of control techniques to generate control signals for actuator 1834. For example, equipment controller 2114 can use state-based algorithms, extremum seeking control (ESC) algorithms, proportional-integral (PI) control algorithms, proportional-integral-derivative (PID) control algorithms, model predictive control (MPC) algorithms, or other feedback control algorithms, to generate control signals for actuator 1834.

The control signals may include on/off commands, position commands, voltage signals, or other types of setpoints that affect the operation of actuator 1834. In other embodiments, the control signals may include the position setpoints generated by predictive valve controller 1804. The setpoints can be provided to actuator 1834 or local controllers for actuator 1834 which operate to achieve the setpoints. For example, a local controller for actuator 1834 may receive a measurement of the valve position from one or more position sensors. The local controller can use a feedback control process (e.g., PID, ESC, MPC, etc.) to adjust the position of actuator 1834 and/or valve 1832 to drive the measured position to the setpoint.

In some embodiments, equipment controller 2114 is configured to provide control signals to power inverter 2010. The control signals provided to power inverter 2010 can include a battery power setpoint $P_{sp,bat}$ and/or the optimal charge/discharge rate $Bat_{C/D}$. Equipment controller 2114 can be configured to operate power inverter 2010 to achieve the battery power setpoint $P_{sp,bat}$. For example, equipment controller 2114 can cause power inverter 2010 to charge battery unit 1802 or discharge battery unit 1802 in accordance with the battery power setpoint $P_{sp,bat}$.

Other Equipment and Control Objectives

Although the systems and methods of the present disclosure are described primarily with respect to central energy facilities, chillers, pumps, cooling towers, and valves, it is contemplated that the teachings provided herein can be applied to any type of building equipment or collection of equipment that consumes electricity and/or other resources (e.g., natural gas, water, steam, etc.) during operation. Several examples of how the teachings of the present disclosure could be applied to other types of building equipment and systems are described in detail in U.S. patent application Ser. No. 16/314,277 titled "Variable Refrigerant Flow System with Predictive Control" and filed Jun. 29, 2017, U.S. patent application Ser. No. 16/746,534 titled "Air Handling Unit and Rooftop Unit with Predictive Control" and filed Jan. 17, 2020, U.S. patent application Ser. No. 15/963,857 titled "Building Energy System with Predictive Control of Battery and Green Energy Resources" and filed Apr. 26, 2018, and U.S. Provisional Patent Application No. 63/194,771 titled "Modular Energy Units and Building Equipment with Sustainable Energy Features" and filed May 28, 2021. The entire disclosures of each of these patent applications are incorporated by reference herein.

Although the predictive cost function J is described primarily as accounting for monetary cost, it is contemplated that the predictive cost function J could be modified or replaced with any type of cost function that accounts for one or more other control objectives (e.g., resource consumption, carbon emissions, occupant comfort, disease transmission risk, equipment degradation or reliability, etc.) in addition monetary cost or in place of monetary cost without departing from the teachings of the present disclosure. The terms "cost function" and "objective function" are used synonymously throughout the present disclosure and both refer to the function J used by the predictive controller, regardless of whether the function J accounts for monetary cost and/or other control objectives. Additionally, it should be understood that the "cost" defined by the cost function J may be a monetary cost (e.g., expressed in units of dollars or other currency) and/or other types of cost such as resource consumption (e.g., expressed in units of energy, water, natural gas, or any other resource), carbon emissions (e.g., expressed in units of carbon), occupant comfort (e.g., expressed in units of comfort), disease transmission risk (e.g., expressed in units of risk or probability), and/or equipment reliability (e.g., expressed in units of reliability or expected failures). As such, it should be appreciated that references to "cost" throughout the present disclosure are not necessarily monetary cost, but may include any other control objectives which may be desirable to optimize. Several examples of cost functions J that could be used by the predictive controller to account for a variety of different control objectives are described below.

One example of a predictive cost function J that can be used by the predictive controller is a monetary cost function such as:

$$J = \sum_{r=1}^{p} \sum_{k=1}^{n} c_{r,k} * x_{r,k}$$

where $x_{r,k}$ is the amount of resource r purchased or received from an electric utility, energy grid, or other energy sources at time step k (e.g., kW or kWh of electricity, liters of water, therms or BTUs of natural gas, etc.), $c_{r,k}$ is the per unit cost of resource r at time step k (e.g., $/kW, $/kWh, $/liter, $/therm, $/BTU, etc.), p is the total number of resources (e.g., electricity, natural gas, water, etc.), and n is the total number of time steps within the optimization horizon or optimization period. Accordingly, this example predictive cost function J expresses the cost in units of monetary cost (e.g., $) and sums the total cost of all resources (i.e., r=1 . . . p) purchased or received over all time steps (i.e., k=1 . . . n) of the optimization period. The x variables are decision variables in the predictive cost function J whereas the c variables can be predicted or estimated beforehand and provided as inputs to the predictive cost function J.

In some embodiments, the predictive cost function J can be modified to account for various other sources of monetary cost such as maintenance cost, equipment purchase or replacement cost (e.g., capital cost), equipment degradation cost, and/or any of the other sources of monetary cost described in U.S. patent application Ser. No. 15/895,836 filed Feb. 13, 2018, U.S. patent application Ser. No. 16/418,686 filed May 21, 2019, U.S. patent application Ser. No. 16/438,961 filed Jun. 12, 2019, U.S. patent application Ser. No. 16/449,198 filed Jun. 21, 2019, U.S. patent application Ser. No. 16/457,314 filed Jun. 28, 2019, U.S. patent application Ser. No. 16/697,099 filed Nov. 26, 2019, U.S. patent application Ser. No. 16/687,571 filed Nov. 18, 2019, U.S. patent application Ser. No. 16/518,548 filed Jul. 22, 2019, U.S. patent application Ser. No. 16/899,220 filed Jun. 11, 2020, U.S. patent application Ser. No. 16/943,781 filed Jul. 30, 2020, and/or U.S. patent application Ser. No. 17/017,028 filed Sep. 10, 2020. The entire disclosures of each of these patent applications are incorporated by reference herein. In some embodiments, the predictive cost function used by the predictive controller may include any of the cost functions or portions of the cost functions described in these patent applications.

In some embodiments, the predictive cost function J can be modified to account for various sources of revenue such as revenue generated by participating in incentive-based demand response (IBDR) programs, revenue generated by selling resources back to the electric utility, energy grid, or other resource suppliers, revenue generated by selling resources to resource purchasers or to an energy grid (e.g., selling electricity previously purchased or generated by the system to the electric utility, energy grid, or an energy market), or any other sources of revenue that can be obtained by operating the building equipment. The revenue generated may be an additional term of the predictive cost function J which subtracts from the first term in the example predictive cost function J shown above.

For example, a predictive controller (e.g., predictive CEF controller 304, predictive chiller controller 704, predictive pump controller 1104, predictive cooling tower controller 1504, predictive valve controller 1804, and/or any of the predictive controllers described in the patent applications or patents incorporated above, etc.) may be configured to estimate the revenue generation potential of participating in various incentive-based demand response (IBDR) programs. In some embodiments, the predictive controller receives an incentive event history from incentive programs. The incentive event history may include a history of past IBDR events from the incentive programs. An IBDR event may include an invitation from the incentive programs to participate in an IBDR program in exchange for a monetary incentive. The incentive event history may indicate the times at which the past IBDR events occurred and attributes describing the IBDR events (e.g., clearing prices, mileage ratios, participation requirements, etc.). The predictive controller may use the incentive event history to estimate IBDR event probabilities during the optimization period.

The predictive controller may generate incentive predictions including the estimated IBDR probabilities, estimated participation requirements, an estimated amount of revenue from participating in the estimated IBDR events, and/or any other attributes of the predicted IBDR events. The predictive controller may use the incentive predictions along with predicted loads (e.g., predicted electric loads of the building equipment, predicted demand for one or more resources produced by the building equipment, etc.) and utility rates (e.g., energy cost and/or demand cost from electric utility 512) to determine an optimal set of control decisions for each time step within the optimization period. Several examples of how incentives such as those provided by IBDR programs and others that could be accounted for in the predictive cost function J are described in greater detail in U.S. patent application Ser. No. 16/449,198 titled "Model Predictive Maintenance System with Incentive Incorporation" and filed Jun. 21, 2019, U.S. patent application Ser. No. 17/542,184 titled "Control System with Incentive-Based Control of Building Equipment" and filed Dec. 3, 2021, U.S. patent application Ser. No. 15/247,875 titled "Building Management System with Electrical Energy Storage Optimization Based on Statistical Estimates of IBDR Event Probabilities" and filed Aug. 25, 2016, U.S. patent application Ser. No. 15/247,879 titled "Building Management System with Electrical Energy Storage Optimization Based on Benefits and Costs of Participating in PBDR and IBDR Programs" and filed Aug. 25, 2016, and U.S. patent application Ser. No. 15/247,881 titled "Building Control System with Optimization of Equipment Life Cycle Economic Value While Participating in IBDR and PBDR Programs" and filed Aug. 25, 2016. The entire disclosures of each of these patent applications are incorporated by reference herein.

Another example of a predictive cost function J that can be used by the predictive controller is a resource consumption cost function such as:

$$J = \sum_{r=1}^{p}\sum_{k=1}^{n} w_r * x_{r,k}$$

where $x_{r,k}$ is the amount of resource r consumed by the building equipment at time step k (e.g., kW or kWh of electricity, liters of water, therms of natural gas, etc.), $w_r$ is a weighting factor applied to resource r in order to covert each resource to common units (e.g., unit/kW, unit/kWh, unit/liter, unit/therm, etc.) and define the relative importance of each resource, p is the total number of resources (e.g., electricity, natural gas, water, etc.), and n is the total number of time steps within the optimization horizon or optimization period. Accordingly, this example predictive cost function J expresses the cost in units of resource consumption and sums the total consumption of all resources (i.e., r=1 . . . p) over all time steps (i.e., k=1 . . . n) of the optimization period. The x variables are decision variables in the predictive cost function J whereas the w variables can be provided as inputs to the predictive cost function J to define the relative importance of each resource.

In some embodiments, resource production or discharge by the building equipment or within the system (e.g., the output of PV panels 308, PV panels 708, PV panels 1508 or on-site renewable energy generation, resources produced by the building equipment, resources discharged from storage such as batteries, etc.) is accounted for as negative resource consumption (i.e., negative values of the x variables) in the predictive cost function J. Conversely, resource consumption within the system (e.g., resources consumed by the building equipment, resources charged into storage such as batteries, etc.) is accounted for as positive resource consumption (i.e. positive values of the x variables) in the predictive cost function J. In some embodiments, each value of $x_{r,k}$ in the predictive cost function J represents the net resource consumption of a particular resource r at time step k by all components of the system. For example, the predictive cost function J may be subject to a set of constraints that define $x_{r,k}$ as the sum of all sources of resource consumption of resource r at time step k minus the sum of all sources of resource production of resource r at time step k.

Another example of a predictive cost function J that can be used by the predictive controller is a carbon emissions cost function such as:

$$J = \sum_{r=1}^{p}\sum_{k=1}^{n} \beta_{r,k} * x_{r,k}$$

where $x_{r,k}$ is the amount of resource r consumed by the building equipment at time step k (e.g., kW or kWh of electricity, liters of water, therms of natural gas, etc.), $\beta_{r,k}$ represents an amount of carbon emissions per unit of consumption or resource r at time step k (e.g., carbon emissions per kW, carbon emissions per kWh, carbon emissions per liter, carbon emissions per therm, etc.) in order to translate resource consumption into units of carbon emissions, p is the total number of resources (e.g., electricity, natural gas, water, etc.), and n is the total number of time steps within the optimization horizon or optimization period. Accordingly, this example predictive cost function J expresses the cost in units of carbon emissions and sums the total carbon emissions resulting from consumption of all resources (i.e., r=1 . . . p) over all time steps (i.e., k=1 . . . n) of the optimization period. The x variables are decision variables in the predictive cost function J whereas the β variables can be provided as inputs to the predictive cost function J to define the relationship between carbon emissions and resource consumption for each resource.

In some embodiments, the variables include marginal operating emissions rates (MOER) for resources purchased from the electric utility or energy grid and/or other translation factors that translate between amounts of resource consumption and corresponding amounts of carbon emissions. Several examples of how MOER can be incorporated into a cost function as well as other examples of cost functions that account for carbon emissions or other sustainability metrics or sustainability factors are described in detail in U.S. Provisional Patent Application No. 63/194,771 filed May 28, 2021, U.S. Provisional Patent Application No. 63/220,878 filed Jul. 12, 2021, U.S. Provisional Patent Application No. 63/246,177 filed Sep. 20, 2021, and U.S. patent application Ser. No. 17/483,078 filed Sep. 23, 2021. The entire disclosures of each of these patent applications are incorporated by reference herein. In some embodiments, the cost function used by the predictive controller may include any of the cost functions or portions of the cost functions described in these patent applications.

Another example of a predictive cost function J that can be used by the predictive controller is an occupant comfort cost function such as:

$$J = \sum_{l=1}^{m}\sum_{k=1}^{n} w_{l,k} * x_{comfort_{l,k}}$$

where $x_{comfort_{l,k}}$ represents occupant comfort within building zone l at time step k, $w_{l,k}$ is a weight that represents the relative importance of occupant comfort within building zone l at time step k, m is the total number of building zones, and n is the total number of time steps in the optimization period or optimization horizon. Accordingly, this example predictive cost function J expresses the cost in units of occupant comfort and sums the total occupant comfort over all building zones (i.e., l=1 . . . m) over all time steps (i.e., k=1 . . . n) of the optimization period. The weights $w_{l,k}$ can be set to prioritize occupant comfort in some building zones over others (e.g., based on whether the building zone is occupied or unoccupied, based on the identity of the occupants, etc.) and/or to prioritize occupant comfort at certain times of day over other times of day (e.g., prioritize occupant comfort during business hours). In some embodiments, the weights $w_{l,k}$ are provided as inputs to the predictive cost function J, whereas the occupant comfort variables $x_{comfort_{l,k}}$ are decision variables in the predictive cost function J.

In some embodiments, occupant comfort $x_{comfort_{l,k}}$ can be defined objectively based on the amount that a measured or predicted building condition (e.g., temperature, humidity, airflow, etc.) within the corresponding building zone l deviates from a comfort setpoint or comfort range at time step k. If multiple different building conditions are considered, the occupant comfort $c_{comfort_{l,k}}$ can be defined as a summation or weighted combination of the deviations of the various building conditions relative to their corresponding setpoints or ranges. An exemplary method for predicting occupant comfort based on building conditions is described in U.S. patent application Ser. No. 16/943,955 filed Jul. 30, 2020, the entire disclosure of which is incorporated by reference herein. In some embodiments, occupant comfort $x_{comfort_{l,k}}$ can be quantified based on detected or predicted occupant overrides of temperature setpoints and/or based on predicted mean vote calculations. These and other methods for quantifying occupant comfort are described in U.S. patent application Ser. No. 16/405,724 filed May 7, 2019, U.S. patent application Ser. No. 16/703,514 filed Dec. 4, 2019, and U.S. patent application Ser. No. 16/516,076 filed Jul. 18, 2019, each of which is incorporated by reference herein in its entirety.

Another example of a predictive cost function J that can be used by the predictive controller is a disease transmission or infection risk cost function such as:

$$J = \sum_{l=1}^{m}\sum_{k=1}^{n} w_{l,k} * x_{infection_{l,k}}$$

where $x_{infection_{l,k}}$ represents the risk of infection or disease transmission (e.g., infection probability) within building zone l at time step k, $w_{l,k}$ is a weight that represents the relative importance of the risk of infection or disease transmission within building zone l at time step k, m is the total number of building zones, and n is the total number of time steps in the optimization period or optimization horizon. Accordingly, this example predictive cost function J expresses the cost in units of the risk of infection or disease transmission and sums the total risk of infection or disease transmission over all building zones (i.e., l=1 . . . m) over all time steps (i.e., k=1 . . . n) of the optimization period. The weights $w_{l,k}$ can be set to prioritize the risk of infection or disease transmission in some building zones over others (e.g., based on whether the building zone is occupied or unoccupied, based on the health status of the occupants, etc.) and/or to prioritize the risk of infection or disease transmission at certain times of day over other times of day (e.g., prioritize times that occur during business hours or hours of expected occupancy). In some embodiments, the weights $w_{l,k}$ are provided as inputs to the predictive cost function J whereas the occupant comfort variables $x_{comfort_{l,k}}$ are decision variables in the predictive cost function J In some embodiments, the infection risk $X_{infection_{l,k}}$ is predicted using a dynamic model that defines infection risk within a building zone as a function of control decisions for that zone (e.g., ventilation rate, air filtration actions, etc.) as well as other variables such as the number of infectious individuals within the building zone, the size of the building zone, the occupants' breathing rate, etc. For example, the Wells-Riley equation can be used to quantify the infection risk $x_{infection_{l,k}}$ of airborne transmissible diseases. In some embodiments, the infection risk $x_{infection_{l,k}}$ can be predicted as a function of a concentration of infectious quanta within the building zone, which can in turn be predicted using a dynamic infectious quanta model. Several examples of how infection risk and infectious quanta can be predicted as a function of control decisions for a zone are described in detail in U.S. Provisional Patent Application No. 62/873,631 filed Jul. 12, 2019, U.S. patent application Ser. No. 16/927,318 filed Jul. 13, 2020, U.S. patent application Ser. No. 16/927,759 filed Jul. 13, 2020, U.S. patent application Ser. No. 16/927,766 filed Jul. 13, 2020, U.S. patent application Ser. No. 17/459,963 filed Aug. 27, 2021, and U.S. patent application Ser. No. 17/393,138 filed Aug. 3, 2021. The entire disclosures of each of these patent applications are incorporated by reference herein. In some embodiments, the predictive cost function J used by the predictive controller and/or the predictive models or constraints used in combination with the predictive cost function J may include any of the cost functions, predictive models, or constraints described in any of these patent applications.

Another example of a predictive cost function J that can be used by the predictive controller is a reliability cost function such as:

$$J = \sum_{d=1}^{v}\sum_{k=1}^{n} w_{d,k} * x_{reliability_{d,k}}$$

where $x_{reliability_{d,k}}$ represents the reliability of device d of the set of building equipment at time step k, $w_{d,k}$ is a weight that represents the relative importance of device d at time step k, v is the total number of devices, and n is the total number of time steps in the optimization period or optimization horizon. Accordingly, this example predictive cost function J expresses the cost in units of device reliability and sums the total reliability over all devices (i.e., d=1 . . . v) over all time steps (i.e., k=1 . . . n) of the optimization period. The weights $w_{d,k}$ can be set to prioritize the reliability of some devices over others (e.g., based on whether the device is critical to the operation of the system, based on the relative costs of replacing or repairing the devices, etc.) and/or to prioritize reliability at certain times of day over other times of day (e.g., prioritize reliability during business hours or when the building is occupied). In some embodiments, the weights $w_{d,k}$ are provided as inputs to the predictive cost function J whereas the reliability variables $x_{reliability_{d,k}}$ are decision variables in the predictive cost function J In some embodiments, the reliability $x_{reliability_{d,k}}$ of a given device is a function of control decisions for the device, its degradation state, and/or an amount of time that has elapsed since the device was put into service or the most recent time at which maintenance was conducted on the device. Reliability $x_{reliability_{d,k}}$ can be quantified and/or predicted using any of a variety of reliability models. Several examples of models that can be used to quantify reliability $x_{reliability_{d,k}}$ and predict reliability values into the future are described in U.S. patent application Ser. No. 15/895,836 filed Feb. 13, 2018, U.S. patent application Ser. No. 16/418,686 filed May 21, 2019, U.S. patent application Ser. No. 16/438,961 filed Jun. 12, 2019, U.S. patent application Ser. No. 16/449,198 filed Jun. 21, 2019, U.S. patent application Ser. No. 16/457,314 filed Jun. 28, 2019, U.S. patent application Ser. No. 16/697,099 filed Nov. 26, 2019, U.S. patent application Ser. No. 16/687,571 filed Nov. 18, 2019, U.S. patent application Ser. No. 16/518,548 filed Jul. 22, 2019, U.S. patent application Ser. No. 16/899,220 filed Jun. 11, 2020, U.S. patent application Ser. No. 16/943,781 filed Jul. 30, 2020, and/or U.S. patent application Ser. No. 17/017,028 filed Sep. 10, 2020. The entire disclosures of each of these patent applications are incorporated by reference herein.

Although several examples of the predictive cost function J are provided, it should be appreciated that these are merely examples of potential cost functions that could be used and should not be regarded as limiting. Additionally, it is contemplated that the predictive cost function J may include multiple terms that account for multiple different control objectives within a single cost function. For example, the monetary cost function and carbon emissions cost function shown above can be combined to generate a single predictive cost function J that accounts for both monetary cost and carbon emissions such as:

$$J = w_1 \sum_{r=1}^{p}\sum_{k=1}^{n} c_{r,k} * x_{r,k} + w_2 \sum_{r=1}^{p}\sum_{k=1}^{n} \beta_{r,k} * x_{r,k}$$

where $w_1$ and $w_2$ are weights that are used to assign the relative importance of the monetary cost defined by the first term and the carbon emissions cost defined by the second term in the overall cost function J(x) and the remaining variables are the same as described with reference to the monetary cost function and carbon emissions cost function above. It is contemplated that any of the predictive cost functions J described throughout the present disclosure or any of the disclosures incorporated by reference herein can be combined (e.g., by adding them together in a weighted summation and/or subtracting one or more cost functions from one or more other cost functions) to account for any combination of control objectives within a single cost function. In addition to assigning relative importance to various control objectives, the weights $w_1$ and $w_2$ may function as unit conversion factors (e.g., cost per dollar, cost per unit of carbon emissions, etc.) to translate different units associated with different control objectives into a common "cost" unit that is optimized when performing the optimization process.

In some embodiments, the predictive controller is configured to perform an optimization process using the predictive cost function J to drive the cost defined by the predictive cost function J toward an optimal value (e.g., a minimum or maximum value) subject to a set of constraints. The set of constraints may include equations and/or inequalities that define relationships between variables used in the optimization process. Some of the variables that appear in the set of constraints may be provided as inputs to the optimization process and may be maintained at fixed values when performing the optimization process. Other variables that appear in the set of constraints may have time-varying values and thus may be set to different predetermined values at different time steps k. For example, the time-varying predicted loads $\ell_k$ to be served at each time step k may be determined prior to performing the optimization process and may have different values at different time steps k. The values of such variables may be set to the predetermined values for each time step k during the optimization process.

Some constraints may be separate from the predictive cost function J and define relationships that must be satisfied when performing the optimization process. Such constraints are referred to herein as "hard constraints" because they cannot be violated and impose hard limits on the optimization process. An example of a hard constraint is a load satisfaction constraint that requires the total amount of a particular resource purchased from electric utility 512 or other resource suppliers, produced by the building equipment, and/or discharged from storage (e.g., batteries) to be greater than or equal to the total amount of that resource delivered to resource consumers, consumed by the building equipment, and stored into the storage at a given time step k. Another example of a hard constraint is an equation which requires the total power consumption of the building equipment to be equal to an amount of power consumed from electric utility 512 and an amount of power received from a non-grid energy source such as batteries. Such constraints may be provided as an inequality or equality within the set of constraints, separate from the predictive cost function J.

Other constraints may be formulated as penalties on the value defined by the predictive cost function J and may be included within the predictive cost function J itself. For example, the predictive cost function J can be modified to include a penalty term (e.g., $$\sum_{k=1}^{n} p_k \delta_k)$$

that can be added to the base cost function J to define an additional penalty cost within the cost function itself. In this example, the variable $\delta_k$ represents an amount by which a constrained variable deviates from a specified value or range (i.e., an amount by which the constraint is violated) and the variable $p_k$ is the penalty per unit of the deviation. Such constraints are referred to herein as "soft constraints" because they can be violated but will incur a penalty when such violation occurs. As such, the predictive controller will seek to avoid violating the soft constraints when performing the optimization when the penalty for violating the soft constraints (i.e., the added cost) does not outweigh the benefits (i.e., any reduction to the cost that occurs as a result of violating the soft constraints). The value of the variable $p_k$ can be set to a high value to ensure that the soft constraints are not violated unless necessary to achieve a feasible optimization result.

Any variable that is used to define a constraint on the optimization process performed by the predictive controller is referred to herein as a "constraint variable," regardless of whether the constraint is implemented as a hard constraint or a soft constraint. Accordingly, constraint variables may include variables that appear in hard constraints separate from the predictive cost function J and/or variables that appear within soft constraints within the predictive cost function J itself. In some embodiments, the constraint variables do not include the decision variables (e.g., the x variables) that are adjusted when performing the optimization process, but rather are limited to the variables that have predetermined values provided as inputs to the optimization process. The predetermined values of some constraint variables may apply to each and every time step of the optimization period (i.e., the same value for each time step), whereas the predetermined values of other constraint variables may be specific to corresponding time steps (i.e., a time series of values for a given constraint variable). For example, the constraint variables may include the required load variables and/or incentive predictions. In some embodiments, the constraint variables include one or more of the decision variables (e.g., the x variables) within the hard constraints or the soft constraints.

As noted above, the constraint variables may include required load variables that define the amount of each of the resources (e.g., chilled water, hot water, electricity, etc.) required by the building equipment at each time step k and may have different values at different time steps. For example, the constraint variables may include a time series of required chilled water load values $\hat{\ell}_{cw}$, a time series of hot water load values $\hat{\ell}_{hw}$, and/or a time series of electric load values $\hat{\ell}_{elec}$. Each of these time series may include a required load value for each time step k of the optimization period (i.e., k=1 . . . n) as shown in the following equations:

$$\hat{\ell}_{cw} = \begin{bmatrix} \hat{\ell}_{cw,1} & \hat{\ell}_{cw,2} & \dots & \hat{\ell}_{cw,n} \end{bmatrix}$$

$$\hat{\ell}_{hw} = \begin{bmatrix} \hat{\ell}_{hw,1} & \hat{\ell}_{hw,2} & \dots & \hat{\ell}_{hw,n} \end{bmatrix}$$

$$\hat{\ell}_{elec} = \begin{bmatrix} \hat{\ell}_{elec,1} & \hat{\ell}_{elec,2} & \dots & \hat{\ell}_{elec,n} \end{bmatrix}$$

where n is the total number of time steps and each time series is represented as a vector or array of time step-specific values of the required load variables. In some embodiments, each of the time step-specific values of the required load variables are treated as separate constraint variables by the predictive controller. In some embodiments, one or more of the time series of the required load variables is treated as a single constraint variable that represents each of the time step-specific values within the time series. Any adjustments to such a constraint variable that represents a time series as a whole may include adjustments (e.g., equivalent, proportional, etc.) to each of the time step-specific values that form the time series.

In some embodiments, each of the required loads is associated with a corresponding set of curtailment actions that can be performed by the building equipment to reduce the required loads. For example, the chilled water load $\hat{\ell}_{cw}$ can be curtailed by increasing chilled water temperature setpoints or reducing flow rate setpoints for any building equipment that consume the chilled water (e.g., air handling units, cooling coils, etc.). Similarly, the hot water load $\hat{\ell}_{hw}$ can be curtailed by decreasing hot water temperature setpoints or by reducing flow rate setpoints for any building equipment that consume the hot water (e.g., air handling units, heating coils, hot water lines within sinks or kitchens, etc.). The electric load $\hat{\ell}_{elec}$ can be curtailed by operating the building equipment to reduce the amount of electricity consumption (e.g., switching off lights, reducing fan speed, operating electricity consuming equipment in a reduced power mode, etc.).

In some embodiments, the constraint variables include a time series of required load values for a refrigeration load $\ell_{ref}$. The refrigeration load $\ell_{ref}$ may be a specific type of electric load that represents the electricity consumption of refrigeration equipment (e.g., refrigerators, freezers, coolers, or other refrigeration equipment within a building). In various embodiments, the refrigeration load $\ell_{ref}$ may be a subset of the electric load $\ell_{elec}$ or may be defined as a separate type of load such that the electric load $\ell_{elec}$ excludes any refrigeration loads captured by the refrigeration load $\ell_{ref}$. As with the other types of required loads, the refrigeration load $\ell_{ref}$ may include a time series of required load values for each time step k of the optimization period as shown in the following equation:

$$\hat{\ell}_{ref} = \begin{bmatrix} \hat{\ell}_{ref,1} & \hat{\ell}_{ref,2} & \dots & \hat{\ell}_{ref,n} \end{bmatrix}$$

where n is the total number of time steps and the time series is represented as a vector or array of time step-specific values of refrigeration load $\ell_{ref}$.

It is contemplated that any type or subset of required load (e.g., chilled water load, hot water load, electric load, etc.) can be represented using separate constraint variables to the extent that the required load is independently controllable or curtailable apart from the other required loads. For example, certain plug loads (e.g., electric loads at a specific plug or electric circuit) can be represented using separate constraint variables if those plug loads can be independently curtailed or reduced by performing specific curtailment actions for the corresponding equipment without requiring that those same curtailment actions be performed for other equipment represented by other required loads.

Additionally, it is contemplated that the required loads can be separated into various categories such that each required load represents the resource consumption of the corresponding category to provide the predictive controller with different constraint variables for each category of required loads. Categories can include, for example, building subsystem or type of equipment (e.g., HVAC, lighting, electrical, communications, security, elevators/lifts, etc.), building (e.g., building A, building B, etc.), room or zone within a building (e.g., floor A, floor B, conference room C, office D, zone E, etc.) importance or criticality of the corresponding space or equipment (e.g., prioritizing critical processes or spaces), or any other category. Advantageously, providing different constraint variables for different categories of required loads may allow the predictive controller to recommend certain curtailment actions that are specific to a category of required loads without modifying other categories of required loads, or recommending different curtailment actions for the other categories of required loads.

In some embodiments, the constraint variables include performance variables that represent the desired performance level or run rate of a system or process that consumes one or more of the resources modeled by the predictive controller. The system or process can include any of a variety of controllable systems or processes including, for example, an HVAC system that provides heating or cooling to a building, an assembly line in a factory that produces a product or material, a chemical manufacturing process, a cloud computing system that consumes electricity to provide various levels of computing power, or any other system or process that can be run at various speeds, levels, or rates. The performance variables may include discrete performance levels (e.g., high, medium, low, fast mode, slow mode, etc.) or continuous performance levels to define a desired operating point within a range or spectrum (e.g., 25% of maximum capacity, 80% of maximum capacity, etc.). In this scenario, the set of constraints considered by the predictive controller may include constraints that map each of the performance variables to a corresponding amount of resource consumption for each of the resources consumed by the system or process. For example, for a system or process that consumes chilled water, hot water, and electricity, the constraints may include:

$$p = \begin{bmatrix} p_1 & p_2 & \dots & p_n \end{bmatrix}$$

$$\hat{\ell}_{cw,k} = r_{cw} * p_k$$

$$\hat{\ell}_{hw,k} = r_{hw} * p_k$$

$$\hat{\ell}_{elec,k} = r_{elec} * p_k$$

where p is a time series or vector/array of performance variables that represent the desired performance level at each time step k=1 . . . n of the optimization period, $p_k$ is the desired performance level at time step k, $r_{cw}$, is a conversion factor that translates the performance level $p_k$ into a corresponding amount of chilled water consumption, $r_{hw}$ is a conversion factor that translates the performance level $p_k$ into a corresponding amount of hot water consumption, and $r_{elec}$ is a conversion factor that translates the performance level $p_k$ into a corresponding amount of electricity consumption. In this example, each of the chilled water load, the hot water load, and the electric load is a function of the performance level. Accordingly, reducing the performance level of the system or process would effectively reduce each of the chilled water load, the hot water load, and the electric load.

In some embodiments, the constraint variables include variables that represent enhanced ventilation requirements. Enhanced ventilation requirements may be represented as a type of performance variable as described above that has discrete levels (e.g., enhanced ventilation on, enhanced ventilation off) or continuous ventilation levels that can be selected from or set to any value within a range or spectrum of ventilation levels. For a ventilation system that consumes only electricity (e.g., to operate one or more fans), the constraints may include:

$$v = \begin{bmatrix} v_1 & v_2 & \dots & v_n \end{bmatrix}$$

$$\hat{\ell}_{elec,vent,k} = r_{elec} * v_k$$

where v is a time series or vector/array of desired ventilation levels at each time step k=n of the optimization period, $v_k$ is the desired ventilation level at time step k, and $r_{elec}$ is a conversion factor that translates the ventilation level $v_k$ into a corresponding amount of electricity $\hat{\ell}_{elec,vent,k}$ consumed by the ventilation system. In this example, the electricity consumption of the ventilation system is a function of the ventilation level. Accordingly, reducing the ventilation level $v_k$ would result in a corresponding reduction in the electricity consumption $\hat{\ell}_{elec,vent,k}$.

In some embodiments, the predictive controller may be configured to calculate a predicted cost savings value based on modified constraints used to perform a second optimization. The predictive controller may be configured to receive the first optimization result and the second optimization result (performed using one or more modified constraints) and may calculate a predicted cost savings value by subtracting the second optimization result from the first optimization result using the equation below:

$$\Delta C = C_1 - C_2$$

where $\Delta C$ represents cost savings in desired units (e.g., dollars, carbon emissions, disease transmission risk, occupant comfort, equipment reliability, etc.), $C_1$ is the first predicted cost of the first optimization result using the initial constraint variables, and $C_2$ is the second predicted cost of the second optimization result using the modified constraint variables. In some embodiments, the predicted cost savings value may be transmitted to one or more user device via a communications interface for viewing by a user. In other embodiments, the predicted cost savings value may be stored in memory for use by the predictive controller. For example, the predicted cost savings value may be stored in memory (e.g., within the predictive controller or a separate memory device or database accessible by the predictive controller) for use in data analysis (e.g., trend in cost savings over a predetermined time period, summation of cost savings over a predetermined time period, etc.).

The costs $C_1$ and $C_2$ estimated by the predictive controller are not limited to monetary cost, but rather can be represented in any unit to account for a variety of different control objectives (e.g., monetary cost, carbon emissions, disease transmission risk, occupant comfort, equipment reliability, etc.). Similarly, the predicted cost savings $\Delta C$ can be expressed in any of the units corresponding to the various different types of cost that can be modeled using the predictive cost function J. For predictive cost functions J that account for multiple different control objectives, the predicted cost savings $\Delta C$ can be provided for each of the control objectives (e.g., $\Delta C_{monetary}$, $\Delta C_{carbon}$ emissions, $\Delta C_{disease}$ transmission risk, $\Delta C_{comfort}$, $\Delta C_{reliability}$, etc.).

The predictive controller may be configured to provide the cost savings $\Delta C$ along with the corresponding change in the value of the constraint variable (e.g., the change in chilled water load $\Delta \ell_{cw}$, the change in hot water load $\Delta \ell_{hw}$, the change in electric load $\Delta \ell_{elec}$, the change in the performance variable $\Delta p$, the change in the ventilation rate $\Delta v$, etc.) between the first optimization and the second optimization. The predictive controller can provide such information in the form of a recommendation that is customized to the particular constraint variable and control objective. Examples of recommendations that can be provided by the predictive controller include:

If you reduce your chilled water load by $\Delta \ell_{cw}$, you could save $\Delta C_{monetary}$ dollars.

If you reduce your hot water load by $\Delta \ell_{hw}$, you could reduce carbon emissions by $\Delta C_{carbon}$ emissions tons.

If you increase ventilation rate by $\Delta v$, you could reduce disease transmission risk by $\Delta C_{disease\ transmission\ risk}$ percent but would increase cost by $\Delta C_{monetary}$ dollars.

If you reduce your electric load by $\Delta \ell_{elec}$, you could save $\Delta C_{monetary}$ dollars but would reduce occupant comfort by $\Delta C_{comfort}$ percent.

If you reduce your chilled water load by $\Delta \ell_{cw}$, you could increase extend equipment life by $\Delta C_{reliability}$ months.

where the values of $\Delta \ell_{cw}$, $\Delta \ell_{hw}$, $\Delta \ell_{elec}$, and $\Delta v$ are the numerical values calculated of the change in the corresponding constraint variable and $\Delta C_{monetary}$, $\Delta C_{carbon}$ emissions, $\Delta C_{disease\ transmission\ risk}$, $\Delta C_{comfort}$, and $\Delta C_{reliability}$ are the numerical values of the corresponding change in the value of the predictive cost function J or portion of the predictive cost function J that accounts for the corresponding control objective.

In some embodiments, the predictive controller provides the cost savings $\Delta C$ as a rate that corresponds to the gradient of the predictive cost function J with respect to the corresponding constraint variable. In this embodiment, the cost savings $\Delta C$ is not a difference between two optimization results, but rather is a gradient or rate at which the cost savings $\Delta C$ changes per unit change of the corresponding constraint variable at the point defined by the first optimization result. The predictive controller can provide such information in the form of a recommendation that is customized to the particular constraint variable and control objective. Examples of recommendations that can be provided by the predictive controller include:

If you reduce your chilled water load, you could save $\Delta C_{monetary}$ dollars per kW.

If you reduce your hot water load, you could reduce carbon emissions by $\Delta C_{carbon}$ emissions per kW.

If you increase ventilation rate, you could reduce disease transmission risk by $\Delta C_{disease\ transmission\ risk}$ percent per CFM, but would increase cost by $\Delta C_{monetary}$ per CFM.

If you reduce your electric load, you could save $\Delta C_{monetary}$ dollars per kW but would reduce occupant comfort by $\Delta C_{comfort}$ percent per kW.

If you reduce your chilled water load, you could increase extend equipment life by $\Delta C_{reliability}$ months per kW.

where the values of $\Delta C_{monetary}$, $\Delta C_{carbon}$ emissions, $\Delta C_{disease}$ transmission risk, $\Delta C_{comfort}$, and $\Delta C_{reliability}$ are the numerical values indicating the gradient or rate at which the value of the cost function J(x) (or control objective-specific portion of the cost function) changes per unit change in the corresponding constraint variable (e.g., $/kW, tons of carbon/kW, percent disease transmission risk per CFM of ventilation rate, etc.).

In some embodiments, the predictive controller is configured to use the predictive cost function J to determine an amount of electric energy to supply (e.g., obtain, provide, distribute, etc.) to the building equipment (e.g., one or more powered components) from each of a plurality of energy sources. The energy sources may include, for example, an energy grid source (e.g., energy grid 414, electric utility 418, other energy grids or electric utilities, etc.), a battery configured to store and discharge electric energy for use by the building equipment, renewable or sustainable energy generation equipment (e.g., PV panels 308, any other PV panels, a solar energy field, wind turbines, etc.), or any other type of energy source capable of providing electric energy to the building equipment or powered components thereof. In some embodiments, the predictive controller determines a first amount of electric energy to receive from an energy grid source and a second amount of the electric energy from the alternative energy source. The alternative energy source may include, for example, a battery, renewable or sustainable energy generation equipment, another energy grid or electric utility, a different source of electric energy from the same energy grid or electric utility, or any other source of electric energy.

In some embodiments, the plurality of energy sources include a first energy grid source and a second energy grid source, which may be the same or different electric utilities or energy grids. The first energy grid source may provide non-renewable or non-sustainable energy (e.g., energy produced using coal, oil, fossil fuels, etc.) that produces carbon emissions when generated, whereas the second energy grid source may provide renewable or sustainable energy (e.g., energy produced using solar panels, wind turbines, etc.) that does not produce carbon emissions when generated or produces significantly less carbon emissions than the non-renewable or non-sustainable energy. In some embodiments, the second energy grid source also provides non-renewable or non-sustainable energy, but allows energy consumers or customers to offset the carbon emissions produced when generating the electric energy by purchasing carbon credits or carbon offsets. Accordingly, the electric energy generated and supplied via the second energy grid source may produce less carbon emissions per unit of electric energy generated relative to the electric energy generated and supplied via the first energy grid source.

In some embodiments, using the predictive cost function J to determine the amounts of electric energy to supply from each of the plurality of energy sources includes performing an optimization of the predictive cost function J subject to a set of constraints. The constraints may include any of the constraints discussed above and/or one or more models that relate the amounts of electric energy supplied by the energy sources to the control objectives in the predictive cost function J. In general, each of the control objectives can be related to corresponding amounts of energy predicted to be consumed or required to achieve the control objective. For example, the monetary cost control objective can be related to the amounts of energy supplied from each energy source by the corresponding costs per unit energy supplied from each energy source. As another example, the carbon emissions control objective can be related to the amounts of energy supplied from each energy source by one or more models that relate electric energy production or consumption to a corresponding amount of carbon emissions. As yet another example, the disease transmission risk control objective can be related to the amounts of energy supplied from each energy source by one or more models that relate disease transmission risk to the amounts of energy consumed to perform air filtration, purification, sanitation, circulation, or other activities that reduce disease transmission risk but require electric energy to perform. Similar relationships or models can be used to relate the other control objectives to corresponding amounts of energy consumption or usage. Accordingly, each of the control objectives described herein can be related to corresponding amounts of electric energy and the predictive controller can determine the specific amounts of the electric energy to supply from each of the plurality of energy sources using the predictive cost function J.

As described above, the predictive cost function may account for one or more of the control objectives by including corresponding terms in the predictive cost function. For example, the predictive cost function may include a first term that accounts for monetary cost, a second term that accounts for carbon emissions, and/or any other terms that account for any of the control objectives described herein, which may be assigned weights in the predictive cost function to assign a relative importance or priority to each of the control objectives. However, it should be understood that the predictive cost function can "account for" other items (e.g., variables, constraints, amounts of electric energy supplied from various sources, cost of the electric energy supplied, cost savings, etc.) when performing the predictive optimization without necessarily including those items within the predictive cost function itself.

As one example, the predictive cost function can "account for" amounts of electric energy supplied by various energy sources (e.g., a first amount of electric energy supplied by an energy grid source and a second amount of electric energy supplied by a second energy source) by including terms in the predictive cost function that represent the impact of the supplied amounts of electric energy on the control objectives that appear within the predictive cost function (e.g., an amount of carbon emissions that results from the supplied amounts of electric energy, a disease transmission risk that results from the supplied amounts of electric energy, etc.), even if the supplied amounts of electric energy do not appear as variables or terms within the predictive cost function itself. This can be accomplished, for example, using models or equations that define the relationships between the supplied amounts of electric energy and the particular variables or terms that appear within the predictive cost function. The models or equations can be implemented as constraints on the predictive cost function that are considered when performing the optimization process. This allows the amounts of electric energy to be considered as decision variables in the predictive optimization process without requiring the amounts of electric energy to appear within the predictive cost function.

As another example, the predictive cost function can "account for" a cost savings that results from supplying electric energy from a less costly energy source relative to a cost that would have been incurred if the electric energy were supplied from a more costly energy source. In this case, the cost savings represents the difference between the cost calculated by the predictive cost function and the hypothetical cost that would have been incurred had the more costly energy source supplied the electric energy. In some embodiments, the predictive cost function accounts for both (1) a cost of a first amount of electric energy supplied from a first energy source (e.g., an energy grid source) at each time step of a time period and (2) a cost savings resulting from using a second amount of the electric energy from a second energy source (e.g., a less costly energy source, a battery, renewable energy generation equipment, a green energy source, etc.) at each time step of the time period. In various embodiments, the cost savings could be accounted for by including an explicit cost savings term within the predictive cost function, or by including a term within the predictive cost function that quantifies the cost of the electric energy supplied from the second energy source. In the latter case, the "cost savings" is accounted for implicitly by the lower cost calculated by the predictive cost function relative to a hypothetical cost that would have been incurred had the second energy source been replaced with a more costly energy source.

As noted above, it should be understood that all references to "cost," "cost savings," "more costly," "less costly," "cost function," "cost characteristic," and other cost-related terms throughout the present disclosure do not necessarily refer to monetary cost (e.g., expressed in units of dollars or other currency). A "cost" or "cost savings" can be expressed in terms of any of the control objectives described herein or any other control objectives accounted for by the predictive cost function. For example, a "cost" or "cost savings" may refer to any of a variety of other types of cost such as resource consumption (e.g., expressed in units of energy, water, natural gas, or any other resource), carbon emissions (e.g., expressed in units of carbon), occupant comfort (e.g., expressed in units of comfort), disease transmission risk (e.g., expressed in units of risk or probability), equipment reliability (e.g., expressed in units of reliability or expected failures), or any other control objectives which may be desirable to optimize, either alone or in weighted combination with other control objectives. Similarly, a given energy source may be "less costly" or "more costly" than another energy source if the electric energy supplied from the given energy source causes a lesser impact or greater impact, respectively, on the control objective represented by the "cost" in the predictive cost function. Likewise, a "cost characteristic" of a given energy source or amount of electric energy received from a given energy source may include, for example, a monetary cost or price of the electric energy (e.g., $ per unit of energy or power), an amount of carbon emissions associated with the electric energy (e.g., carbon emissions per unit of energy or power), a marginal operating emissions rate (MOER) associated with the electric energy, carbon credit information (e.g., an amount or cost of carbon credits needed to compensate for the carbon emissions associated with the electric energy), other sustainability metrics or sustainability factors, or any other attribute or characteristic of the electric energy which may be relevant to any of the control objectives associated with the cost function.

In some embodiments, the predictive controller includes one or more processing circuits (e.g., processors, memory, circuitry, etc.) configured to perform the functional features described herein. The one or more processing circuits may be located within the same physical device (e.g., within a common housing, on a common circuit board, etc.) or may be distributed across multiple devices which may be located in multiple different locations. Accordingly, the functions of the predictive controller are not necessarily all performed by the same physical device, but could be performed by many different physical devices distributed across various locations. For example, one or more of the processing circuits may be located within the unit of building equipment that contains the powered components, within a local controller or field controller that communicates with the building equipment via a communications bus, a remote controller or supervisory controller that communicates with the building equipment via a communications network (e.g., the internet, a BACnet network, a local network, etc.), a server or cloud-hosted system that performs the functions of the predictive controller from a remote location, or any combination thereof.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A heating ventilating or air conditioning (HVAC) system, comprising:
  a unit configured for use in a heating or a cooling operation for an environment, the unit comprising a physical enclosure comprising:
    an interface configured to receive electric energy from an alternative energy source; and
    a controller configured to perform an optimization of an objective function for the unit to determine a first amount of electric energy to receive from an energy grid and a second amount of the electric energy from the alternative energy source for use in the heating or cooling operation at each time step of an optimization period in response to a cost characteristic of the electric energy received from the energy grid, wherein the objective function includes the first amount of electric energy and excludes electric energy consumed by equipment outside of the physical enclosure;
  wherein the unit is configured to consume the first amount of electric energy and the second amount of electric energy for the heating or cooling operation.

2. The HVAC system of claim 1, wherein the cost characteristic of the electric energy comprises a sustainability factor.

3. The HVAC system of claim 1, wherein the cost characteristic of the electric energy comprises carbon credit data.

4. The HVAC system of claim 1, further comprising one or more photovoltaic panels configured to collect photovoltaic energy;

wherein the controller is configured to determine an optimal amount of the photovoltaic energy to store in the alternative energy source and an optimal amount of the photovoltaic energy to be consumed by the unit at each time step of the optimization period.

5. The HVAC system of claim 1, wherein the objective function accounts for:

a cost of the electric energy from the energy grid at each time step of the optimization period; and a savings resulting from discharging the electric energy from the alternative energy source at each time step of the optimization period.

6. The HVAC system of claim 1, wherein the controller is configured to:

receive energy data defining a value per unit of the electric energy from the energy grid at each time step of the optimization period; and use the energy data as inputs to the objective function.

7. The HVAC system of claim 1, wherein the objective function accounts for a demand charge based on a maximum power consumption of the unit during a demand charge period that overlaps at least partially with the optimization period;

wherein the controller is configured to receive energy pricing data defining the demand charge and to use the energy pricing data as inputs to the objective function.

8. The HVAC system of claim 1, wherein the unit is a chiller, a pump, cooling tower, or valve.

9. The HVAC system of claim 1, further comprising a housing for the unit and the alternative energy source is disposed in the housing.

10. A heating ventilating or air conditioning (HVAC) system, comprising:

a unit configured for use in a heating or a cooling operation, the unit comprising a physical enclosure comprising:

an interface configured to receive electric energy from an alternative energy source, and a controller configured to perform an optimization of an objective function for the unit to determine a first amount of electric energy to receive from an energy grid and a second amount of the electric energy from the alternative energy source for use in the heating or cooling operation at each time step of an optimization period in response to a sustainability factor associated with the electric energy received from the energy grid, wherein the objective function includes the first amount of electric energy and excludes electric energy consumed by equipment outside of the physical enclosure;

wherein the unit is configured to consume the first amount of electric energy and the second amount of electric energy for the heating or cooling operation.

11. The HVAC system of claim 10, wherein the sustainability factor is related to a source of production of the electric energy from the energy grid.

12. The HVAC system of claim 10, wherein the sustainability factor comprises carbon credit data.

13. The HVAC system of claim 10, further comprising one or more photovoltaic panels configured to collect photovoltaic energy;

wherein the controller is configured to determine an optimal amount of the photovoltaic energy to store in the alternative energy source and an optimal amount of the photovoltaic energy to be consumed by the unit at each time step of the optimization period.

14. The HVAC system of claim 10, wherein the objective function accounts for:

a cost of the electric energy purchased from the energy grid at each time step of the optimization period; and a savings resulting from discharging the electric energy from the alternative energy source at each time step of the optimization period.

15. The HVAC system of claim 10, wherein the controller is configured to:

receive energy data defining a value per unit of the electric energy from the energy grid at each time step of the optimization period; and use the energy data as inputs to the objective function.

16. The HVAC system of claim 10, wherein the objective function accounts for a demand charge based on a maximum power consumption of the unit during a demand charge period that overlaps at least partially with the optimization period;

wherein the controller is configured to receive energy pricing data defining the demand charge and to use the energy pricing data as inputs to the objective function.

17. The HVAC system of claim 10, wherein the unit is a chiller, a pump, cooling tower, or valve.

18. The HVAC system of claim 10, further comprising a housing for the unit and the alternative energy source is disposed in the housing, the alternative energy source being a fuel cell, photovoltaic source, alternative generator or a battery.

19. A controller for a central energy facility (CEF) comprising a plurality of powered CEF components comprising a heating ventilating or air conditioning (HVAC) unit having an integrated alternative energy source, the controller configured to:

optimize a device-specific predictive objective function of the HVAC unit to determine a first amount of electric energy for the HVAC unit to receive from an energy grid and a second amount of the electric energy for the HVAC unit to receive from the integrated alternative energy source for use in powering the HVAC unit at each time step of an optimization period in response to a monetary cost or a sustainability factor associated with the electric energy received from the energy grid, wherein the device-specific predictive objective function includes the first amount of electric energy for the HVAC unit and excludes electric energy consumed by other components of the plurality of powered CEF components; and operate the HVAC unit to consume the first amount of electric energy and the second amount of electric energy to provide heating or cooling.

20. The controller of claim 19, wherein the device-specific predictive objective function accounts for:

a cost of the electric energy received from the energy grid at each time step of the optimization period; and a savings resulting from receiving the electric energy from the integrated alternative energy source at each time step of the optimization period.

* * * * *